(12) United States Patent
Enoki et al.

(10) Patent No.: US 8,178,631 B2
(45) Date of Patent: May 15, 2012

(54) RESIN COMPOSITION, VARNISH, RESIN FILM AND SEMICONDUCTOR DEVICE

(75) Inventors: Takashi Enoki, Tokyo (JP); Atsushi Izumi, Tokyo (JP); Hiromi Oki, Tokyo (JP); Yukiharu Ono, Tokyo (JP); Kazuyoshi Fujita, Tokyo (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 631 days.

(21) Appl. No.: 11/992,136

(22) PCT Filed: Sep. 21, 2006

(86) PCT No.: PCT/JP2006/318790
§ 371 (c)(1),
(2), (4) Date: Apr. 16, 2009

(87) PCT Pub. No.: WO2007/034902
PCT Pub. Date: Mar. 29, 2007

(65) Prior Publication Data
US 2009/0214860 A1 Aug. 27, 2009

(30) Foreign Application Priority Data

Sep. 21, 2005 (JP) .................................. 2005-274729

(51) Int. Cl.
*C08G 73/06* (2006.01)
*C08G 73/22* (2006.01)
(52) U.S. Cl. ....................................................... 525/540
(58) Field of Classification Search ................... 525/540
See application file for complete search history.

(56) References Cited

U.S. PATENT DOCUMENTS

| | | | | |
|---|---|---|---|---|
| 3,852,239 A | * | 12/1974 | Bellmann et al. | 528/26 |
| 4,402,996 A | * | 9/1983 | Gauger et al. | 427/125 |
| 5,166,313 A | | 11/1992 | Archibald et al. | |
| 5,610,261 A | | 3/1997 | Dotrong et al. | |
| 7,049,371 B2 | * | 5/2006 | Enoki et al. | 525/183 |
| 7,090,925 B2 | | 8/2006 | Nagano et al. | |
| 7,186,454 B2 | | 3/2007 | Nagano et al. | |
| 7,423,180 B2 | | 9/2008 | Tanaka et al. | |
| 7,863,347 B2 | * | 1/2011 | Fujita et al. | 522/137 |
| 2004/0087182 A1 | | 5/2004 | Aoi | |
| 2006/0241275 A1 | | 10/2006 | Nagano et al. | |
| 2008/0206548 A1 | * | 8/2008 | Enoki et al. | 428/319.3 |

FOREIGN PATENT DOCUMENTS

| | | | |
|---|---|---|---|
| EP | 1 462 470 | | 9/2004 |
| EP | 1 462 471 | | 9/2004 |
| EP | 1 602 641 | | 12/2005 |
| FR | 2399454 A | * | 4/1979 |
| JP | 2000-195853 | | 7/2000 |
| JP | 2003-12802 | | 1/2003 |
| JP | 2003-105085 | | 4/2003 |
| JP | 2003-206441 | | 7/2003 |
| JP | 2004-18593 | | 1/2004 |
| JP | 2005-139424 | | 6/2005 |
| JP | 2006-206857 | | 8/2006 |
| WO | 2004/078701 | | 9/2004 |
| WO | 2005/038825 | | 4/2005 |
| WO | WO 2006070498 A1 | * | 7/2006 |

OTHER PUBLICATIONS

Machine Translation of Ishikawa et al (JP 2003-206441), Japanese reference submitted by applicants.*
Machine Translation of Tada et al (JP 2005-139424), Japanese reference submitted by applicants.*
Supplementary European Search Report for Application No. EP 06 79 8229 dated Aug. 2, 2011.

* cited by examiner

*Primary Examiner* — Randy Gulakowski
*Assistant Examiner* — Mike M Dollinger
(74) *Attorney, Agent, or Firm* — Smith, Gambrell & Russell, LLP

(57) ABSTRACT

Disclosed is a resin composition comprising a benzoxazole resin precursor having a first repeating unit obtained by reacting a bisaminophenol compound and a dicarboxylic acid compound, and a cross-linking agent wherein at least one of the bisaminophenol compound and the dicarboxylic acid compound has a diamondoid structure. The benzoxazole resin precursor further comprises a second repeating unit obtained by reacting a bisaminophenol compound not having a diamondoid structure and a dicarboxylic acid compound not having a diamondoid structure. Also disclosed is a resin film comprising the resin composition.

25 Claims, 1 Drawing Sheet

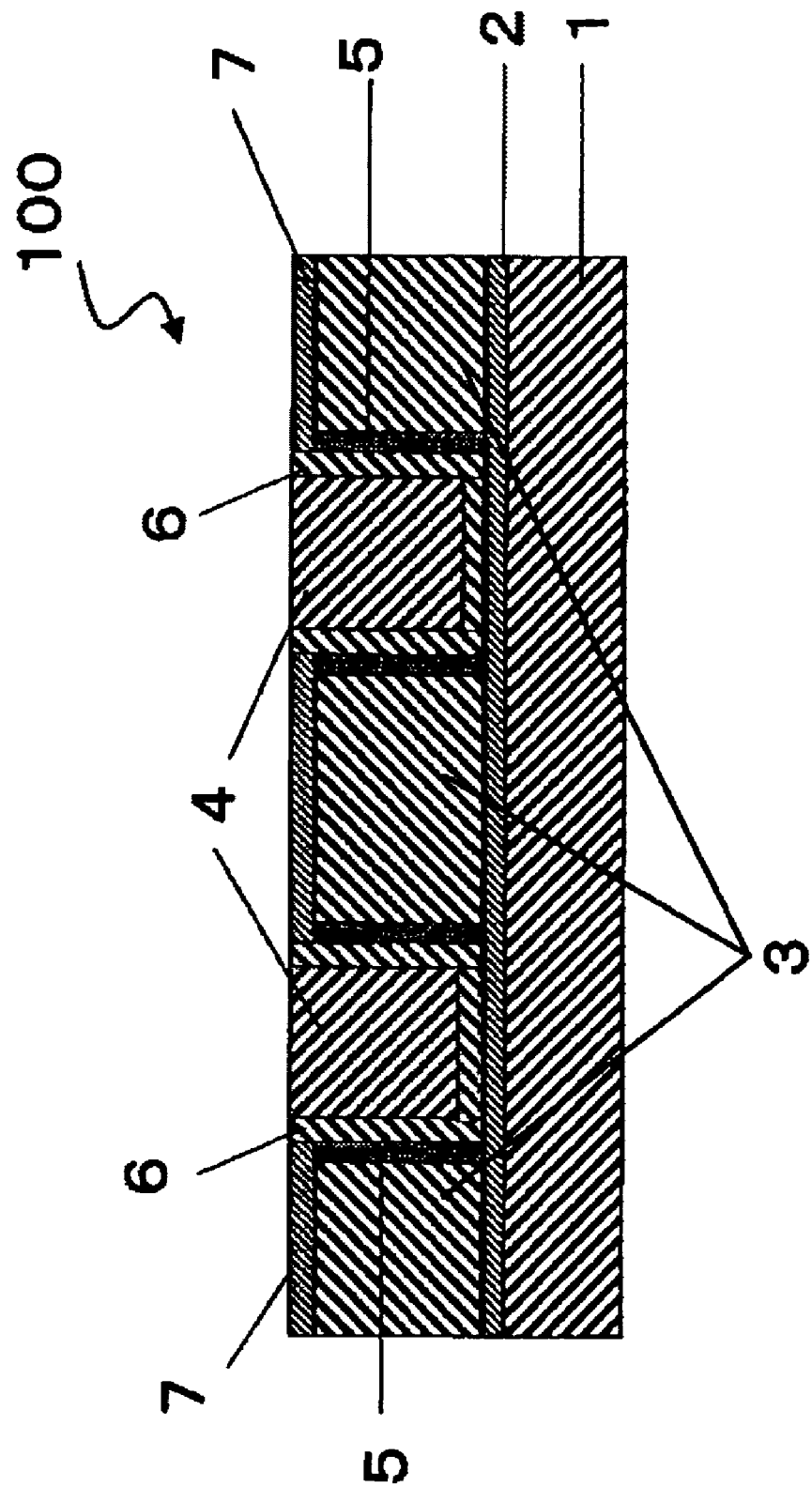

RESIN COMPOSITION, VARNISH, RESIN FILM AND SEMICONDUCTOR DEVICE

TECHNICAL FIELD

The present invention relates to a resin composition, a varnish, a resin film and a semiconductor device.

BACKGROUND ART

As an interlayer insulation film for a semiconductor device, there is mainly used an oxide film (SiOx film) prepared by CVD method (Chemical Vapor Deposition method) and so on. An inorganic insulation film, however, is hard to achieve speeding up and upgrading of a semiconductor due to high dielectric constant thereof. Accordingly, organic materials are considered to be used as interlayer insulation films having low dielectric constant. Such organic materials are required to be excellent in heat resistance and electrical properties, and to have low dielectric constant.

As such organic materials, polyimide resins, polyquinoline resins, polyquinoxaline resins and so on have been studied (For example, see Japanese Patent Application Laid-Open (JP-A) No. 2000-195853.)

However, polyimide resins generally have problems of low heat resistance, high dielectric constant, high moisture absorptivity and so on. Thereby, use of polyimide resins is limited to some semiconductor elements such as a bipolar semiconductor element due to reliability thereof.

On the other hand, polyquinoline resins and polyquinoxaline resins having higher heat resistance, lower dielectric constant and lower moisture absorptivity than polyimide resins are thermoplastic resins and there is a problem accordingly that patterns of the resins may change shape by being exposed to temperatures higher than glass-transition points thereof during semiconductor production.

DISCLOSURE OF INVENTION

An object of the present invention is to provide a resin composition having low dielectric constant and excellent heat resistance.

Another object of the present invention is to provide a resin film having low dielectric constant and excellent heat resistance and a semiconductor device using the same.

Said purposes are achieved by the present inventions shown as the following (1) to (27):

(1) A resin composition comprising a benzoxazole resin precursor having a first repeating unit obtained by reacting a bisaminophenol compound and a dicarboxylic acid compound, and a cross-linking agent, wherein at least one of the bisaminophenol compound and the dicarboxylic acid compound has a diamondoid structure;

(2) The resin composition according to (1), wherein the cross-linking agent has a diamondoid structure;

(3) The resin composition according to (1) or (2), wherein the benzoxazole resin precursor further contains a second repeating unit obtained by reacting a bisaminophenol compound not having a diamondoid structure and a dicarboxylic acid compound not having a diamondoid structure;

(4) The resin composition according to any of (1) to (3), wherein the diamondoid structure is bonded to a functional group other than the diamondoid structure;

(5) The resin composition according to any of (1) to (4), wherein the bisaminophenol compound not having a diamondoid structure or the dicarboxylic acid compound not having a diamondoid structure or both of them have a functional group other than the diamondoid structure.

(6) The resin composition according to any of (1) to (5), wherein the diamondoid structure is at least a group selected from the group consisting of an adamantyl group, a diamantyl group, a triamantyl group, a tetramantyl group, a pentamantyl group, a hexamantyl group, a heptamantyl group, an octamantyl group, a nonamantyl group, a decamantyl group, an undecamantyl group, a biadamantyl group, a triadamantyl group, a tetraadamantyl group, a pentaadamantyl group, a hexaadamantyl group, a heptaadamantyl group, an octaadamantyl group, a nonaadamantyl group, a decaadamantyl group and an undecaadamantyl group;

(7) The resin composition according to any of (1) to (6), wherein the diamondoid structure has an alkyl group and/or a fluoroalkyl group;

(8) The resin composition according to any of (4) to (7), wherein the functional group other than the diamondoid structure has a crosslinking functional group;

(9) The resin composition according to any of (4) to (7), wherein the functional group other than the diamondoid structure has an acetylene bond;

(10) The resin composition according to any of (1) to (9), wherein the dicarboxylic acid having the diamondoid structure is adamantanedicarboxylic acid, biadamantanedicarboxylic acid and/or tetraadamantanedicarboxylic acid;

(11) The resin composition according to any of (3) to (10), wherein the benzoxazole resin precursor is a copolymer of the first repeating unit and the second repeating unit;

(12) A resin composition comprising a benzoxazole resin precursor having a third repeating unit represented by the following Formula (1) and a cross-linking agent:

Formula (1):

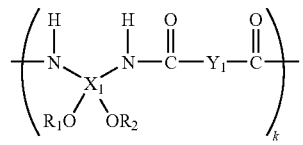

wherein, in the Formula (1), each of $R_1$ and $R_2$ is independently a hydrogen atom or an organic group; "k" is an integer of 2 to 1000; $X_1$ is at least a group selected from the group consisting of groups represented by the following Formula (2-1) and the following Formula (2-2) and groups represented by the following Formula (3); $Y_1$ is at least a group selected from the group consisting of groups represented by the following Formula (4), Formula (6-1), Formula (6-2), Formula (7-1), Formula (7-2), Formula (8) and Formula (9); and the hydrogen atom of carbocycle contained in $X_1$ and $Y_1$ may be substituted by an alkyl group and/or a fluoroalkyl group:

Formula (2-1):
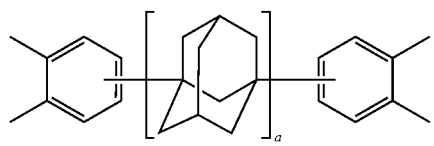
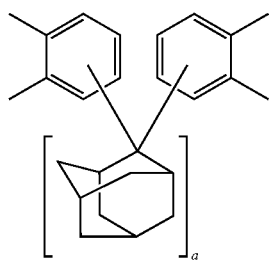
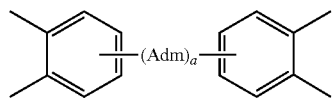
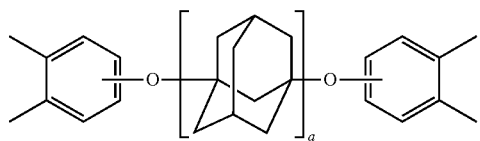
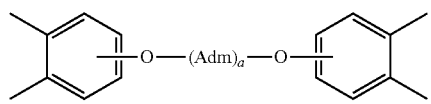
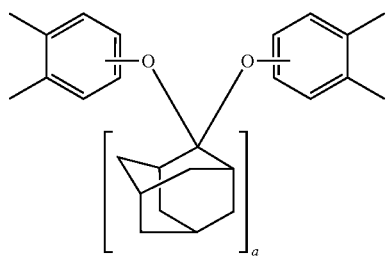
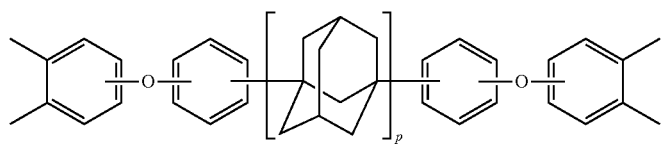
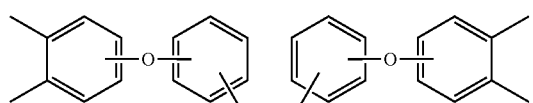
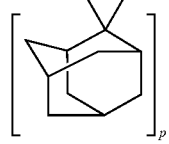
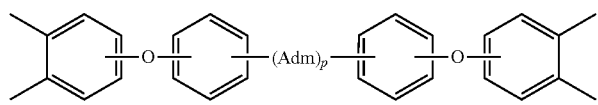
Formula (2-2):
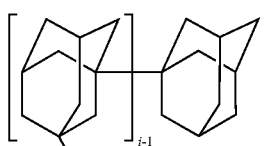
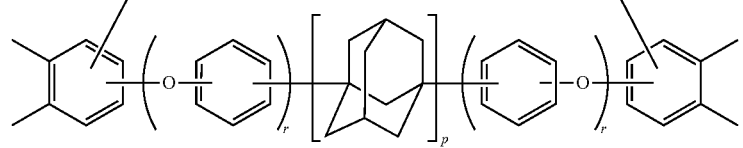

-continued
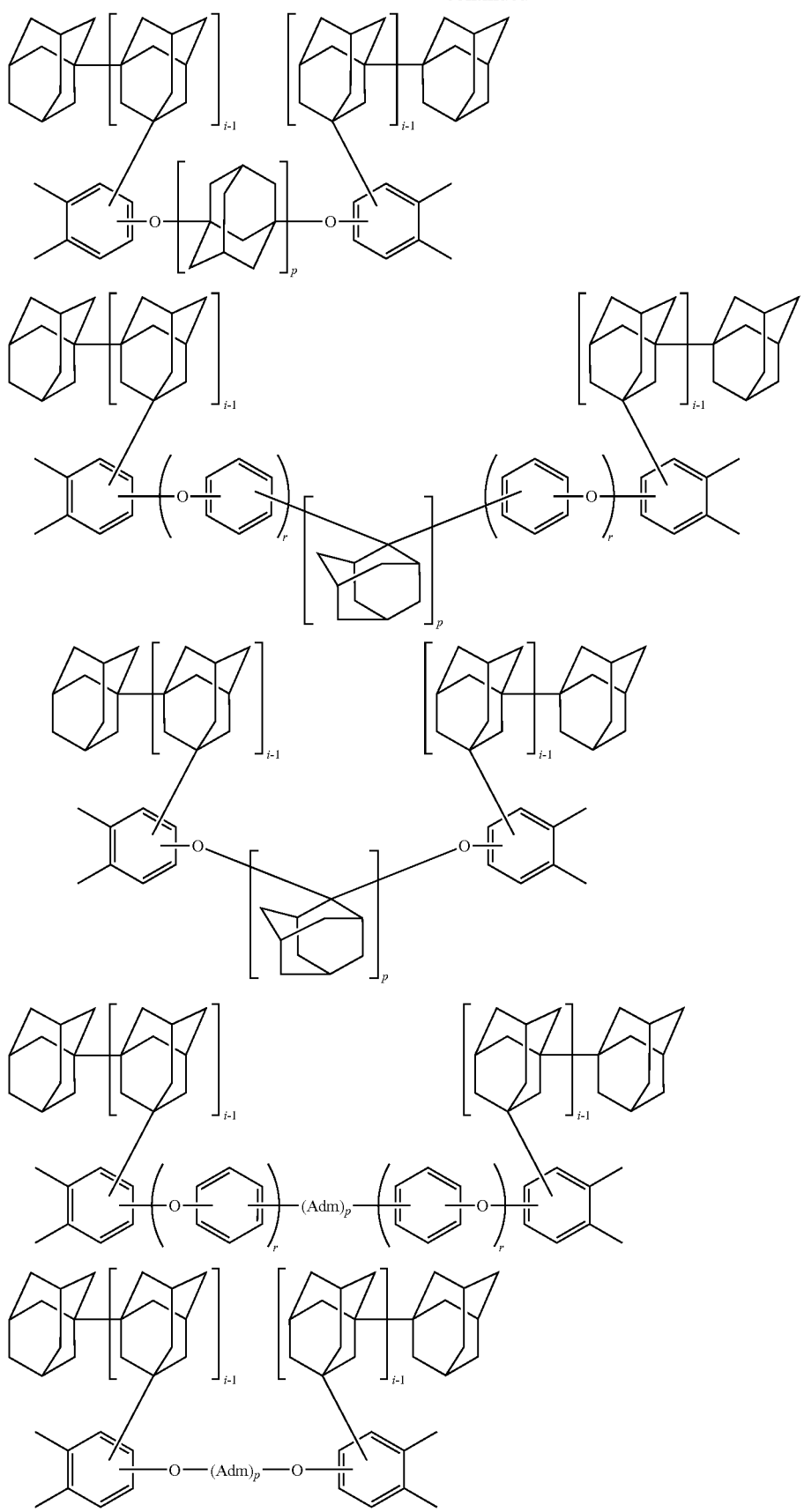

-continued
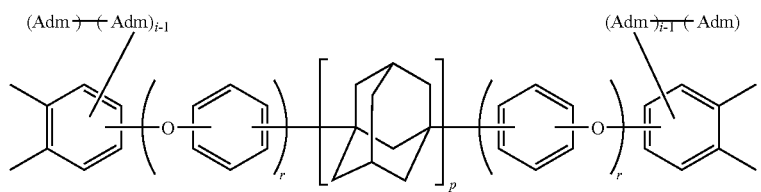
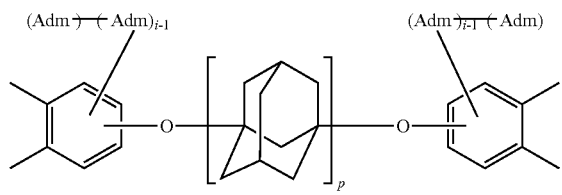
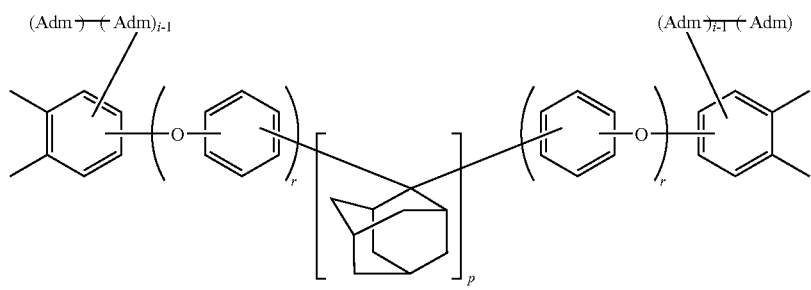
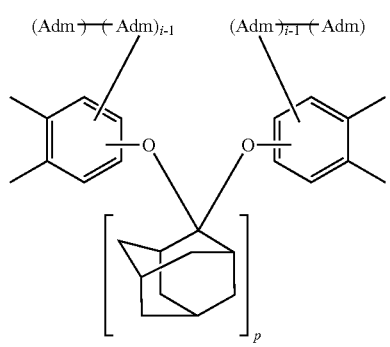
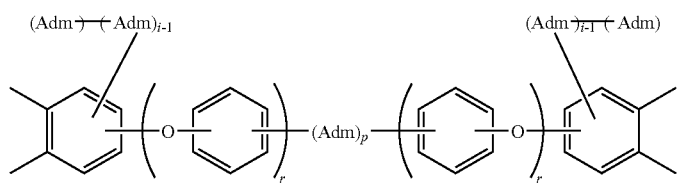
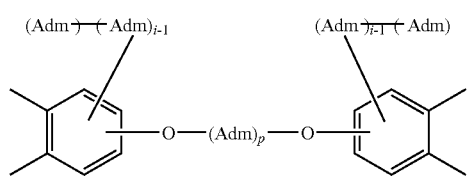

wherein, in the Formula (2-1) and Formula (2-2), "Adm" represents a diamondoid structural unit based on an adamantane structure; "a" is from 2 to 12; "p" is from 1 to 12; "i" is from 1 to 12; "r" is from 0 or 1, Formula (3):

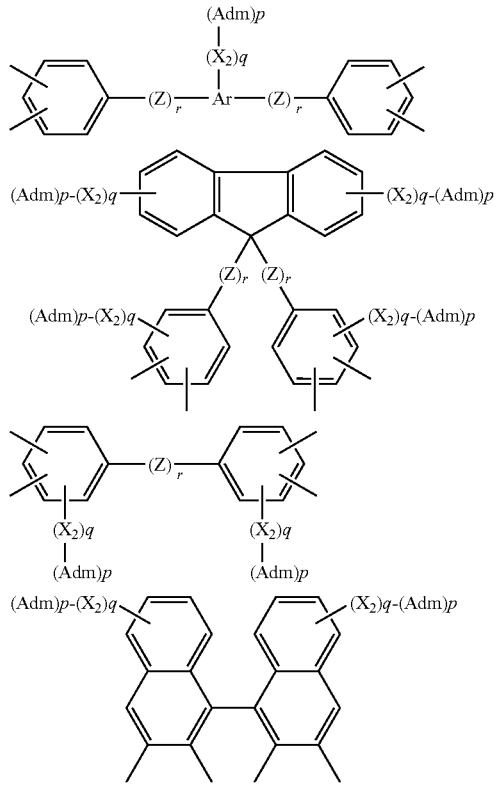

wherein, in the Formula (3), "Adm" represents a diamondoid structural unit based on an adamantane structure, "p" is from 1 to 12; $X_2$ is an ethynyl group or a propargylether group; "Z" is —O—, —SO$_2$—, —CH$_2$—, —C(CH$_3$)$_2$—, —C(CF$_3$)$_2$— or an aromatic group (as the aromatic group, there may be a binaphthalene group, a naphthalene group, a fluorene group, a phenyl group, a diphenylether group, a biphenyl group, a diphenylsulfone group, a diphenylpropane group, a diphenylhexafluoropropane group so on, but may not be limited thereto); Ar is an aromatic group of trivalent or more (as the aromatic group of trivalent or more, there may be a binaphthalene group, a naphthalene group, a fluorene group, a phenyl group, a diphenylether group, a biphenyl group, a diphenylsulfone group, a diphenylpropane group, a diphenylhexafluoropropane group and so on, but may not be limited thereto); "r" is from 0 or 1; an "q" is an integer of 1 to 4, Formula (4):

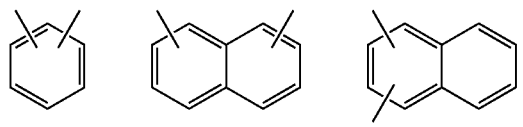

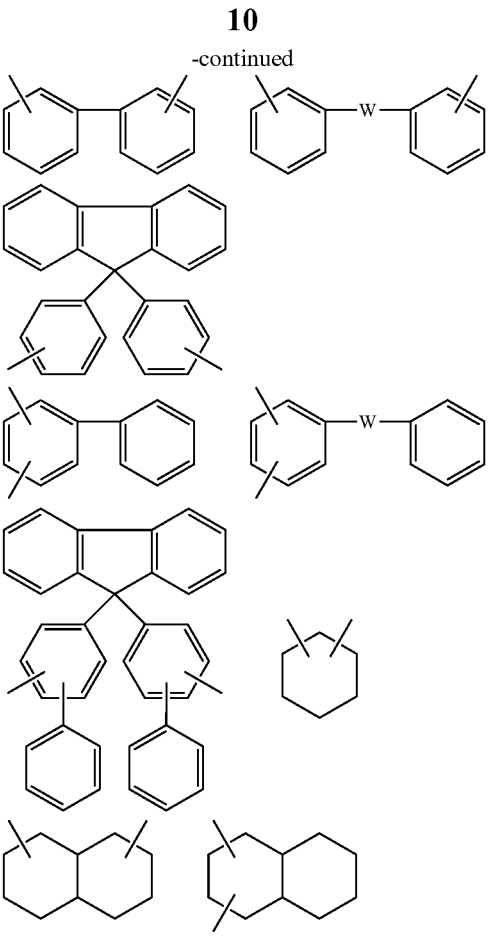

wherein, in the Formula (4), "W" is at least a group selected from the group consisting of groups represented by the following Formula (5):

Formula (5):

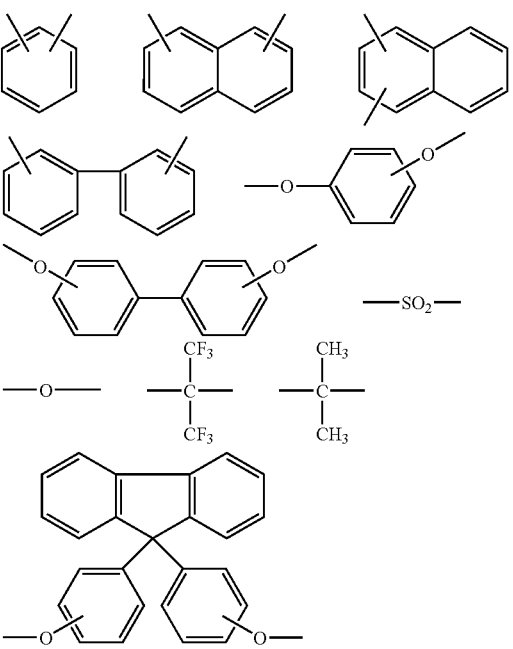

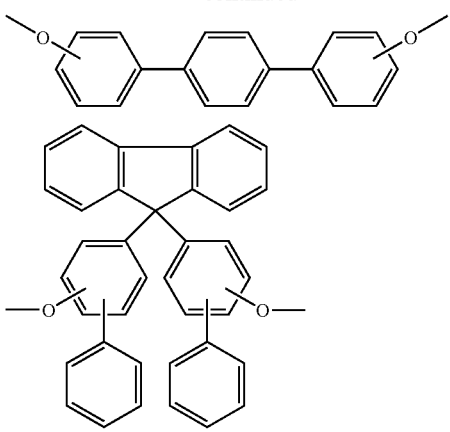
Formula (6-1):
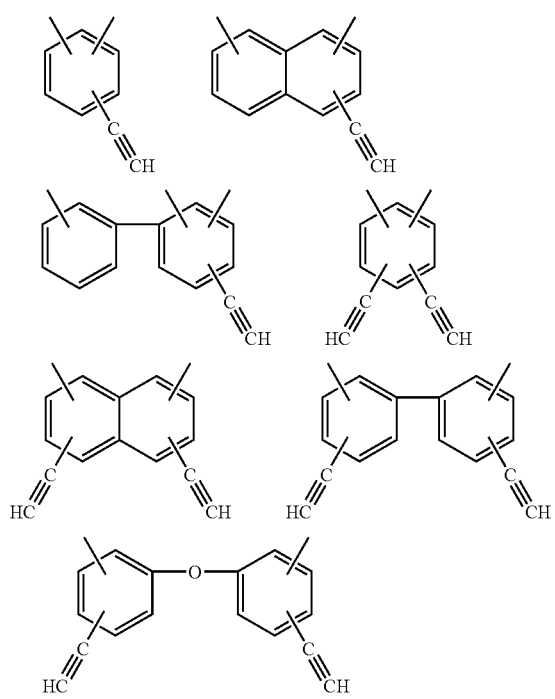
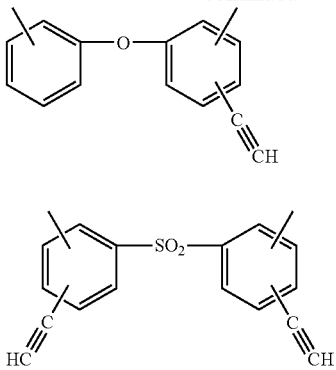
Formula (6-2):
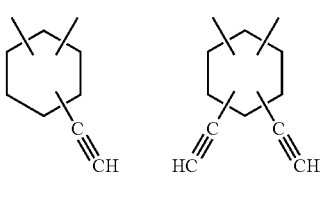
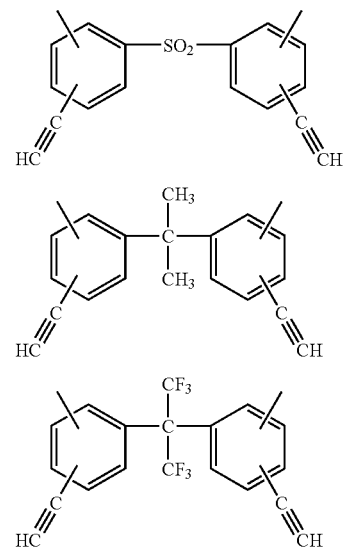
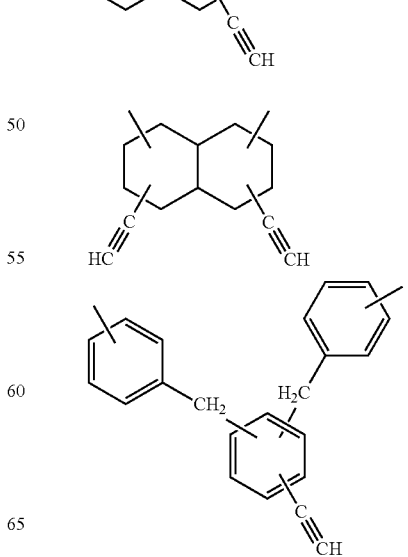

-continued
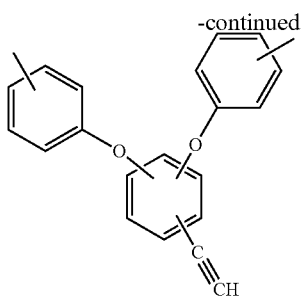
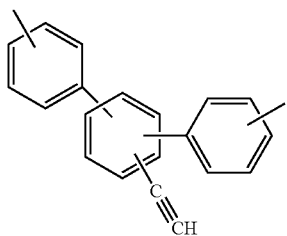
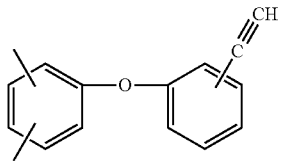
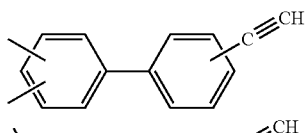
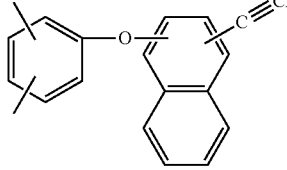
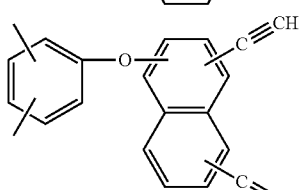
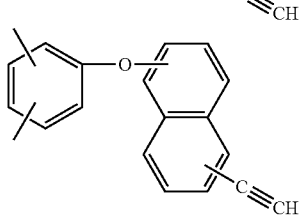
Formula (7-1):
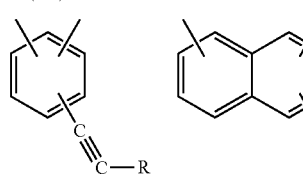
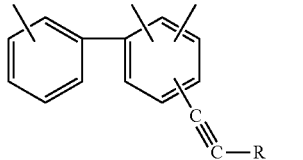
-continued
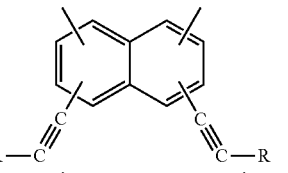
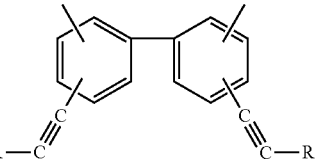
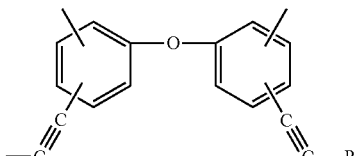
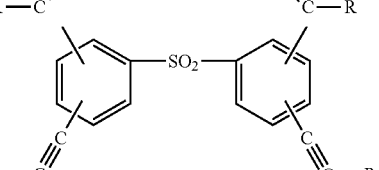
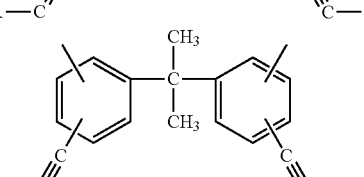
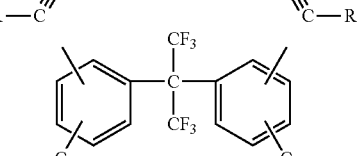
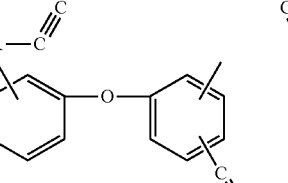
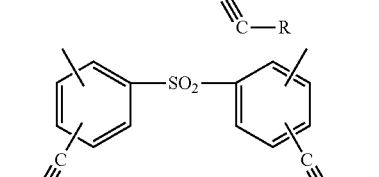
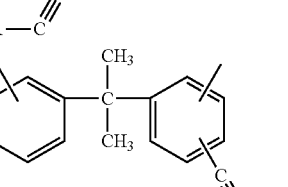
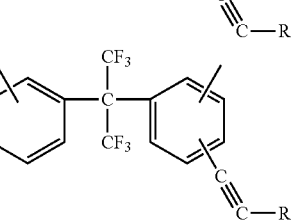

Formula (7-2):

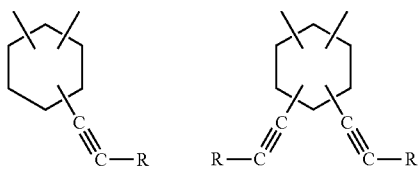
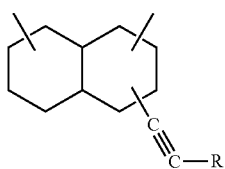
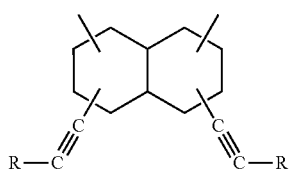
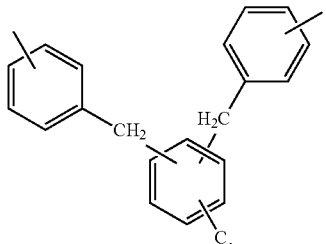
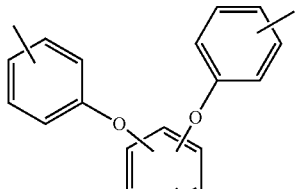
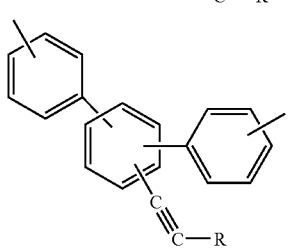
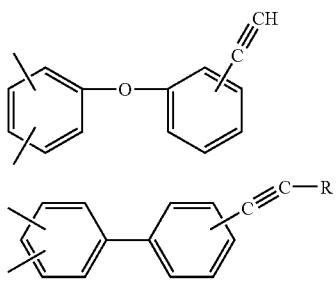

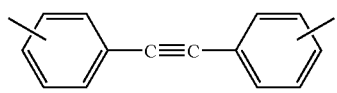

wherein, in the Formula (7-1) and Formula (7-2), "R" is an organic group (as the organic group, there may be a binaphthalene group, a naphthalene group, a fluorene group, a phenyl group, a diphenylether group, a biphenyl group, a diphenylsulfone group, a diphenylpropane group, a diphenylhexafluoropropane group and so on, but may not be limited thereto), Formula (8):

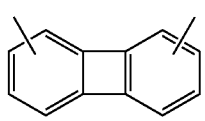

Formula (9):

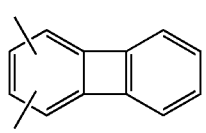

(13) The resin composition according to (12), wherein the cross-linking agent has a diamondoid structure;

(14) The resin composition comprising a benzoxazole resin precursor having a forth repeating unit represented by the following Formula (10) and a cross-linking agent:

Formula (10):

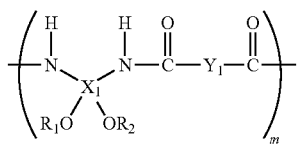

wherein, in the Formula (10), each of $R_1$ and $R_2$ is independently a hydrogen atom or an organic group; "m" is an integer of 2 to 1000; $X_1$ is at least a group selected from the group consisting of groups represented by the Formula (2-1), Formula (2-2) and Formula (3); $Y_2$ is at least a group selected from the group consisting of groups represented by the Formula (11-1), Formula (11-2), Formula (12-1) and Formula (12-2); and the hydrogen atom of carbocycle contained in $X_1$ and $Y_1$ may be substituted by an alkyl group and/or a fluoroalkyl group:
Formula (11-1):
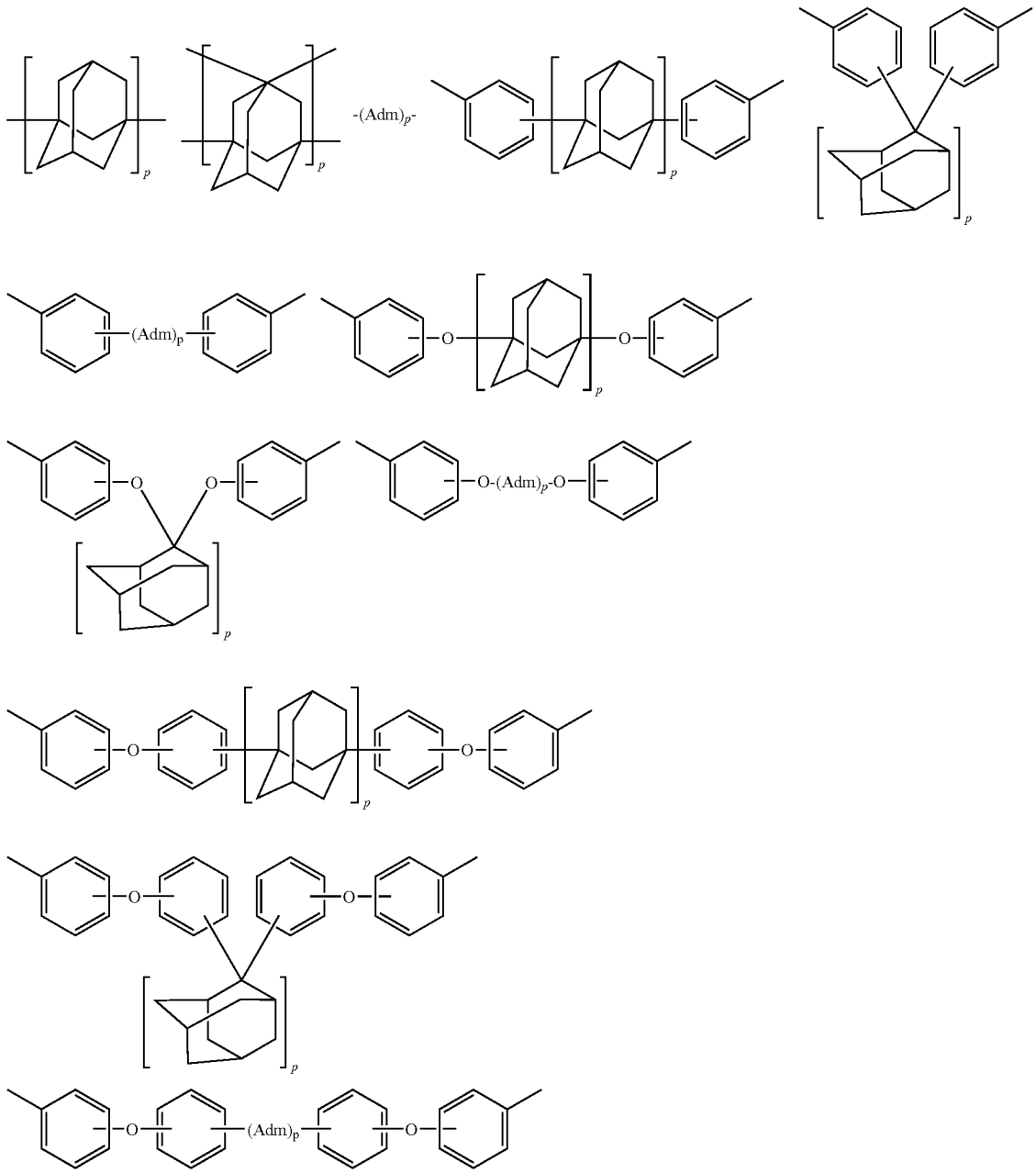
Formula (11-2):
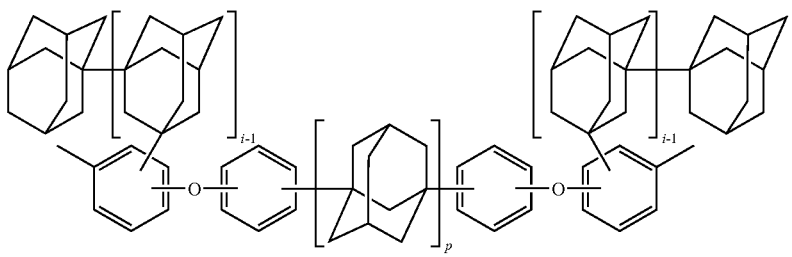

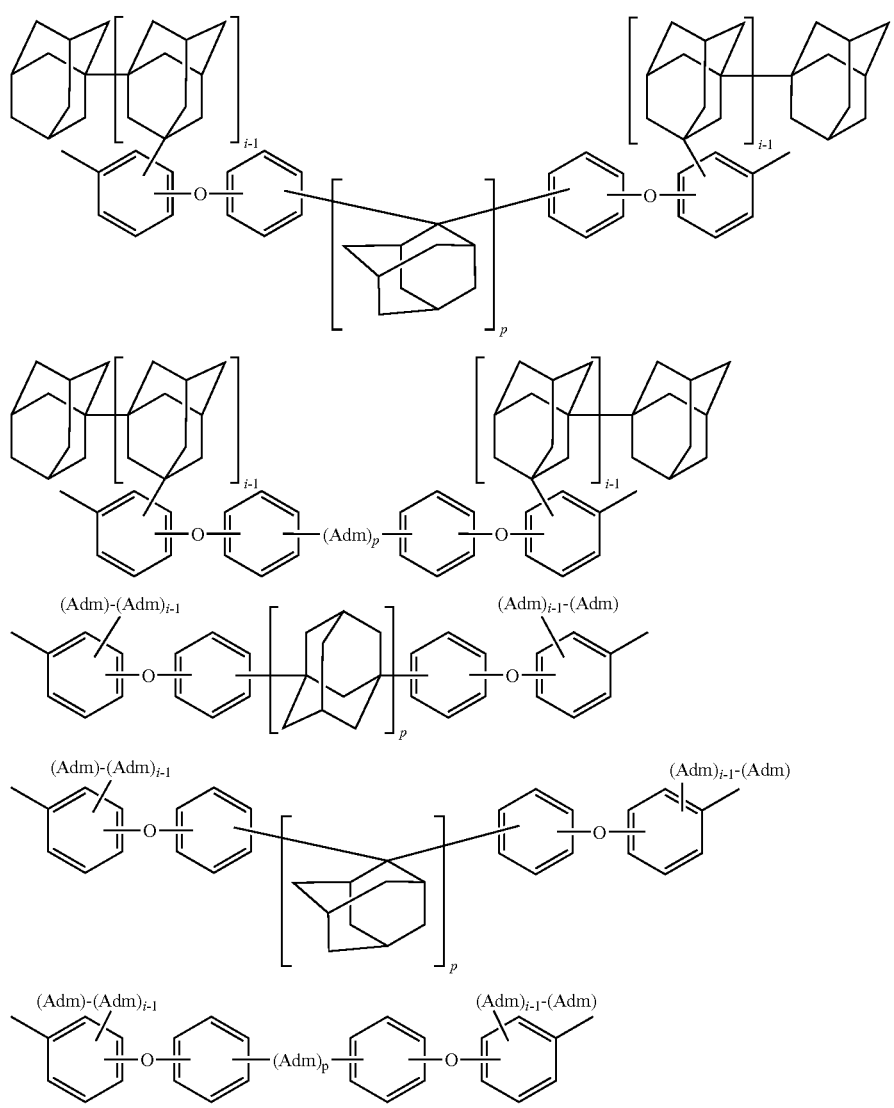
Formula (12-1):
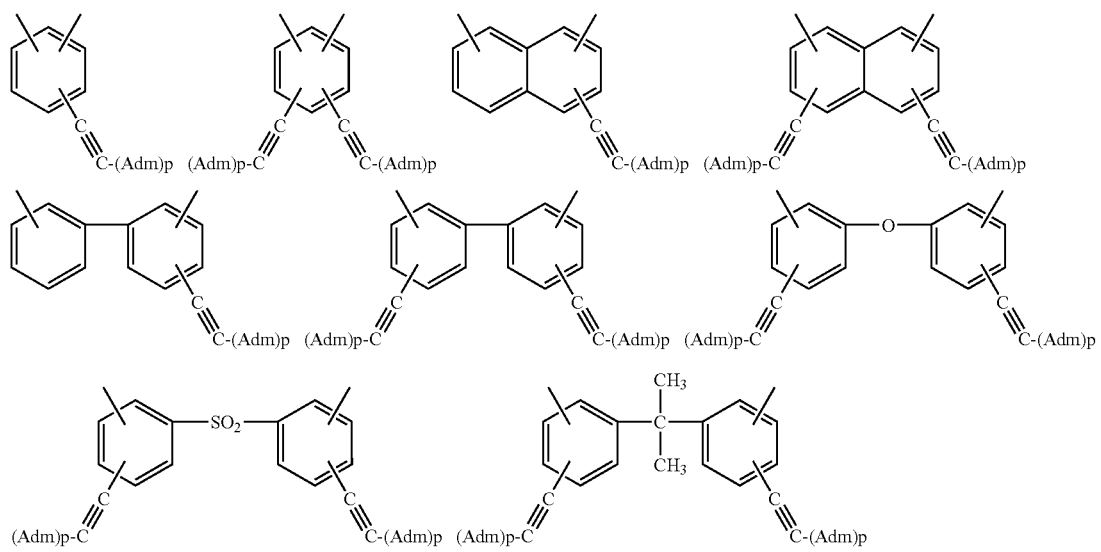

-continued

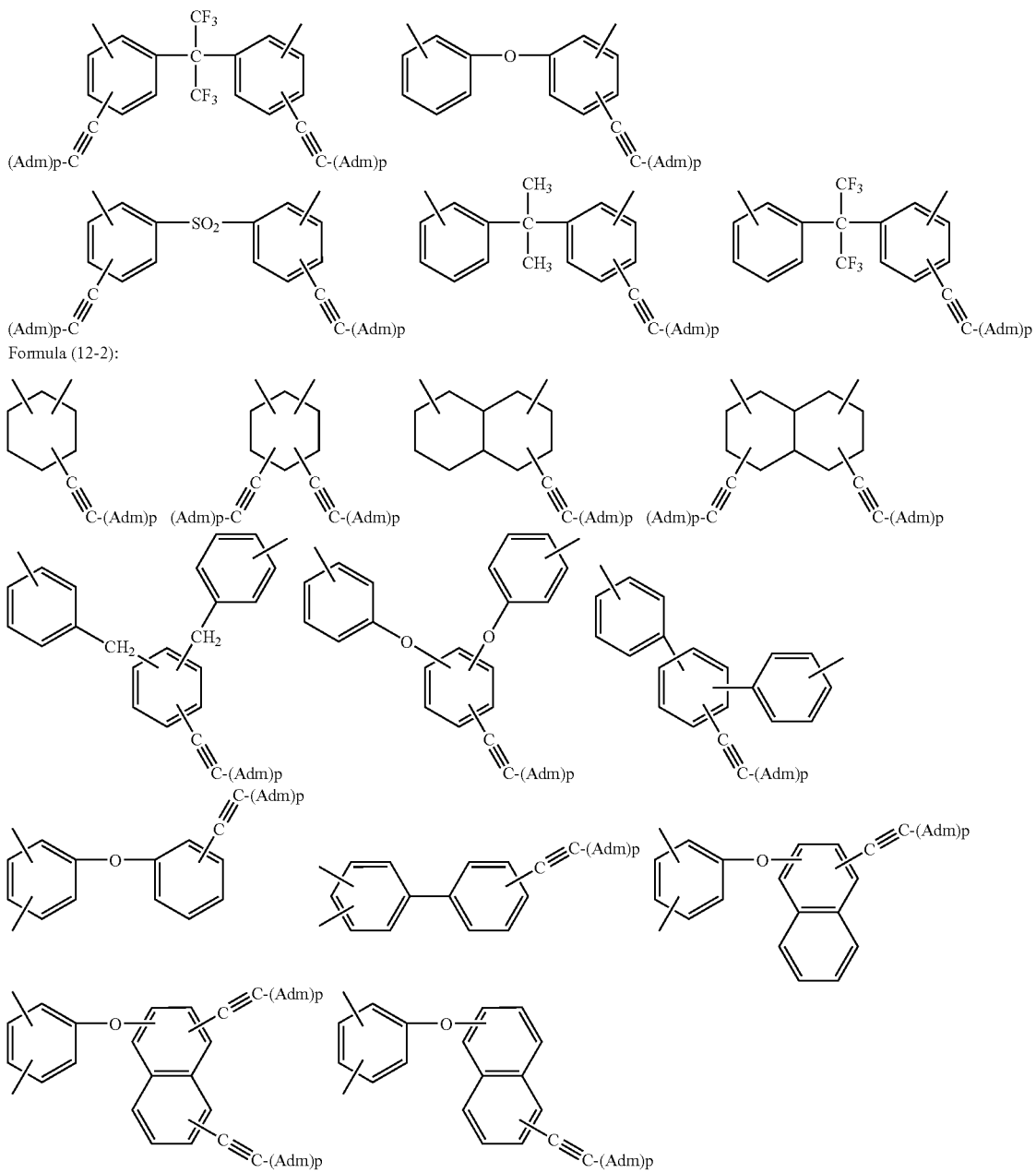

Formula (12-2):

wherein, in Formula (11-1), Formula (11-2), Formula (12-1) and Formula (12-2), "Adm" represents a diamondoid structural unit based on an adamantane structure; "p" is from 1 to 12; "i" is from 1 to 12,

(15) The resin composition according to 14, wherein the benzoxazole resin precursor further has the third repeating unit;

(16) The resin composition according to (14) or (15), wherein the cross-linking agent has a diamondoid structure;

(17) The resin composition comprising a benzoxazole resin precursor having a fifth repeating unit represented by the following Formula (13) and a cross-linking agent:

Formula (13):

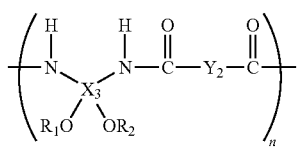

wherein, in the Formula (13), each of $R_1$ and $R_2$ is independently a hydrogen atom or an organic group; "n" is an integer of 2 to 1,000; $X_3$ is at least a group selected from the group consisting of groups represented by the following Formula (14) and Formula (15); $Y_2$ is at least a group selected from the group consisting of groups represented by the Formula (11-1), Formula (11-2), Formula (12-1) and Formula (12-2); and the hydrogen atom of carbocycle contained in $X_3$ or $Y_2$ may be substituted with an alkyl group and/or fluoroalkyl group:

Formula (14):

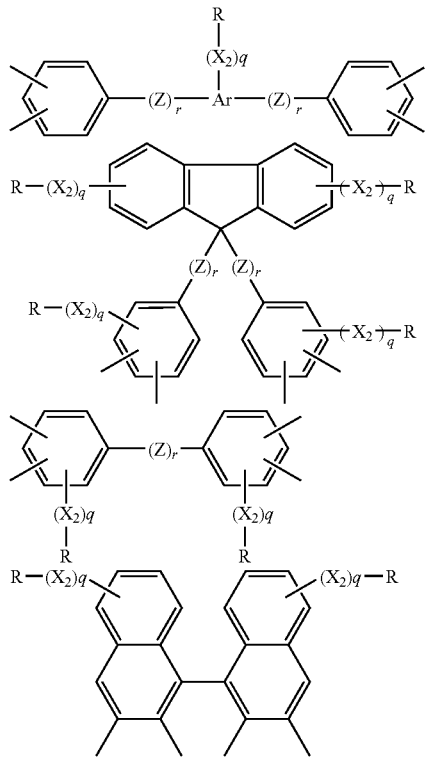

wherein, in the Formula (14), $X_2$ is an ethynyl group or a propargylether group; "Z" is —O—, —SO$_2$—, —CH$_2$—, —C(CH$_3$)$_2$—, —C(CF$_3$)$_2$— or an aromatic group (as the aromatic group, there may be a binaphthalene group, a naphthalene group, a fluorene group, a phenyl group, a diphenylether group, a biphenyl group, a diphenylsulfone group, a diphenylpropane group, a diphenylhexafluoropropane group and so on, but may not be limited thereto); "Ar" is an aromatic group of trivalent or more (as the aromatic group of trivalent or more, there may be a binaphthalene group, a naphthalene group, a fluorene group, a phenyl group, a diphenylether group, a biphenyl group, a diphenylsulfone group, a diphenylpropane group, a diphenylhexafluoropropane group and so on, but may not be limited thereto); "R" is hydrogen or an organic group (as the organic group, there may be a binaphthalene group, a naphthalene group, a fluorene group, a phenyl group, a diphenylether group, a biphenyl group, a diphenylsulfone group, a diphenylpropane group, a diphenylhexafluoropropane group, but may not be limited thereto); "r" is from 0 or 1; and "q" is an integer of 1 to 4, Formula (15):

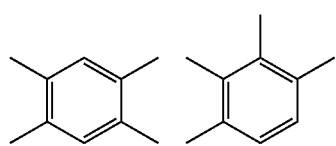

-continued

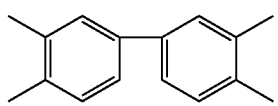

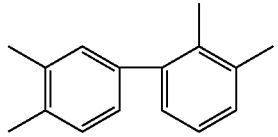

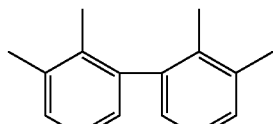

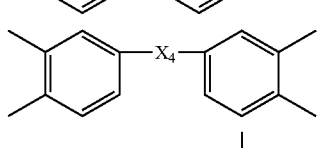

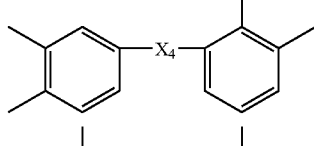

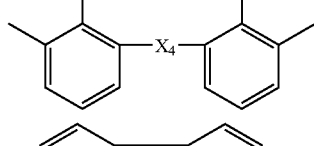

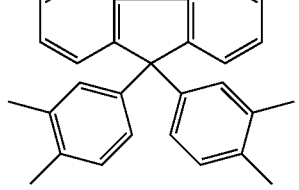

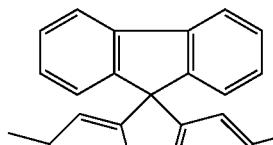

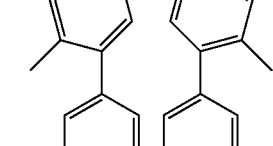

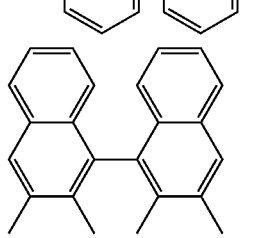

wherein, in Formula (15), $X_4$ is at least a group selected from the group consisting of groups represented by the following Formula (16):

Formula (16):

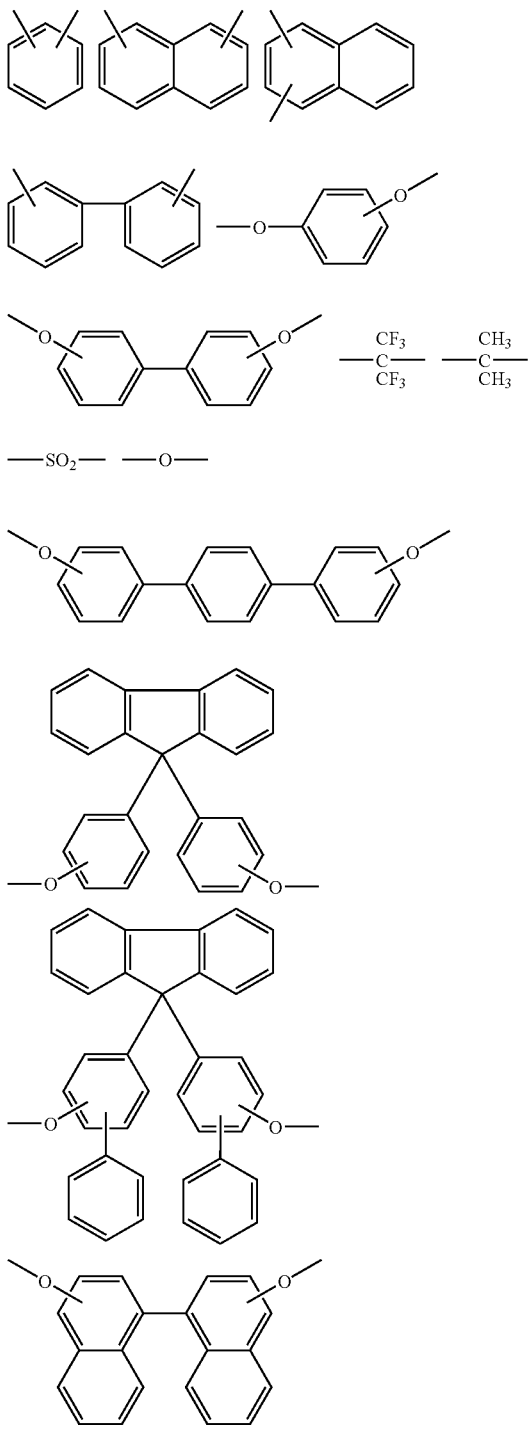

Formula (17):

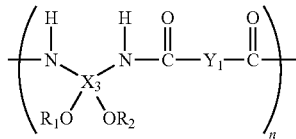

wherein, in the Formula (17), each of $R_1$ and $R_2$ is a hydrogen atom or an organic group; "n" is an integer of 2 to 1,000; $X_3$ is at least a group selected from the group consisting of groups represented by the Formula (14) and Formula (15); $Y_1$ is at least a group selected from the group consisting of groups represented by the Formula (4), Formula (6-1), Formula (6-2), Formula (7-1), Formula (7-2), Formula (8) and Formula (9); and a hydrogen atom of carbocycle contained in $X_3$ or $Y_1$ may be substituted with an alkyl group and/or a fluoroalkyl group,

(21) The resin composition according to any of (1) to (20), wherein the resin composition contains a polybenzoxazole resin obtained by a dehydration and ring-closure reaction of the benzoxazole resin precursor;

(22) A resin composition comprising a benzoxazole resin precursor composition containing, as an essential component, a benzoxazole resin precursor having a third repeating unit represented by the Formula (1), a benzoxazole resin precursor having a forth repeating unit represented by the Formula (10) or a benzoxazole resin precursor having a fifth repeating unit represented by the Formula (13), and two or more kinds selected from the group consisting of the benzoxazole resin precursor having the third repeating unit, the benzoxazole resin precursor having the forth repeating unit, the benzoxazole resin precursor having the fifth repeating unit and a benzoxazole resin precursor having a sixth repeating unit represented by the Formula (17);

(23) A varnish comprising a resin composition defined by any of (1) to (22) and an organic solvent capable of dissolving or dispersing the resin composition;

(24) A resin film comprising a resin composition defined by any of (1) to (22);

(25) The resin film according to claim 24, wherein the resin film has a pore having an average pore diameter of 10 nm or less;

(26) The resin film according to (24) or (25), wherein the resin film is a film selected from the group consisting of an interlayer insulating film for semiconductor device, a protection film for semiconductor device and an etching protection film; and

(27) A semiconductor device having a resin film defined by any of (24) to (26).

According to the present invention, a resin composition which has low dielectric constant and excellent heat resistance can be obtained.

Also, according to the present invention, a resin film which has low dielectric constant and excellent heat resistance and a semiconductor device using the same can be obtained.

Also, in the case of a benzoxazole resin precursor having a particular functional group, processability can be maintained and heat resistance after ring closure of an oxazole ring can be improved by keeping solubility to an organic solvent.

Also, if a resin film is formed to have pores, a resin film particularly excellent in electrical property (particularly dielectric property), physical property and mechanical property can be obtained.

(18) The resin composition according to (17), wherein the benzoxazole resin precursor further has the third repeating unit, the forth repeating unit or both of them;

(19) The resin composition according to (17) or (18), wherein the cross-linking agent has a diamondoid structure;

(20) The resin composition according to any of (12) to (19), wherein the benzoxazole resin precursor further has a sixth repeating unit represented by the following Formula (17):

BRIEF DESCRIPTION OF DRAWING

In the accompanying drawing,

FIG. 1 is a sectional view schematically showing an example of a semiconductor device of the present invention.

The numerical symbol in each figure refers to the following: 1: a semiconductor substrate; 2: a silicon nitride layer; 3: an interlayer insulating film; 4: a copper wiring layer; 5: a reformed processing layer; 6: a barrier layer; 7: a hardmask layer; and 100: a semiconductor device.

BEST MODE FOR CARRYING OUT THE INVENTION

Hereinafter, a resin composition, a varnish, a resin film and a semiconductor device of the present invention will be described.

A resin composition of the present invention comprises a benzoxazole resin precursor and a cross-linking agent, wherein the benzoxazole resin precursor contains a first repeating unit obtained by reacting a bisaminophenol compound and a dicarboxylic acid compound, in which at least one of the bisaminophenol compound and the dicarboxylic acid compound has a diamondoid structure.

Also, the resin composition of the present invention may contain a polybenzoxazole resin obtained by a dehydration and ring-closure reaction of the benzoxazole resin precursor.

Also, a resin film of the present invention comprises the resin composition.

Also, a semiconductor device of the present invention has the resin film.

Firstly, a benzoxazole resin precursor used in the present invention will be described.

A benzoxazole resin precursor used in the present invention contains a first repeating unit obtained by reacting a bisaminophenol compound and a dicarboxylic acid compound, in which at least one of the bisaminophenol compound or the dicarboxylic acid compound has a diamondoid structure. For example, there may be a benzoxazole resin precursor containing a repeating unit obtained by reacting a bisaminophenol compound having a diamondoid structure and a dicarboxylic acid compound not having a diamondoid structure, a repeating unit obtained by reacting a bisaminophenol compound not having a diamondoid structure and a dicarboxylic acid compound having a diamondoid structure or a repeating unit obtained by reacting a bisaminophenol compound having a diamondoid structure and a dicarboxylic acid compound having a diamondoid structure. The diamondoid structure may have a functional group other than the diamondoid structure. As the functional group, a functional group forming a cross-linking bond is preferable, particularly an acethylene group. Also, it is preferable that at least one of the bisaminophenol compound not having a diamondoid structure and the dicarboxylic acid compound not having a diamondoid structure has the functional group other than the diamondoid structure. Thus, the benzoxazole resin precursor having a diamondoid structure can be obtained. The polybenzoxazole resin obtained from the benzoxazole resin precursor has heat resistance and can exhibit high elastic modulus and low permittivity. Also, moisture resistance can be improved. It is preferable that the diamondoid structure is a group having an alkyl group or a fluoroalkyl group. Thereby, solubility to an organic solvent can be improved.

The diamondoid structure of the present invention is a structural unit having an adamantane structure as a minimum unit. As a group having the structure, there may be a group having a polycyclic framework structure such as an adamantly group, a diamantyl group, a triamantyl group, a tetramantyl group, a pentamantyl group, a hexamantyl group, a heptamantyl group, an octamantyl group, a nonamantyl group, a decamantyl group, an undecamantyl group. Further, there may be a group having a plurality of the groups having a polycyclic framework structure and so on. As the group having a plurality of the groups having a polycyclic framework structure, there may be a group having an oligo structure, a poly structure and so on. When the group having a polycyclic framework structure is an adamantyl group, there may be, for example, a group having an oligoadamantane structure including a biadamantyl group such as a di(1,3-adamantane) group, a di(2,2-adamantane) group or the like; a triadamantyl group such as a tri(1,3-adamantane) group, a tri(2,2-adamantane) group or the like; a tetraadamantyl group such as a tetra(1,3-adamantane) group, a tetra(2,2-adamantane) group or the like; a pentaadamantyl group such as a penta(1,3-adamantane) group, a penta(2,2-adamantane) group or the like; a heptaadamantyl group such as a hepta(1,3-adamantane) group, a hepta(2,2-adamantane) group or the like; a hexaadamantyl group; an octaadamantyl group; a nonaadamantyl group; a decaadamantyl group; an undecaadamantyl group or the like. Further, there may be a group having a polyadamantane structure, which has plural adamantyl groups and so on. When the group having a polycyclic framework structure is a group other than an adamantyl group, there may be the group having an oligoadamantane structure or the group having a polyadamantane structure, the adamantyl group of which is substituted. For example, there may be a group having a plurality of diamantane groups such as a bi-(diamantane) group, a tri-(diamantane) group, a tetra-(diamantane) group, a penta-(diamantane) group, a hexa-(diamantane) group, a hepta-(diamantane) group, an octa-(diamantane) group, a nona-(diamantane) group, a deca-(diamantane) group, an undeca-(diamantane) group or the like; a group having a plurality of triamantane groups such as a bi-(triamantane) group, a tri-(triamantane) group, a tetra-(triamantane) group, a penta-(triamantane) group, a hexa-(triamantane) group, a hepta-(triamantane) group, an octa-(triamantane) group, a nona-(triamantane) group, a deca(triamantane) group an undeca(triamantane) group or the like; or a group having a plurality of tetraamantane groups such as a bi-(tetraamantane) group, a tri-(tetraamantane) group, a tetra-(tetraamantane) group, a penta-(tetraamantane) group, a hexa-(tetraamantane) group, a hepta-(tetraamantane) group, an octa-(tetraamantane) group, a nona-(tetraamantane) group, a deca-(tetraamantane) group, an undeca-(tetraamantane) group or the like. Among them, the adamantyl group, the diamantyl group, the triamantyl group, the tetramantyl group, the pentamantyl group, the hexamantyl group, the heptamantyl group, the octamantyl group, the nonamantyl group, the decamantyl group, or the undecamantyl group, the biadamantyl group, the triadamantyl group, the tetraadamantyl group, the pentaadamantyl group, the hexaadamantyl group, the heptaadamantyl group, the octaadamantyl group, the nonaadamantyl group, the decaadamantyl group or the undecaadamantyl group is preferable, and the adamantyl group, the diamantyl group, the triamantyl group, the tetramantyl group, the pentamantyl group, the di(1,3-adamantane) group, the tri(1,3-adamantane) group, the tetra(1,3-adamantane) group, the penta(1,3-adamantane) group, the di(2,2-adamantane) group, the tri(2,2-adamantane) group, the tetra(2,2-adamantane) group or the penta(2,2-adamantane) group is more preferable. Heat resistance of the polybenzoxazole resin obtained from the benzoxazole resin precursor having the above-mentioned structure can be kept, permittivity thereof can be decreased and moisture resistance thereof can be improved. An alkyl group such as a methyl group, an ethyl group, a n-propyl group, an isopropyl group, a n-butyl group, an iso-butyl group, a tert-butyl group or the like; or a fluoroalkyl group such as a fluoromethyl group, a fluoroethyl group, a fluoropropyl group, a fluorobutyl group or the like may be bonded to the group having an adamantane structure.

In the present invention, as a functional group other than a diamondoid structure having the diamondoid structure, there may be, for example, an adamantylethynyl group, a diamantylethynyl group, a triamantylethynyl group, a tetramantylethynyl group, a pentamantylethynyl group, a hexamantylethynyl group, a heptamantylethynyl group, an octamantylethynyl group, a nonamantylethynyl group, a decamantylethynyl group, an undecamantylethynyl group, a biadamantylethynyl group, a triadamantylethynyl group, a tetraadamantylethynyl group, a hexaadamantylethynyl group, a heptaadamantylethynyl group, an octaadamantylethynyl group, a nonaadamantylethynyl group, a decaadamantylethynyl group, an undecaadamantylethynyl group, an adamantylphenylethynyl group, a diamantylphenylethynyl group, a triamantylphenylethynyl group, a tetramantylphenylethynyl group, a pentamantylphenylethynyl group, a hexamantylphenylethynyl group, a heptamantylphenylethynyl group, an octamantylphenylethynyl group, a nonamantylphenylethynyl group, a decamantylphenylethynyl group, an undecamantylphenylethynyl group, a biadamantylphenylethynyl group, a triadamantylphenylethynyl group, a tetraadamantylphenylethynyl group, a pentaadamantylphenylethynyl group, a hexaadamantylphenylethynyl group, a heptaadamantylphenylethynyl group, an octaadamantylphenylethynyl group, a nonaadamantylphenylethynyl group, a decaadamantylphenylethynyl group, an undecaadamantylphenylethynyl group, an adamantylphenoxyphenylethynyl group, a diamantylphenoxyphenylethynyl group, a triamantylphenoxyphenylethynyl group, a tetramantylphenoxyphenylethynyl group, a pentamantylphenoxyphenylethynyl group, a hexamantylphenoxyphenylethynyl group, a heptamantylphenoxyphenylethynyl group, an octamantylphenoxyphenylethynyl group, a nonamantylphenoxyphenylethynyl group, a decamantylphenoxyphenylethynyl group, an undecamantylphenoxyphenylethynyl group, a biadamantylphenoxyphenylethynyl group, a triadamantylphenoxyphenylethynyl group, a tetraadamantylphenoxyphenylethynyl group, a pentaadamantylphenoxyphenylethynyl group, a hexaadamantylphenoxyphenylethynyl group, a heptaadamantylphenoxyphenylethynyl group, an octaadamantylphenoxyphenylethynyl group, a nonaadamantylphenoxyphenylethynyl group, a decaadamantylphenoxyphenylethynyl group, an undecaadamantylphenoxyphenylethynyl group or the like. Also, as a functional group other than the ethynyl group having the diamondoid structure, there may be a functional group having the diamondoid structure in a functional group having an acethylene bond, or a functional group such as a biphenylene group, a cyanato group, a maleimide group, a nadiimide group, a vinyl group, a cyclopentadienyl group or the like. An alkyl group such as a methyl group, an ethyl group, a n-propyl group, an iso-propyl group, a n-butyl group, an iso-butyl group, a tert-butyl group or the like; or a fluoroalkyl group such as a fluoromethyl group, a fluoroethyl group, a fluoropropyl group, a fluorobutyl group or the like may be bonded to the diamondoid structure of the functional group other than a diamondoid structure. Among them, the adamantylphenylethynyl group, the dimethyladamantylphenylethynyl group, the trimethyladamantylphenylethynyl group, the biadamantylphenylethynyl group, the tetramethylbiadamantylphenylethynyl group, the pentamethylbiadamantylphenylethynyl group, the adamantylphenoxyphenylethynyl group, the dimethyladamantylphenylethynyl group, the trimethyladamantylphenylethynyl group, the biadamantylphenoxyphenylethynyl group, the tetramethylbiadamantylphenoxyphenylethynyl group, the pentamethylbiadamantylphenoxyphenylethynyl group or the like is particularly preferable.

In the present invention, as the functional group other than a diamondoid structure, there may be, for example, a functional group having an acethylene bond, a biphenylene group, a cyanato group, a maleimide group, a nadiimide group, a vinyl group, a cyclopentadienyl group or the like. A group which can crosslink with the cross-linking agent is preferable. Thereby, heat resistance of a polybenzoxazole resin which can be obtained from the benzoxazole resin precursor can be improved. Further, solubility of the benzoxazole resin precursor to a solvent can be improved.

Among them, the functional group having an acethylene bond is preferable. Specifically, as the functional group having the acethylene bond, there may be an ethynyl group, a phenylethynyl group, a naphthylethynyl group, an anthrylethynyl group, a quinolylethynyl group, a quinoxalylethynyl group, an alkylethynyl group, a propargylether group or the like. Among them, one or more functional groups selected from the ethynyl group, the phenylethynyl group and the naphthylethynyl group are preferable. Thereby, heat resistance of the polybenzoxazole resin to be obtained, particularly glass transition temperature, can be improved. The heat resistance of polybenzoxazole resin improves since a crosslinking density of the polybenzoxazole resin to be obtained can be improved by having a functional group in a benzoxazole resin precursor. Further, when the cross-linking density of the polybenzoxazole resin improves, in the case of obtaining an interlayer insulating film by forming a nanofoam with the use of the polybenzoxazole resin, the nanofoam can maintain its form without aggregation. Thereby, permittivity of the interlayer insulating film can be decreased.

1. Benzoxazole Resin Precursor Having a First Repeating Unit 1-1. Bisaminophenol Compound Having the Diamondoid Structure The bisaminophenol compound having the diamondoid structure is a compound having a diamondoid unit structure in its molecular, and includes a bisaminophenol compound having a diamondoid structure in a bisaminophenol skeleton and a bisaminophenol compound having a diamondoid structure bonded to a bisaminophenol skeleton directly or via other atom.

1-1-1. Bisaminophenol Compound Having a Diamondoid Structure

As the bisaminophenol compound, there may be a compound having a diamondoid structure as a minimum unit such as, for example, bis(3-amino-4-hydroxyl-phenyl)adamantane, bis(3-hydroxy-4-amino-phenyl)adamantane, bis(3-amino-4-hydroxyphenoxy)adamantane, bis(4-amino-3-hydroxyphenoxy-phenyl)adamantane or the like. Among them, 1,3-bis(3-amino-4-hydroxyl-phenyl)adamantane is preferable. Also, there may be a compound having a polycyclic framework structure having a diamondoid structure such as bis(3-amino-4-hydroxy-phenyl)diamantane, bis(3-hydroxy-4-amino-phenyl)diamantane, bis(3-amino-4-hydroxy-phenyl)trimantane, bis(3-hydroxy-4-amino-phenyl)trimantane, bis(3-amino-4-hydroxy-phenyl)tetramantane, bis(3-hydroxy-4-amino-phenyl)tetramantane, bis(3-amino-4-hydroxy-phenyl)heptamantane, bis(3-hydroxy-4-amino-phenyl)heptamantane, bis(3-amino-4-hydroxy-phenyl)hexamantane, bis(3-hydroxy-4-amino-phenyl)hexamantane, bis(3-amino-4-hydroxy-phenoxy)diamantane, bis(3-hydroxy-4-amino-phenoxy)diamantane, bis(3-amino-4-hydroxy-phenoxy)trimantane, bis(3-hydroxy-4-amino-phenoxy)trimantane, bis(3-amino-4-hydroxy-phenoxy) tetramantane, bis(3-hydroxy-4-amino-phenoxy) tetramantane, bis(3-amino-4-hydroxy-phenoxy) heptamantane, bis(3-hydroxy-4-amino-phenoxy) heptamantane, bis(3-amino-4-hydroxy-phenoxy) hexamantane, bis(3-hydroxy-4-amino-phenoxy) hexamantane, bis(3-amino-4-hydroxy-phenoxy-phenyl) diamantane, bis(3-hydroxy-4-amino-phenoxy-phenyl) diamantane, bis(3-amino-4-hydroxy-phenoxy-phenyl) trimantane, bis(3-hydroxy-4-amino-phenoxy-phenyl) trimantane, bis(3-amino-4-hydroxy-phenoxy-phenyl) tetramantane, bis(3-hydroxy-4-amino-phenoxy-phenyl) tetramantane, bis(3-amino-4-hydroxy-phenoxy-phenyl) heptamantane, bis(3-hydroxy-4-amino-phenoxy-phenyl) heptamantane, bis(3-amino-4-hydroxy-phenoxy-phenyl) hexamantane, bis(3-hydroxy-4-amino-phenoxy-phenyl) hexamantane or the like; or a compound having an oligo adamantane structure or a polyadamantane structure having more s adamantyl groups such as bis(3-amino-4-hydroxy-phenyl)biadamantane, bis(3-hydroxy-4-amino-phenyl)biadamantane, bis(3-amino-4-hydroxy-phenyl)triadamantane, bis(3-hydroxy-4-amino-phenyl)triadamantane, bis(3-amino-4-hydroxy-phenyl)tetraadamantane, bis(3-hydroxy-4-amino-phenyl)tetraadamantane, bis(3-amino-4-hydroxy-phenyl)heptaadamantane, bis(3-hydroxy-4-amino-phenyl) heptaadamantane, bis(3-amino-4-hydroxy-phenyl) hexaadamantane, bis(3-hydroxy-4-amino-phenyl) hexaadamantane, bis(3-amino-4-hydroxy-phenoxy) biadamantane, bis(3-hydroxy-4-amino-phenoxy) biadamantane, bis(3-amino-4-hydroxy-phenoxy) triadamantane, bis(3-hydroxy-4-amino-phenoxy) triadamantane, bis(3-amino-4-hydroxy-phenoxy) tetraadamantane, bis(3-hydroxy-4-amino-phenoxy) tetraadamantane, bis(3-amino-4-hydroxy-phenoxy) heptaadamantane, bis(3-hydroxy-4-amino-phenoxy) heptaadamantane, bis(3-amino-4-hydroxy-phenoxy) hexaadamantane, bis(3-hydroxy-4-amino-phenoxy) hexaadamantane, bis(3-amino-4-hydroxy-phenoxy-phenyl) biadamantane, bis(3-hydroxy-4-amino-phenoxy-phenyl) biadamantane, bis(3-amino-4-hydroxy-phenoxy-phenyl) triadamantane, bis(3-hydroxy-4-amino-phenoxy-phenyl) triadamantane, bis(3-amino-4-hydroxy-phenoxy-phenyl) tetraadamantane, bis(3-hydroxy-4-amino-phenoxy-phenyl) tetraadamantane, bis(3-amino-4-hydroxy-phenoxy-phenyl) heptaadamantane, bis(3-hydroxy-4-amino-phenoxy-phenyl) heptaadamantane, bis(3-amino-4-hydroxy-phenoxy-phenyl) hexaadamantane, bis(3-hydroxy-4-amino-phenoxy-phenyl) hexaadamantane or the like. Among them, 3,3'-bis(3-amino-4-hydroxy-phenyl)-5,5',7,7'-tetramethyl-1,1'-biadamantane is preferable. In addition, there may be a compound having a diamondoid structure in a main chain, which may also have a diamondoid structure in a side chain, such as 3,3'-bis[4-(4-amino-3-hydroxy-6-adamantyl-phenoxy)-phenyl]-1,1'-biadamantane, 3,3'-bis[4-(4-amino-3-hydroxy-6-(3-adamantyl-adamantyl)-phenoxy)-phenyl]-1,1'-biadamantane, 3,3'-bis[4-(4-amino-3-hydroxy-6-tetramantyl-phenoxy)-phenyl]-1,1'-biadamantane, 3,3'-bis[3-amino-4-hydroxy-5-(1-(3,5-dimethyladamantyl))phenyl]-5,5',7,7'-tetramethyl-1,1'-biadamantane, 3,3'-bis[3-amino-4-hydroxy-5-(3-(5,5',7,7'-tetramethyl-1,1'-biadamantyl))phenyl]-5,5',7,7'-tetramethyl-1,1'-biadamantane, 2,2-bis[3-amino-4-hydroxy-5-(1-(3,5-dimethyl-adamantyl))phenyl]adamantane, 2,2-bis[3-amino-4-hydroxy-5-(3-(5,5',7,7'-tetramethyl-1,1'-biadamantyl))phenyl]adamantane or the like, but may not be limited thereto. Besides the above, there may be bisaminophenol having a pentamantyl group, a hexamantyl group, a heptamantyl group, an octamantyl group, a nonamantyl group, a decamantyl group, an undecamantyl group, a pentaadamantyl group, a hexaadamantyl group, a heptaadamantyl group, an octaadamantyl group, a nonaadamantyl group, a decaadamantyl group, an undecamantyl group or the like.

As a compound having an oligo structure having a plurality of groups having the polycyclic framework structure, there may be, for example, 6,6'-bis(3-amino-4-hydroxyl-phenyl)-1,1'-bi(diamantane), 6,6'-bis(3-amino-4-hydroxy-phenoxy)-1,1'-bi(diamantane), 6,6'-bis[4-(3-hydroxy-4-amino-phenoxy)-phenyl]-1,1'-bi(diamantane) or the like, but may not be limited thereto if it has a structure in range of the definition of the diamondoid structure. A binding position of the group having a polycyclic framework structure may also not be limited thereto.

The group having the adamantane structure in the above-mentioned bisphenol compound may be bonded to an alkyl group such as a methyl group, an ethyl group, a n-propyl group, an isopropyl group, a n-butyl group, an iso-butyl group, a tert-butyl group or the like, or a fluoroalkyl group such as a fluoromethyl group, a fluoroethyl group, a fluoropropyl group, a fluorobutyl group or the like. As the compound, for example, there may be 3,3'-bis(3-amino-4-hydroxy-phenyl)-(5,5',7,7'-tetramethyl)-1,1'-biadamantane, 3,3'-bis[4-(4-amino-3-hydroxy-phenoxy)-phenyl]-(5,5',7,7'-tetramethyl)-1,1'-biadamantane, 3,3'-bis[4-(4-amino-3-hydroxy-6-(3,5-dimethyl-adamantyl)-phenoxy)-phenyl]-(5,5',7,7'-tetramethyl)biadamantane, 3,3'-bis(3-amino-4-hydroxy-phenyl)-(5,5'-dibutyl)-1,1'-biadamantane or the like, but may not be limited thereto.

The bisaminophenol compound can be used alone or in combination of two or more kinds.

As a method of introducing the diamondoid structure to the bisaminophenol compound, for example, there may be a method wherein bis(4-hydroxy-phenyl)-1,3-adamantane is synthesized by the Friedel-Crafts reaction of dibromo-adamantane with phenol followed by nitration of an ortho position of a hydroxyl group and further reduction to an amino group, thus synthesizing bis-(3-amino-4-hydroxy-phenyl)-1,3-adamantane. Also, there may be a method wherein bis-(4-hydroxy-phenyl)-1,3-adamantane is etherified with 4-nitro-3-benzyloxy-1-fluorobenzene followed by a deprotection of a benzyloxy group and a reduction reaction of a nitro group, thus synthesizing bis-[4-(4-amino-3-hydroxy-phenoxy)phenyl]1,3-adamantane.

1-1-2. Bisaminophenol Compound Having the Diamondoid Structure in a Functional Group Other than a Diamondoid Structure (a Compound Having the Diamondoid Structure Bonded to a Bisaminophenol Skeleton Via Other Atom)

Among the bisaminophenol compounds, as a bisaminophenol compound having the diamondoid structure via an ethynyl group, there may be, for example, a bisaminophenol compound having ethynyl(phenylethynyl)-binaphthalene such as 2,2'-bis-(3-hydroxy-4-aminophenoxy)-6,6'-bis-adamantylethynyl-1,1'-binaphthalene, 2,2'-bis-(3-hydroxy-4-aminophenoxy)-6,6'-bis-diamantylethynyl-1,1'-binaphthalene or the like; a bisaminophenol compound having ethynyl-naphthalene such as 1,5-bis-(3-hydroxy-4-aminophenoxy)-2,6-bis-adamantylethynyl-naphthalene, 1,5-bis-(3-hydroxy-4-aminophenoxy)-2,6-bis-diamantylethynyl-naphthalene, 1,5-bis-(3-hydroxy-4-aminophenoxy)-2-adamantylethynyl-naphthalene, 1,5-bis-(3-hydroxy-4-aminophenoxy)-3-adamantylethynylnaphthalene or the like; a bisaminophenol compound having ethynyl-fluorene such as 9,9-bis-4-(3-hydroxy-4-aminophenoxy)phenyl-2,7-bis-adamantylethynylfluorene, 9,9-bis-4-(3-hydroxy-4-aminophenoxy)phenyl-2,7-bis-diamantylethynyl-fluorene, 9,9-bis(3-amino-4-hydroxy-phenyl)-2,7-bis-adamantylethynyl-fluorene, 9,9-bis(3-amino-4-hydroxy-phenyl)-2,7-bis-diamantylethynyl-fluorene or the like; a bisaminophenol compound having ethynyl-benzene such as 1,3-bis-(3-hydroxy-4-aminophenoxy)-4-adamantylethynyl-benzene, 1,3-bis-(3-hydroxy-4-aminophenoxy)-4-diamantylethynyl-benzene, 1,4-bis-(3-hydroxy-4-aminophenoxy)-3-adamantylethynyl-benzene, 1,4-bis(3-hydroxy-4-aminophenoxy)-3-diamantylethynyl-benzene or the like; a bisaminophenol compound having ethynyl-diphenylether such as 3,3'-diamino-4,4'-dihydroxy-2-adamantylethynyl-diphenylether, 3,3'-diamino-4,4'-dihydroxy-5-diamantylethynyl-diphenylether, 3,3'-diamino-4,4'-dihydroxy-6-triamantylethynyl-diphenylether or the like; a bisaminophenol compound having ethynyl-biphenyl such as 3,3'-diamino-4,4'-dihydroxy-2-adamantylethynyl-biphenyl, 3,3'-diamino-4,4'-dihydroxy-5-diamantylethynyl-biphenyl, 3,3'-diamino-4,4'-dihydroxy-6-triamantylethynyl-biphenyl or the like; a bisaminophenol compound having ethynyl-diphenylsulfone such as 3,3'-diamino-4,4'-dihydroxy-6,6'-bisadamantylethynyl-diphenylsulfone, 3,3'-dihydroxy-4,4'-diamino-6,6'-bisdiamantylethynyl-diphenylsulfone, 3,3'-diamino-4,4'-dihydroxy-2,2'-bistriamantylethynyl-diphenylsulfone or the like; a bisaminophenol compound having ethynyl-phenyl-propane such as 2,2-bis-(3-amino-4-hydroxy-6-adamantylethynyl-phenyl)-propane, 2,2-bis-(3-amino-4-hydroxy-6-diamantylethynyl-phenyl)-propane, 2,2-bis-(3-hydroxy-4-amino-6-triamantylethynyl-phenyl)-propane, 2,2-bis-(3-amino-4-hydroxy-2-tetramantylethynyl-phenyl)-propane or the like; a bisaminophenol compound having ethynyl-phenyl-hexafluoropropane such as 2,2-bis-(3-amino-4-hydroxy-6-adamantylethynyl-phenyl)-hexafluoropropane, 2,2-bis-(3-amino-4-hydroxy-6-diamantylethynyl-phenyl)-hexafluoropropane, 2,2-bis-(3-hydroxy-4-amino-6-triamantylethynyl-phenyl)-hexafluoropropane, 2,2-bis-(3-amino-4-hydroxy-2-tetramantylethynyl-phenyl)-hexafluoropropane or the like, but may not be limited thereto. Besides the above, there may be a bisaminophenol compound having an ethynyl group bonded with a pentamantyl group, a hexamantyl group, a heptamantyl group, an octamantyl group, a nonamantyl group, a decamantyl group, an undecamantyl group, a pentaadamantyl group, a hexaadamantyl group, a heptaadamantyl group, an octaadamantyl group, a nonaadamantyl group, a decaadamantyl group, an undecamantyl group, an adamantylphenyl group, a diamantylphenyl group, a triamantylphenyl group, a tetramantylphenyl group, a pentamantylphenyl group, a hexamantylphenyl group, a heptamantylphenyl group, an octamantylphenyl group, a nonamantylphenyl group, a decamantylphenyl group, an undecamantylphenyl group, a biadamantylphenyl group, a triadamantylphenyl group, a tetraadamantylphenyl group, a pentaadamantylphenyl group, a hexaadamantylphenyl group, a heptaadamantylphenyl group, an octaadamantylphenyl group, a nonaadamantylphenyl group, a decaadamantylphenyl group, an undecaadamantylphenyl group, an adamantylphenoxyphenyl group, a diamantylphenoxyphenyl group, a triamantylphenoxyphenyl group, a tetramantylphenoxyphenyl group, a pentamantylphenoxyphenyl group, a hexamantylphenoxyphenyl group, a heptamantylphenoxyphenyl group, an octamantylphenoxyphenyl group, a nonamantylphenoxyphenyl group, a decamantylphenoxyphenyl group, an undecamantylphenoxyphenyl group, a biadamantylphenoxyphenyl group, a triadamantylphenoxyphenyl group, a tetraadamantylphenoxyphenyl group, a pentaadamantylphenoxyphenyl group, a hexaadamantylphenoxyphenyl group, a heptaadamantylphenoxyphenyl group, an octaadamantylphenoxyphenyl group, a nonaadamantylphenoxyphenyl group, a decaadamantylphenoxyphenyl group, an undecaadamantylphenoxyphenyl group or the like. The bisaminophenol compound may be used alone or in combination of two or more kinds.

The group having the adamantane structure in the above-mentioned bisphenol compound may be bonded to an alkyl group such as a methyl group, an ethyl group, a n-propyl group, an isopropyl group, a n-butyl group, an iso-butyl group, a tert-butyl group or the like, or a fluoroalkyl group such as a fluoromethyl group, a fluoroethyl group, a fluoropropyl group, a fluorobutyl group or the like.

As a method of introducing a functional group having the diamondoid structure to the bisaminophenol compound, in the case of an ethynyl group having the diamondoid structure, for example, there may be a method of a coupling reaction between 1-ethynyladamantane and a halogenated compound. Specifically, based on the coupling reaction of a halogenated compound having ortho-hydroxy-nitrobenzene structure with ethynyladamantane, an adamantlyethynyl group may be introduced to a bisaminophenol compound by an amination reaction selecting an appropriate catalyst without acethylene bond reduction.

1-2. Bisaminophenol Compound not Having the Diamondoid Structure
1-2-1. Bisaminophenol Compound Having a Functional Group Other than the Diamondoid Structure As a bisaminophenol compound having a functional group other than the diamondoid structure, there may be, for example, a bisaminophenol compound having ethynyl(phenylethynyl)-binaphthalene such as 2,2'-bis-(3-hydroxy-4-aminophenoxy)-6,6'-bis-ethynyl-1,1'-binaphthalene, 2,2'-bis-(3-hydroxy-4-aminophenoxy)-6,6'-bis-phenylethynyl-1,1'-binaphthalene or the like; a bisaminophenol compound having ethynyl(phenylethynyl)-naphthalene such as 1,5-bis-(3-hydroxy-4-aminophenoxy)-2,6-bis-ethynyl-naphthalene, 1,5-bis-(3-hydroxy-4-aminophenoxy)-2,6-bis-phenylethynyl-naphthalene), 1,5-bis-(3-hydroxy-4-aminophenoxy)-2-phenylethynylnaphthalene, 1,5-bis-(3-hydroxy-4-aminophenoxy)-3-phenylethynylnaphthalene or the like; a bisaminophenol compound having ethynyl(phenylethynyl)-fluorene such as 9,9-bis-4-(3-hydroxy-4-aminophenoxy)phenyl-2,7-bis-ethynyl-fluorene, 9,9-bis-4-(3-hydroxy-4-aminophenoxy)phenyl-2,7-bis-phenylethynyl-fluorene, 9,9-bis(3-amino-4-hydroxy-phenyl)-2,7-bisethynyl-fluorene, 9,9-bis(3-amino-4-hydroxy-phenyl)-2,7-bisphenylethynyl-fluorene or the like; a bisaminophenol compound having ethynyl(phenylethynyl)-benzene such as 1,3-bis(3-hydroxy-4-aminophenoxy)-4-ethynyl-benzene, 1,3-bis-(3-hydroxy-4-aminophenoxy)-4-phenylethynyl-benzene, 1,4-bis-(3-hydroxy-4-aminophenoxy)-3-ethynyl-benzene, 1,4-bis-(3-hydroxy-4-aminophenoxy)-3-phenylethynyl-benzene or the like; a bisaminophenol compound having ethynyl(phenylethynyl)-diphenylether such as 3,3'-diamino-4,4'-dihydroxy-2-phenylethynyl-diphenylether, 3,3'-diamino-4,4'-dihydroxy-5-phenylethynyl-diphenylether, 3,3'-diamino-4,4'-dihydroxy-6-phenylethynyl-diphenylether or the like; a bisaminophenol compound having ethynyl(phenylethynyl)-biphenyl such as 3,3'-diamino-4,4'-dihydroxy-2-phenylethynylbiphenyl, 3,3'-diamino-4,4'-dihydroxy-5-phenylethynyl-biphenyl, 3,3'-diamino-4,4'-dihydroxy-6-phenylethynyl-biphenyl or the like; a bisaminophenol compound having ethynyl(phenylethynyl)-diphenylsulfone such as 3,3'-diamino-4,4'-dihydroxy-6,6'-diphenylethynyl-diphenylsulfone, 3,3'-dihydroxy-4,4'-diamino-6,6'-diphenylethynyl-diphenylsulfone, 3,3'-diamino-4,4'-dihydroxy-2,2'-diphenylethynyl-diphenylsulfone or the like; a bisaminophenol compound having ethynyl(phenylethynyl)-phenyl-propane such as 2,2-bis-(3-amino-4-hydroxy-6-ethynylphenyl)-propane, 2,2-bis-(3-amino-4-hydroxy-6-phenylethynyl-phenyl)-propane, 2,2-bis-(3-hydroxy-4-amino-6-phenylethynyl-phenyl)-propane, 2,2-bis(3-amino-4-hydroxy-2-phenylethynyl-phenyl)-propane or the like; a bisaminophenol compound having ethynyl(phenylethynyl)-phenyl-hexafluoropropane such as 2,2-bis-(3-amino-4-hydroxy-6-ethynyl-phenyl)-hexafluoropropane, 2,2-bis-(3-amino-4-hydroxy-6-phenylethynyl-phenyl)-hexafluoropropane, 2,2-bis-(3-hydroxy-4-amino-6-phenylethynyl-phenyl)-hexafluoropropane, 2,2-bis-(3-amino-4-hydroxy-2-phenylethynyl-phenyl)-hexafluoropropane or the like. The bisaminophenol compound may be used alone or in combination of two or more kinds.

Among them, a bisaminophenol compound having one or more functional groups selected from the bisaminophenol compound having ethynyl(phenylethynyl)-naphthalene and the bisaminophenol compound having ethynyl(phenylethynyl)-fluorene is preferable. Thereby, elastic modulus at high temperature of a polybenzoxazole resin can be improved.

As a method of introducing the functional group other than the diamondoid structure to the bisaminophenol compound, for example, there may be a method of a coupling reaction to a halogenated compound. Specifically, based on the coupling reaction of a halogenated compound having an ortho-hydroxy-nitrobenzene structure with ethynylbenzene, a functional group may be introduced to a bisaminophenol compound by an amination reaction selecting an appropriate catalyst without acethylene bond reduction.

1-2-2. Bisaminophenol Compound not Having the Diamondoid Structure and a Functional Group Other than the Diamondoid Structure In the present invention, "a bisaminophenol compound does not have the diamondoid structure and a functional group other than the diamondoid structure" means that a bisaminophenol compound (1) does not contain the diamondoid structure, and (2) does not contain a functional group other than an amino group and a phenolic hydroxyl group which bisaminophenol essentially has. As the bisaminophenol compound not having the diamondoid structure and a functional group other than the diamondoid structure, there may be a compound having dihydroxylbenzene such as 3,4-diamino-resorcinol, 2,5-diamino-1,4-dihydroxylbenzene or the like; a compound having a dihydroxybiphenyl such as 3,3'-diamino-4,4'-dihydroxy-biphenyl, 3,3'-dihydroxy-4,4'-diamino-biphenyl or the like; a bisaminophenol compound having dihydroxy-diphenylether such as 3,3'-diamino-4,4'-dihydroxy-diphenylether or the like; a compound having a fluorene skeleton such as 9,9-bis(3-amino-4-hydroxy-phenyl)fluorene, 9,9-bis(4-(4-amino-3-hydroxy)-phenoxy-phenyl)fluorene or the like; a compound having a binaphthalene skeleton such as 2,2'-bis(4-amino-3-hydroxy-phenoxy)-1,1'-binaphthalene or the like; a compound having a sulfone group such as 3,3'-diamino-4,4'-dihydroxy-diphenylsulfone, bis(4-(4-amino-3-hydroxy)-phenoxy-phenyl)sulfone, bis(4-(4-hydroxy-3-amino)phenoxy-phenyl)sulfone or the like; or a compound having fluorine or a fluorinated alkyl group such as 2,2-bis(3-amino-4-hydroxyphenyl)hexafluoropropane or the like. The bisaminophenol compound can be used alone or in combination of two or more kinds.

Among them, one or more kinds of bisaminophenol compounds selected from the compound having dihydroxylbenzene, the compound having dihydroxy-diphenylether, the compound having a fluorene skeleton and the compound having a binaphthalene skeleton are preferable.

1-3. Dicarboxylic Acid Having the Diamondoid Structure

The dicarboxylic acid having the diamondoid structure is dicarboxylic acid having the diamondoid unit structure in its molecule, but may not be limited thereto. Thereby, an elastic modulus of a polybenzoxazole resin can be further improved.

1-3-1. Dicarboxylic Acid Having the Diamondoid Structure

In the present invention, dicarboxylic acid having the diamondoid structure is dicarboxylic acid having the diamondoid structure in a dicarboxylic acid skeleton or dicarboxylic acid having the diamondoid structure bonded to a dicarboxylic acid skeleton directly or via other atom.

As the dicarboxylic acid having the diamondoid structure and not having a functional group other than the diamondoid structure, there may be, for example, adamantane-dicarboxylic acid such as 1,3-adamantane-dicarboxylic acid, 2,2-adamantane-dicarboxylic acid, 1,2-adamantane-dicarboxylic acid or the like; diamantanedicarboxylic acids such as 1,6-diamantanedicarboxylic acid, 4,9-diamantanedicarboxylic acid, 2,2-diamantanedicarboxylic acid or the like; triamantanedicarboxylic acids such as 1,3-triamantanedicarboxylic acid, 1,6-triamantanedicarboxylic acid or the like; tetramantanedicarboxylic acids such as 1,3-tetramantanedicarboxylic acid, 1,6-tetramantanedicarboxylic acid, 1,8-tetramantanedicarboxylic acid or the like; biadamantane-dicarboxylic acids such as 3,3'-(1,1'-biadamantane)-dicarboxylic acid, 3,5-(1,1'-biadamantane)-dicarboxylic acid, 2,2-(1,1'-biadamantane)-dicarboxylic acid, 2,2'-(1,1'-biadamantane)-dicarboxylic acid, 2,5-(1,1'-biadamantane)-dicarboxylic acid or the like; triadamantane dicarboxylic acids such as 1,3"-(1,1',1"-triadamantane)-dicarboxylic acid, 2,2-(1,1',1"-triadamantane)-dicarboxylic acid, 2',2'-(1,1',1"-triadamantane)-dicarboxylic acid, 3,5-(1,1',1"-triadamantane)-dicarboxylic acid, 3',5'-(1,1',1"-triadamantane)-dicarboxylic acid, 3',5"-(1,1',1"-triadamantane)-dicarboxylic acid or the like; bisbenzoic acid having a polycyclic framework structure of a diamondoid structure such as 1,3-bis(4-carboxy-phenyl)-adamantane, 1,3-bis(3-carboxy-phenyl)-adamantane, 1,3-bis(2-carboxy-phenyl)-adamantane, bis(4-carboxy-phenyl)-diamantane, bis(3-carboxy-phenyl)-diamantane, bis(2-carboxy-phenyl)-diamantane, bis(4-carboxy-phenyl)-triamantane, bis(3-carboxy-phenyl)-triamantane, bis(2-carboxy-phenyl)-triamantane, bis(4-carboxy-phenyl)-tetraamantane, bis(3-carboxy-phenyl)-tetraamantane, bis(2-carboxy-phenyl)-tetraamantane, 3-bis(4-carboxy-phenoxy)-adamantane, 1,3-bis(3-carboxy-phenoxy)-adamantane, 1,3-bis(2-carboxy-phenoxy)-adamantane, bis(4-carboxy-phenoxy)-diamantane, bis(3-carboxy-phenoxy)-diamantane, bis(2-carboxy-phenoxy)-diamantane, bis(4-carboxy-phenoxy)-triamantane, bis(3-carboxy-phenoxy)-triamantane, bis(2-carboxy-phenoxy)-triamantane, bis(4-carboxy-phenoxy)-tetraamantane, bis(3-carboxy-phenoxy)-tetraamantane, bis(2-carboxy-phenoxy)-tetraamantane, 1,3-bis(4-carboxy-phenoxy-phenyl)-adamantane, 1,3-bis(3-carboxy-phenoxy-phenyl)-adamantane, 1,3-bis(2-carboxy-phenoxy-phenyl)-adamantane, bis(4-carboxy-phenoxy-phenyl)-diamantane, bis(3-carboxy-phenoxy-phenyl)-diamantane, bis(2-carboxy-phenoxy-phenyl)-dibiamantane, bis(4-carboxy-phenoxy-phenyl)-triamantane, bis(3-carboxy-phenoxy-phenyl)-triamantane, bis(2-carboxy-phenoxy-phenyl)-triamantane, bis(4-carboxy-phenoxy-phenyl)-tetraamantane, bis(3-carboxy-phenoxy-phenyl)-tetraamantane, bis(2-carboxy-phenoxy-phenyl)-tetraamantane or the like; bisbenzoic acid having an oligo adamantane structure or a polyadamantane structure having more adamantyl groups such as bis(4-carboxy-phenyl)-1,1'-biadamantane, bis(3-carboxy-phenyl)-1,1'-biadamantane, bis(2-carboxy-phenyl)-1,1'-biadamantane, bis(4-carboxy-phenyl)-1,1',1"-triadamantane, bis(3-carboxyphenyl)-1,1',1"'-triadamantane, bis(2-carboxy-phenyl)-1,1', 1"-triadamantane, bis(4-carboxy-phenyl)-1,1',1",1"'-tetraadamantane, bis(3-carboxy-phenyl)-1,1',1",1"'-tetraadamantane, bis(2-carboxy-phenyl)-1,1',1",1"'-tetraadamantane, bis(4-carboxy-phenoxy)-1,1'-biadamantane, bis(3-carboxy-phenoxy)-1,1'-biadamantane, bis(2-carboxy-phenoxy)-1,1'-biadamantane, bis(4-carboxy-phenoxy)-1,1',1"-triadamantane, bis(3-carboxy-phenoxy)-1,1',1"-triadamantane, bis(2-carboxy-phenoxy)-1,1',1"-triadamantane, bis(4-carboxy-phenoxy)-1,1',1",1"'-tetraadamantane, bis(3-carboxy-phenoxy)-1,1',1",1"'-tetraadamantane, bis(2-carboxy-phenoxy)-1,1',1",1"'-tetraadamantane, bis(4-carboxy-phenoxy-phenyl)-1,1'-biadamantane, bis(3-carboxy-phenoxy-phenyl)-1,1'-biadamantane, bis(2-carboxy-phenoxy-phenyl)-1,1'-biadamantane, bis(4-carboxy-phenoxy-phenyl)-1,1',1"-triadamantane, bis(3-carboxy-phenoxy-phenyl)-1,1',1"-triadamantane, bis(2-carboxy-phenoxy-phenyl)-1,1',1"-triadamantane, bis(4-carboxy-phenoxy-phenyl)-1,1',1",1"'-tetraadamantane, bis(3-carboxy-phenoxy-phenyl)-1,1',1", 1"'-tetraadamantane, bis(2-carboxy-phenoxy-phenyl)-1,1', 1",1"'-tetraadamantane or the like; or further, a compound having a diamondoid structure in its main chain and may also have a diamondoid structure in a side chain such as 3,3'-bis[4-(3-carboxy-6-adamantyl-phenoxy)-phenyl]-1,1'-biadamantane, 3,3'-bis[4-(3-carboxy-6-(3-adamantyl-adamantyl)-phenoxy)-phenyl]-1,1'-biadamantane, 3,3'-bis[4-(4-carboxy-6-tetramantyl-phenoxy)-phenyl]-1,1'-biadamantane or the like, but may not be limited thereto. Besides the above examples, there may be dicarboxylic acids having a pentamantyl group, a hexamantyl group, a heptamantyl group, an octamantyl group, a nonamantyl group, a decamantyl group, an undecamantyl group, a hexaadamantyl group, a pentaadamantyl group, a hexaadamantyl group, a heptaadamantyl group, an octaadamantyl group, a nonaadamantyl group, a decaadamantyl group, an undecaadamantyl group or the like. Also, as a compound having an oligo structure having a plurality of groups having the polycyclic framework structure, there may be, for example, 1,1'-bi(diamantane)-6,6'-dicarboxylic acid, 6,6'-bis(4-carboxy-phenyl)-1, 1'-bi(diamantane), 6,6'-bis(4-carboxy-phenoxy)-1,1'-bi(diamantane), 6,6'-bis[4-(4-carboxy-phenoxy)-phenyl]-1,1'-bi(diamantane) or the like, but may not be limited thereto if it has a structure in range of the definition of the diamondoid structure. A binding position of the group having a polycyclic framework structure may also not be limited thereto.

The group having the adamantane structure in the above-mentioned dicarboxylic acid may be bonded to an alkyl group such as a methyl group, an ethyl group, a n-propyl group, an isopropyl group, a n-butyl group, an iso-butyl group, a tert-butyl group or the like, or a fluoroalkyl group such as a fluoromethyl group, a fluoroethyl group, a fluoropropyl group, a fluorobutyl group or the like. As the compound, for example, there may be 3,3'-(5,5',7,7'-tetramethyl-1,1'-biadamantane)-dicarboxylic acid, 3,3'-(5,5',7,7'-tetraethyl-1,1'-biadamantane)-dicarboxylic acid, 3,3'-(5,5',7,7'-tetrabutyl-1, 1'-biadamantane)-dicarboxylic acid, 3,3'-(5,5'-dimethyl-1,1'-biadamantane)-dicarboxylic acid, 3,3'-(5,5'-diethyl-1,1'-biadamantane)-dicarboxylic acid, 3,3'-(5,5'-dibutyl-1,1'-biadamantane)-dicarboxylic acid, 3,3'-bis(4-carboxy-phenyl)-(5,5',7,7'-tetramethyl)-1,1'-biadamantane, 3,3'-bis[4-(4-carboxy-phenoxy)-phenyl]-(5,5',7,7')-1,1'-biadamantane, 3,3'-bis[4-(4-carboxy-6-(3,5-dimethyladamantyl)-phenoxy)-phenyl]-(5,5',7,7'-tetramethyl)biadamantane, 3,3'-bis(3-amino-4-hydroxy-phenyl)-(5,5'-dibutyl)-1,1'-biadamantane or the like, but may not be limited thereto.

Among them, adamantane dicarboxylic acid, biadamantane dicarboxylic acid, tetradamantane dicarboxylic acid are preferable. As specific examples, adamantane-1,3-dicarboxylic acid, 1,1'-biadamantane-3,3'-dicarboxylic acid, 5,7-dimethyl-adamantane-1,3-dicarboxylic acid, 5,5',7,7'-tetramethyl-1,1'-biadamantane-3,3'-dicarboxylic acid, tetraadamantane dicarboxylic acid and so on are preferable, particularly biadamantane dicarboxylic acid is more preferable. The group having the adamantane structure in the above-mentioned dicarboxylic acid may be bonded to an alkyl group such as a methyl group, an ethyl group, a n-propyl group, an isopropyl group, a n-butyl group, an iso-butyl group, a tert-butyl group or the like, or a fluoroalkyl group such as a fluoromethyl group, a fluoroethyl group, a fluoropropyl group, a fluorobutyl group or the like.

The dicarboxylic acid may be used alone or in combination of two or more kinds.

As a method of introducing a functional group having the diamondoid structure to the dicarboxylic acid compound, for example, there may be a method wherein bis(4-bromo-phenyl)-1,3-adamantane is synthesized by the Friedel-Crafts reaction of dibromo-adamantane with bromobenzene followed by anionation of a bromo group with alkyl lithium and treatments by carbon dioxide gas and acid, thus synthesizing bis(4-carboxy-phenyl)-1,3-adamantane. Also, bis(4-hydroxy-phenyl)-1,3-adamantane may be etherified with methyl 4-bromobenzoate followed by a de-esterified reduction reaction, thus synthesizing bis-[4-(4-carboxy-phenoxy)phenyl]1,3-adamantane.

1-3-2. Dicarboxylic Acid Having the Diamondoid Structure at a Functional Group Other than a Diamondoid Structure In the present invention, "dicarboxylic acid has the diamondoid structure at a functional group other than a diamondoid structure" means that the diamondoid structure is bonded with a dicarboxylic acid skeleton via other atom.

Among the dicarboxylic acid, as the dicarboxylic acid having the diamondoid structure via an ethynyl group, there may be, for example, ethynyl phthalate including ethynyl isophthalate such as 3-adamantylethynyl phthalate, 4-amantylethynyl phthalate, 5-amantylethynyl isophthalate or the like, or ethynyl terephthalate such as 2-amantylethynyl terephthalate, 3-amantylethynyl terephthalate or the like; ethynyl naphthalene dicarboxylic acid such as 2-amantylethynyl-1,5-naphthalenedicarboxylic acid, 3-amantylethynyl-1,5-naphthalenedicarboxylic acid or the like; diethynyl-biphenyl dicarboxylate such as 4,4'-bisadamantylethynyl-2, 2'-biphenyl dicarboxylate, 5,5'-bisamantylethynyl-2,2'-biphenyl dicarboxylate or the like; bis(carboxy-ethynylphenyl)propane such as 2,2-bis(2-carboxy-3-amantylethynylphenyl)propane, 2,2-bis(2-carboxy-4-amantylethynylphenyl)propane or the like; bis(carboxy-ethynylphenyl)hexafluoropropane such as 2,2-bis(2-carboxy-4-amantylethynylphenyl)hexafluoropropane, 2,2-bis(3-carboxy-5-amantylethynylphenyl)hexafluoropropane or the like; 4-adamantylethynyl-1,3-dicarboxycyclopropane, 5-amantylethynyl-2,2-dicarboxycyclopropane, a structural isomer of 1,3-bis(4-carboxy-phenoxy)-5-adamantylethynyl-benzene, a structural isomer of 1,3-bis(4-carboxy-phenyl)-5-adamantylethynyl-benzene, or (ethynyl-phenoxy)phthalic acid including (ethynyl-phenoxy)isophthalic acid such as 5-(3-adamantyl-ethynyl-phenoxy)-isophthalic acid or the like, and (ethynyl-phenoxy)terephthalic acid such as 2-(1-adamantylethynyl-phenoxy)terephthalic acid. The adamantylethynyl position of the dicarboxylic acid may be a group such as a diamantylethynyl group, a triamantylethynyl group, a tetramantylethynyl group, a pentamantylethynyl group, a hexamantylethynyl group, a heptamantylethynyl group, an octamantylethynyl group, a nonamantylethynyl group, a decamantylethynyl group, an undecamantylethynyl group or the like; a group such as a biadamantylethynyl group, a triadamantylethynyl group, a tetraadamantylethynyl group, a pentaadamantylethynyl group, a hexaadamantylethynyl group, a heptaadamantylethynyl group, an octaadamantylethynyl group, a nonaadamantylethynyl group, a decaadamantylethynyl group, an undecaadamantylethynyl group or the like; a group such as an adamantylphenylethynyl group, a diamantylphenylethynyl group, a triamantylphenylethynyl group, a tetramantylphenylethynyl group, a pentamantylphenylethynyl group, a hexamantylphenylethynyl group, a heptamantylphenylethynyl group, an octamantylphenylethynyl group, a nonamantylphenylethynyl group, a decamantylphenylethynyl group, an undecamantylphenylethynyl group or the like; a group such as a biadamantylphenylethynyl group, a triadamantylphenylethynyl group, a tetraadamantylphenylethynyl group, a pentaadamantylphenylethynyl group, a hexaadamantylphenylethynyl group, a heptaadamantylphenylethynyl group, an octaadamantylphenylethynyl group, a nonaadamantylphenylethynyl group, a decaadamantylphenylethynyl group, an undecaadamantylphenylethynyl group or the like; a group such as a adamantylphenoxyphenylethynyl group, a diamantylphenoxyphenylethynyl group, a triamantylphenoxyphenylethynyl group, a tetramantylphenoxyphenylethynyl group, a pentamantylphenoxyphenylethynyl group, a hexamantylphenoxyphenylethynyl group, a heptamantylphenoxyphenylethynyl group, an octamantylphenoxyphenylethynyl group, a nonamantylphenoxyphenylethynyl group, a decamantylphenoxyphenylethynyl group, an undecamantylphenoxyphenylethynyl group or the like; or a group such as a biadamantylphenoxyphenylethynyl group, a triadamantylphenoxyphenylethynyl group, a tetraadamantylphenoxyphenylethynyl group, a pentaadamantylphenoxyphenylethynyl group, a hexaadamantylphenoxyphenylethynyl group, a heptaadamantylphenoxyphenylethynyl group, an octaadamantylphenoxyphenylethynyl group, a nonaadamantylphenoxyphenylethynyl group, a decaadamantylphenoxyphenylethynyl group, an undecaadamantylphenoxyphenylethynyl group or the like. Among them, the adamantlyphenylethynyl group, the biadamantylphenylethynyl group, the adamantlyphenoxyphenylethynyl group and the biadamantylphenoxyphenylethynyl group are more preferable.

Also, a compound having carboxylic acid bonded to an adamantane structure such as 5-phenylethynyl-adamantane-1,3-dicarboxylic acid, 5-ethynyl-adamantane-1,3-dicarboxylic acid, 5-phenylethynyl-1,1'-biadamantane-3,3'-dicarboxylic acid, 5-ethynyl-1,1'-biadamantane-3,3'-dicarboxylic acid or the like is preferable. The dicarboxylic acid can be used alone or in combination of two or more kinds. The group having an adamantane structure in the above-mentioned dicarboxylic acid compound may be bonded to an alkyl group such as a methyl group, an ethyl group, a n-propyl group, an isopropyl group, a n-butyl group, an iso-butyl group, a tert-butyl group or the like, or a fluoroalkyl group such as a fluoromethyl group, a fluoroethyl group, a fluoropropyl group, a fluorobutyl group or the like. Among them, the dimethyladamantylphenylethynyl group, the trimethyladamantylphenylethynyl group, the tetramethylbiadamantylphenylethynyl group, the pentamethylbiadamantylphenylethynyl group, the dimethyladamantylphenylethynyl group, the trimethyladamantylphenylethynyl group, the tetramethylbiadamantylphenoxyphenylethynyl group and the pentamethylbiadamantylphenoxyphenylethynyl group are particularly preferable.

1-4. Dicarboxylic Acid not Having the Diamondoid Structure
1-4-1. Dicarboxylic Acid Having a Functional Group Other than the Diamondoid Structure As the dicarboxylic acid having a functional group other than the diamondoid structure, there may be, for example, ethynyl phthalate including 3-ethynyl phthalate, 4-ethynyl phthalate, ethynyl isophthalate such as 5-ethynyl isophthalate or the like, and ethynyl terephthalate such as 2-ethynyl terephthalate, 3-ethynyl terephthalate or the like; ethynyl-naphthalenedicarboxylic acid such as 2-ethynyl-1,5-naphthalenedicarboxylic acid, 3-ethynyl-1,5-naphthalenedicarboxylic acid or the like; diethynyl-biphenyldicarboxylic acid such as 4,4'-diethynyl-2,2'-biphenyldicarboxylic acid, 5,5'-diethynyl-2,2'-biphenyldicarboxylic acid or the like; bis(carboxy-ethynylphenyl)propane such as 2,2-bis(2-carboxy-3-ethynylphenyl)propane, 2,2-bis(2-carboxy-4-ethynylphenyl)propane or the like; bis(carboxy-ethynylphenyl)hexafluoropropane such as 2,2-bis(2-carboxy-4-ethynylphenyl)hexafluoropropane, 2,2-bis(3-carboxy-5-ethynylphenyl)hexafluoropropane or the like; 4-ethynyl-1,3-dicarboxycyclopropane, 5-ethynyl-2,2-dicarboxycyclopropane, a structural isomer of 1,3-bis(4-carboxy-phenoxy)-5-ethynyl-benzene, a structural isomer of 1,3-bis(4-carboxy-phenyl)-5-ethynyl-benzene, (ethynyl-phenoxy)phthalic acid including (ethynyl-phenoxy)isophthalic acid such as 5-(4-ethynyl-phenoxy)-isophthalic acid, 5-(3-ethynyl-phenoxy)-isophthalic acid or the like, and (ethynyl-phenoxy)terephthalic acid such as 2-(1-ethynyl-phenoxy)terephthalic acid or the like; (ethynyl-phenyl)-phthalic acid including (ethynyl-phenyl)-isophthalic acid such as 5-(1-ethynyl-phenyl)-isophthalic acid, and (ethynyl-phenyl)-terephthalic acid such as 2-(1-ethynyl-phenyl)-terephthalic acid or the like; phenylethynyl terephthalate including phenylethynyl phthalate such as 3-phenylethynyl phthalate, 5-phenylethynyl isophthalate or the like, and phenylethynyl terephthalate such as 2-phenylethynyl terephthalate, 3-phenylethynyl terephthalate or the like; phenylethynyl-naphthalenedicarboxylic acid such as 2-phenylethynyl-1,5-naphthalenedicarboxylic acid, diphenylethynyl-biphenyldicarboxylic acid such as 3,3'-diphenylethynyl-2,2'-biphenyldicarboxylic acid, and dicarboxylic acid having a phenylethynyl skeleton of (phenylethynyl-phenoxy)phthalic acid or the like including bis(carboxy-phenylethynylphenyl)propane such as 2,2-bis(2-carboxy-3-phenylethynylphenyl)propane or the like, bis(carboxy-phenylethynylphenyl)hexafluoropropane such as 2,2-bis(2-carboxy-4-phenylethynylphenyl)hexafluoropropane or the like, (phenylethynyl-phenoxy)-isophthalic acid such as 5-(1-phenylethynyl-phenoxy)-isophthalic acid, 5-(2-phenylethynyl-phenoxy)-isophthalic acid, 5-(3-phenylethynyl-phenoxy)isophthalic acid or the like, and (phenylethynyl-phenoxy)terephthalic acid such as 2-(1-phenylethynyl-phenoxy)terephthalic acid or the like; dicarboxylic acid having an alkyl group ethynyl group such as 3-hexynyl phthalate, 2-hexynyl terephthalate, 2-hexynyl-1,5-naphthalenedicarboxylic acid, 3,3'-dihexynyl-2,2'-biphenyl dicarboxylate, 2,2-bis(2-carboxy-3-hexynylphenyl)propane, 2,2-bis(3-carboxy-5-hexynylphenyl)hexafluoropropane, 4-hexynyl-1,3-dicarboxycyclopropane, a structural isomer of 1,3-bis(4-carboxyphenoxy)-5-hexynyl-benzene, 5-(3-hexynyl-phenoxy)-isophthalic acid or the like; dicarboxylic acid having an acetylene skeleton in its molecule such as 4,4'-tolandicarboxylic acid, 3,4'-tolandicarboxylic acid or the like; or dicarboxylic acid having a biphenylene skeleton such as 1,2-biphenylendicarboxylic acid, 1,3-biphenylendicarboxylic acid or the like. The above may be used alone or in combination of two or more kinds. Among them, one or more dicarboxylic acid selected from ethynyl isophthalate, (ethynyl-phenoxy) isophthalic acid, phenylethynyl-isophthalic acid and (phenylethynyl-phenoxy)-isophthalic acid is preferable. Thereby, a cross-linking density of polybenzoxazole resin to be finally obtained can be improved.

As a method of introducing the functional group other than the diamondoid structure to the dicarboxylic acid, for example, a method disclosed in JP-A No. 2002-201158 can be used. That is, a functional group can be introduced by using halogenated dicarboxylic acid ester or dicarboxylic acid ester having a hydroxyl group introduced. More specifically, phenylethynyl-dicarboxylic acid can be obtained by using halogenated dicarboxylic acid ester as a starting material, performing a coupling reaction with phenylacethylene to obtain phenylethynyl-dicarboxylic acid ester, and further performing alkali hydrolysis to de-esterify.

Also, the tolandicarboxylic acid can be obtained, for example, by a method of forming a benzoic acid ester derivative from stilbene followed by forming a tolan skeleton to synthesize the tolandicarboxylic acid, or a method of introducing a tolan skeleton using the Heck reaction from a benzoic acid ester derivative and a phenylethynyl derivative to synthesize the tolandicarboxylic acid.

Also, for the dicarboxylic acid having a biphenylene skeleton, for example, there may be a method disclosed in Journal of Polymer Science: Polymer Letters Edition, Vol. 16, 653-656 (9178). Specifically, 2,7-biphenylenedicarboxylic acid can be obtained by iodination of dimethyl 4,4'-biphenyl-dicarboxylate followed by deiodination to biphenylate and further a de-esterification reaction.

1-4-2. Dicarboxylic Acid not Having the Diamondoid Structure or a Functional Group Other than the Diamondoid Structure In the present invention, "dicarboxylic acid does not have the diamondoid structure or a functional group other than the diamondoid structure" means that dicarboxylic acid (1) does not contain the diamondoid structure and (2) does not contain a functional group other than a carboxy group which dicarboxylic acid essentially has.

As the dicarboxylic acid, there may be, for example, phthalic acid such as isophthalic acid, terephthalic acid, 2-fluoroisophthalic acid, 2,3,5,6-tetrafluoroterephthalic acid or the like; biphenyldicarboxylic acid such as 4,4'-biphenyldicarboxylic acid, 3,4'-biphenyldicarboxylic acid, 3,3'-biphenyldicarboxylic acid, 4,4'-bis(4-carboxyphenoxy)biphenyl, 4,4'-bis(3-carboxyphenoxy)biphenyl or the like; naphthalenedicarboxylic acid such as 1,4-naphthalenedicarboxylic acid, 2,3-naphthalenedicarboxylic acid, 2,6-naphthalenedicarboxylic acid or the like; bisbenzoic acid such as 4,4'-sulfonylbisbenzoic acid, 3,4'-sulfonylbisbenzoic acid, 3,3'-sulfonylbisbenzoic acid, 4,4'-oxybisbenzoic acid, 3,4'-oxybisbenzoic acid, 3,3'-oxybisbenzoic acid or the like; bis-carboxyphenyl-propane(hexafluoropropane) such as 2,2-bis(4-carboxyphenyl)propane, 2,2-bis(3-carboxyphenyl)propane, 2,2-bis(4-carboxyphenyl)hexafluoropropane, 2,2-bis(3-carboxyphenyl)hexafluoropropane or the like; or dicarboxylic acid having a fluorene skeleton such as 9,9-bis(4-(4-carboxyphenoxy)phenyl)fluorene, 9,9-bis(4-(3-carboxyphenoxy)phenyl)fluorene, 9,9-bis-(2-carboxyphenyl)fluorene, 9,9-bis-(3-carboxyphenyl)fluorene or the like; bis-carboxyphenyl-terphenyl such as 4,4'-bis(4-carboxyphenoxy)-p-terphenyl, 4,4'-bis(4-carboxyphenoxy)-m-terphenyl or the like. The dicarboxylic acid can be used alone or in combination of two or more kinds.

1-5. Method of Producing the Benzoxazole Resin Precursor Having the First Repeating Unit The benzoxazole resin precursor having the first repeating unit can be obtained by a reaction of the bisaminophenol compound having the diamondoid structure with the dicarboxylic acid not having the diamondoid structure, a reaction of the bisaminophenol compound not having the diamondoid structure with the dicarboxylic acid having the diamondoid structure or a reaction of the bisaminophenol compound having the diamondoid structure with the dicarboxylic acid having the diamondoid structure. As a method of the reaction, there may be, for example, an acid chloride method. Specifically, the dicarboxylic acid and an excessive amount of thionyl chloride are reacted in the range from room temperature to about 130° C. in the presence of a catalyst such as N,N'-dimethylformamide or the like. After distilling excess thionyl chloride by heating under reduced pressure, a residue is recrystallized with a solvent such as hexane or the like to obtain dicarboxylic acid chloride.

Next, the dicarboxylic acid chloride obtained and the bisaminophenol compound are dissolved in a polar solvent such as N-methyl-2-pyrolidone, N,N'-dimethylacetamide or the like and reacted in the range from about −30° C. to room temperature in the presence of an acid acceptor such as pyridine or the like, thus a benzoxazole resin precursor having a first repeating unit (a benzoxazole resin precursor having a functional group in a side chain). A number of repeating unit of the first repeating unit may not be particularly limited but preferably from 2 to 1,000, and more preferably from 5 to 100. If the number of repeating unit is within the above range, solubility and workability are particularly excellent.

Instead of the acid chloride method, an active ester method may be used. In the active ester method, for example, benzotriazyl ester is produced by reacting the dicarboxylic acid chloride and 1-hydroxybenzotriazole, and the ester is reacted with the bisaminophenol at room temperature or higher similarly as aforementioned.

In the above-mentioned production of the benzoxazole resin precursor, in case of cross-linking the obtained resin with a cross-linking agent, a bisaminophenol compound having a group capable of cross-linking with the cross-linking agent, a dicarboxylic acid compound having a group capable of cross-linking with the cross-linking agent or both of them may be used.

2. Benzoxazole Resin Precursor Having a Second Repeating Unit

The benzoxazole resin precursor having the first repeating unit may further contain a second repeating unit. The second repeating unit can be obtained by reacting the bisaminophenol compound not having the diamondoid structure with the dicarboxylic acid compound not having the diamondoid structure.

A benzoxazole resin precursor having the second repeating unit forms a polybenzoxazole resin not having the diamondoid structure.

The first repeating unit and the second repeating unit may constitute a benzoxazole resin precursor in the state of a copolymer or a mere mixture. Further, in the case of the copolymer, the first repeating unit and the second repeating unit may be a random copolymer, an alternating copolymer or a block copolymer.

As the bisaminophenol compound not having the diamondoid structure and the dicarboxylic acid compound not having the diamondoid structure used for the benzoxazole resin precursor having the second repeating unit, the bisaminophenol compound not having the diamondoid structure mentioned in "1-2." and the dicarboxylic acid compound not having the diamondoid structure mentioned in "1-4." used for the benzoxazole resin precursor having the first repeating unit can be used.

2-1. Production of the Benzoxazole Resin Precursor Having the Second Repeating Unit As a reaction of the bisaminophenol compound not having the diamondoid structure with the dicarboxylic acid not having the diamondoid structure, there may be the aforementioned acid chloride method. As a result, a benzoxazole resin precursor not having the diamondoid structure in a side chain can be obtained.

A number of repeating unit of the second repeating unit may not be particularly limited but preferably from 2 to 1,000, and more preferably from 5 to 100. If the number of repeating unit is within the above range, solubility and workability are particularly excellent.

Instead of the acid chloride method, the active ester method may be used. In the active ester method, for example, benzotriazyl ester is produced by reacting the dicarboxylic acid chloride and 1-hydroxybenzotriazole, and the ester is reacted with the bisaminophenol at room temperature or higher similarly as aforementioned.

3. Benzoxazole Resin Precursor Having a Third Repeating Unit

The benzoxazole resin precursor of the present invention further has a third repeating unit represented by the Formula (1).

The benzoxazole resin precursor having the third repeating unit is a benzoxazole resin precursor containing a diamondoid structure derived from a bisaminophenol compound. Thereby, elastic modulus of a polybenzoxazole resin to be obtained can be improved. If the elastic modulus improves, workability in a process of producing a semiconductor device can be improved.

A number repeating unit (k) of the third repeating unit may not be particularly limited but preferably an integer from 2 to 1,000, more preferably from 5 to 600, and most preferably from 10 to 80. If the number of repeating unit is within the above range, workability is excellent when the benzoxazole resin precursor is dissolved in a solvent.

3-1. Production of the Benzoxazole Resin Precursor Having the Third Repeating Unit As a method of obtaining the benzoxazole resin precursor having the third repeating unit, the benzoxazole resin precursor having the third repeating unit can be synthesized by reacting a bisaminophenol compound represented by the following Formula (18), wherein $X_1$ is a group selected from groups represented by the Formula (2-1), (2-2) and (3) and a dicarboxylic acid compound represented by the following Formula (19), wherein $Y_1$ is a group selected from groups represented by the Formula (4), (6-1), (6-2), (7-1), (7-2), (8) and (9):

Formula (18):

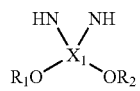

wherein, in the Formula (18), each of $R_1$ and $R_2$ is independently a hydrogen atom or an organic group; the organic group is an alkyl group having 1 to 20 carbons such as a methyl group, an ethyl group, a n-propyl group, an isopropyl group, a n-butyl group, a t-butyl group, an isobutyl group, a sec-butyl group or the like, an alkyl group having 1 to 20 carbons via a —C(=O)—O— bond or a group having a vinyl group having 1 to 20 carbons via —(O=)C—, Formula (19):

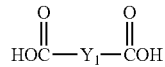

For example, there may be a method of reacting the bisaminophenol compound having a diamondoid structure and the dicarboxylic acid not having a functional group with the bisaminophenol compound having a diamondoid structure and the dicarboxylic acid having a functional group other than the diamondoid structure or reacting the bisaminophenol compound having a diamondoid structure, the dicarboxylic acid not having a functional group and the dicarboxylic acid having a functional group other than the diamondoid structure by the acid chloride method. A combination of the above can be selected according to characteristics to be obtained, for example, permittivity. As a resin film, a resin film having pores is preferable in order to obtain lower permittivity. In that case, a combination of the bisaminophenol compound having a diamondoid structure and the dicarboxylic acid having a functional group is more preferable.

Instead of the acid chloride method, the active ester method may be used. In the active ester method, for example, benzotriazyl ester is produced by reacting the dicarboxylic acid chloride and 1-hydroxybenzotriazole, and the ester is reacted with the bisaminophenol at room temperature or higher similarly as aforementioned.

4. Benzoxazole Resin Precursor Having a Fourth Repeating Unit

The benzoxazole resin precursor in the present invention has a repeating unit represented by the Formula (10). The benzoxazole resin precursor having the third repeating unit preferably has a fourth repeating unit represented by the Formula (10), but may not be particularly limited.

A number of repeating unit (m) of the fourth repeating unit may not be particularly limited but preferably an integer from 2 to 1,000, more preferably from 5 to 600, and most preferably from 10 to 80. If the number of repeating unit is within the above range, workability is excellent when the benzoxazole resin precursor is dissolved in a solvent.

The third repeating unit and the fourth repeating unit may constitute the benzoxazole resin precursor in the state of a copolymer or a mere mixture. Further, in the case of the copolymer, the third repeating unit and the fourth repeating unit may a random copolymer, an alternating copolymer or a block copolymer.

4-1. Production of the Benzoxazole Resin Precursor Having the Fourth Repeating Unit As a method of obtaining the benzoxazole resin precursor having the fourth repeating unit, the benzoxazole resin precursor having the fourth repeating unit can be synthesized by reacting a bisaminophenol compound represented by the Formula (18), wherein $X_1$ is a group selected from groups represented by the Formula (2-1), (2-2) and (3) and a dicarboxylic acid compound represented by the following Formula (20), wherein $Y_2$ is a group selected from groups represented by the Formula (11-1), (11-2), (12-1) and (12-2).

Formula (20):

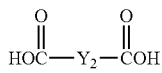

For example, there may be a method of reacting the bisaminophenol compound having the diamondoid structure and the dicarboxylic having the diamondoid structure by the acid chloride method.

Instead of the acid chloride method, the active ester method may be used. In the active ester method, for example, benzotriazyl ester is produced by reacting the dicarboxylic acid chloride and 1-hydroxybenzotriazole, and the ester is reacted with the bisaminophenol at room temperature or higher similarly as aforementioned.

5. Benzoxazole Resin Precursor Having a Fifth Repeating Unit

The benzoxazole resin precursor of the present invention has the repeating unit represented by the Formula (13). Further, the benzoxazole resin precursor having the third repeating unit and the fourth repeating unit may preferably have a fifth repeating unit represented by the Formula (13), but may not be particularly limited.

A number of repeating unit (m) of the fifth repeating unit may not be particularly limited but preferably an integer from 2 to 1,000, more preferably from 5 to 600, and most preferable from 10 to 80. If the number of repeating unit is within the above range, workability is excellent when the benzoxazole resin precursor is dissolved in a solvent.

The third repeating unit, the fourth repeating unit and the fifth repeating unit may constitute the benzoxazole resin precursor in the state of a copolymer or a mere mixture. Further, in the case of the copolymer, the third repeating unit and/or the fourth repeating unit and the fifth unit may be a random copolymer, an alternating copolymer or a block copolymer.

5-1. Production of the Benzoxazole Resin Precursor Having the Fifth Repeating Unit As a method of obtaining the benzoxazole resin precursor having the fifth repeating unit, the benzoxazole resin precursor having the fifth repeating unit can be synthesized by reacting a bisaminophenol compound represented by the following Formula (21), wherein $X_3$ is a group selected from groups represented by the Formula (14) and (15) and a dicarboxylic acid represented by the Formula (20), wherein $Y_2$ is a group selected from groups represented by the Formula (11-1), (11-2), (12-1) and (12-2)

Formula (21):

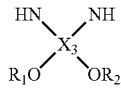

where in, in the Formula (21), each of $R_1$ and $R_2$ is independently a hydrogen atom or an organic group; the organic group is an alkyl group having 1 to 20 carbons such as a methyl group, an ethyl group, a n-propyl group, an isopropyl group, a n-butyl group, a t-butyl group, an isobutyl group, a sec-butyl group or the like, an alkyl group having 1 to 20 carbons via a C(=O)—O— bond or a group having a vinyl group having 1 to 20 carbons via —(O=)C—.

For example, there may be a method of reacting the bisaminophenol compound not having the diamondoid structure and/or the bisaminophenol compound having a functional group other than the diamondoid structure with the dicarboxylic acid having the diamondoid structure by the acid chloride method. A combination of the above can be selected according to characteristics to be obtained, for example, permittivity. As a resin film, a resin film having pores is preferable in order to obtain lower permittivity. In that case, a combination of the bisaminophenol compound having a functional group other than the diamondoid structure and the dicarboxylic acid having the diamondoid structure is more preferable.

Instead of the acid chloride method, the active ester method may be used. In the active ester method, for example, benzotriazyl ester is produced by reacting the dicarboxylic acid chloride and 1-hydroxybenzotriazole, and the ester is reacted with the bisaminophenol at room temperature or higher similarly as aforementioned.

6. Benzoxazole Resin Precursor Having a Sixth Repeating Unit

Further, the benzoxazole resin precursor having the third repeating unit, the fourth repeating unit and the fifth repeating unit may preferably have a sixth repeating unit represented by the Formula (17), but may not be particularly limited.

A number of repeating unit (n) of the sixth repeating unit may not be particularly limited, but preferably an integer from 2 to 1,000, and more preferably from 5 to 100. If the number of repeating unit is within the above range, workability is excellent when the benzoxazole resin precursor is dissolved in a solvent.

The third repeating unit, the fourth repeating unit and/or the fifth repeating unit, and the sixth repeating unit may constitute the benzoxazole resin precursor in the state of a copolymer or a mere mixture. Further, in the case of the copolymer, the third repeating unit, the fourth repeating unit and/or the fifth repeating unit, and the sixth repeating unit may a random copolymer, an alternating copolymer or a block copolymer.

6-1. Production of the Benzoxazole Resin Precursor Having the Sixth Repeating Unit As a method of obtaining the benzoxazole resin precursor having the sixth repeating unit, the benzoxazole resin precursor having the sixth repeating unit can be synthesized by reacting a bisaminophenol compound represented by the Formula (21), wherein $X_3$ is a group selected from groups represented by the Formula (14) and (15) and a dicarboxylic acid compound represented by the Formula (19), wherein $Y_1$ is a group selected from groups represented by the Formula (4), (6-1), (6-2), (7-1), (7-2), (8) and (9). For example, there may be a method of reacting the bisaminophenol compound not having a functional group, the dicarboxylic acid not having a functional group and/or the dicarboxylic acid compound having a functional group other than the diamondoid structure, or reacting the bisaminophenol compound having a functional group other than the diamondoid structure, the dicarboxylic acid not having a functional group and/or the dicarboxylic acid compound having a functional group other than the diamondoid structure by the acid chloride method.

Instead of the acid chloride method, the active ester method may be used. In the active ester method, for example, benzotriazyl ester is produced by reacting the dicarboxylic acid chloride and 1-hydroxybenzotriazole, and the ester is reacted with the bisaminophenol at room temperature or higher similarly as aforementioned.

Also, in accordance with molar ratio of reacting bisaminophenol and dicarboxylic acid, a terminal end may be reacted with a monofunctional carboxylic acid derivative, acid anhydride monofunctional o-aminophenol or an amine derivative to seal the terminal end.

7. Benzoxazole Resin Precursor Composition

In the present invention, in the case of mixing the benzoxazole resin precursor having a third repeating unit represented by the Formula (1), the benzoxazole resin precursor having a fourth repeating unit represented by the Formula (10), the benzoxazole resin precursor having a fifth repeating unit represented by the Formula (13) and the benzoxazole resin precursor having a sixth repeating unit represented by the Formula (17) respectively to be used for a benzoxazole resin precursor composition, a composition having the benzoxazole resin precursor having a third repeating unit represented by the Formula (1), the benzoxazole resin precursor having a fourth repeating unit represented by the Formula (10) and the benzoxazole resin precursor having a fifth repeating unit represented in the Formula (13) as essential components and containing two or more kinds selected from the benzoxazole resin precursor having a third repeating unit, the benzoxazole resin precursor having a fourth repeating unit, the benzoxazole resin precursor having a fifth repeating unit and the benzoxazole resin precursor having a six repeating unit represented by the Formula (17) is preferable in order to obtain a resin with excellent heat resistance and low-permittivity and a resin film to be obtained therefrom, which are the objects of the present invention. Also, the fourth repeating unit is preferable in order to impart high elastic modulus and the sixth repeating unit is preferable impart adhesion. Both can be used to the extent that the objective characteristics of the present invention are not deteriorated.

8. Polybenzoxazole Resin

Hereinafter, a polybenzoxazole resin will be described.

In the present invention, a polybenzoxazole resin is obtained by subjecting the benzoxazole precursor to a dehydration and ring-closure reaction. The reaction can be a condensation reaction or a cross-linking reaction.

For example, the polybenzoxazole resin can be obtained by a method of reacting the benzoxazole resin precursor at 150 to 425° C. for five minutes to twenty-four hours, a method of irradiating with UV-ray, a method of irradiating with an electron beam or the like.

In the case of using the polybenzoxazole resin as an interlayer insulating film described below, a resultant of reacting a carboxyl group, an amino group or a hydroxyl group of the benzoxazole resin precursor and a reactive oligomer of pyrolytic having a reactive substituent can be used. Also, an organic compound which decompose or dispersed at high temperature can be used to react or blend. Thereby, a nanofoam can be easily formed when an interlayer insulating film is formed by the polybenzoxazole resin.

As the substituent capable of reacting with a carboxyl group, there may be, for example, an amino group, a hydroxyl group, an isocyanate group or the like.

Also, as the substituent capable of reacting with an amino group, there may be a carboxyl group, an isocyanate group, a glycidyl group, a maleic anhydride group, a maleimide group, an acid anhydride group, an acrylate group or the like.

As the substituent capable of reacting with a hydroxyl group, there may be an acid anhydride group, a carboxyl group, a glycidyl group or the like.

As a base resin of the reactive oligomer, there may be, for example, polyoxyalkylene, polymethylmethacrylate, polyα-methylstyrene, polystyrene, polyester, polyether ester, polycaprolactone, polyurethane, polycarbonate or the like. Among them, the polyoxyalkylene or the polycarbonate is preferable. Thereby, a fine nanofoam can be formed.

A number average molecular weight of the reactive oligomer may not be particularly limited but preferably from 100 to 40,000, and more preferably from 200 to 20,000. If the number average molecular weight is within the above range, the nanofoam is less likely to aggregate and a fine uniform nanofoam can be formed.

A glass transition temperature of the polybenzoxazole resin may not be particularly limited but 400° C. or more is preferable, 420° C. or more is more preferable, and from 450 to 500° C. is most preferable. If the glass transition temperature is within the above range, linear expansion coefficient of a resin film obtained from the benzoxazole resin precursor can be decreased.

9. Cross-Linking Agent

Next, a cross-linking agent will be described.

A cross-linking agent of the present invention may be a cross-linking agent containing two or more groups capable of causing a cross linking reaction in a molecule, for example, there may be a compound having from two to ten cross-linking groups in a molecule.

As the cross-linking group, there may be a functional group having an acethylene bond, functional having a vinyl bond, a biphenylene group, a cyanato group, a maleimide group, a nadiimide group, a vinyl group, a cyclopentadienyl group or the like. Among them, the functional group having an acethylene bond is preferable. Specifically, as the functional group having an acethylene bond, there may be an ethynyl group; an aromatic substituted ethynyl group such as a phenylethynyl group, a naphthylethynyl group, an anthrylethynyl group, a 3-phenyl-2-propynyl group, a 4-phenyl-3-butynyl group, a 6-phenyl-5-hexynyl group, a 8-phenyl-7-octynyl group or the like; a nitrogen-containing aromatic substituted ethynyl group such as a quinolylethynyl group, a quinoxalylethynyl group or the like; a chain aliphatic substituted ethynyl group including an alkylethynyl group such as a 1-propynyl group, a 1-butynyl group, a 2-butynyl group, a 1-hexynyl group, a 2-hexynyl group, a 3-hexynyl group, a 4-hexynyl group or the like; a cyclic aliphatic substituted ethynyl group such as a cyclohexylethynyl group, a bicyclo[2,2,1]heptylethynyl group, an adamantylethynyl group, a 3-cyclohexyl-2-propynyl group, a 4-cyclohexyl-3-butynyl group, a 6-cyclohexyl-5-hexynyl group, a 8-cyclohexyl-7-octynyl group or the like; an alkynyloxy group such as a propargylether group, a 2-propynyloxy group, a 2-butynyloxy group, a 3-butynyloxy group, a 2-hexynyloxy group, a 3-hexynyloxy group, a 4-hexynyloxy group, a 5-hexynyloxy group, a 2-heptynyloxy group, a 3-heptynyloxy group, a 4-heptynyloxy group, a 5-heptynyloxy group, a 6-heptynyloxy group or the like; a butadiinyl group; or a substituted diinyl group such as a phenylbutadiinyl group, a 1,3-pentadiinyl group, a 4-cyclohexyl-1,3-butadiinyl group, a 2,4-pentadiinyloxy group or the like.

A hydrogen atom in the group containing an acethylene bond may be substituted with a fluorine atom, a methyl group, a methoxy group, a trifluoromethyl group or the like. Among them, a cross-linking functional group selected from an ethynyl group, a phenylethynyl group, a (4-methylphenyl)ethynyl group, a naphthylethynyl group, a phenylbutadiinyl group, a t-butylethynyl group, an adamantylethynyl group and 3,5-dimethyladamantylethynyl group is preferable. Plural functional groups in a molecule may be the same or different from each other.

As a method of a crosslinking reaction, there may be a heating method or a method of radiating an active energy beam such as microwave, visible light, UV-ray, X-ray or the like or active radiation such as electron beam or the like.

In the present invention, the cross-linking group can cause the cross-linking reaction by the method including the heating method or a method of radiating an active energy beam such as microwave, visible light, UV-ray, X-ray or the like or active radiation such as electron beam or the like. Thereby, a cross-linking density of a polybenzoxazole resin to be obtained by cross-linking a benzoxazole resin precursor having the crosslinking group can be improved and also a heat resistance thereof can be improved.

Further, in the case of forming a nanofoam with the use of the polybenzoxazole resin to obtain an interlayer insulating film, when a cross-linking density of the polybenzoxazole resin is improved, the nanofoam can maintain its form without causing aggregation or the like. Thereby, a permittivity of the interlayer insulating film can be decreased.

As a specific example of such a crosslinking agent, there may be a cross-linking agent having a structure represented by the following Formula (22):

$$A\text{-}(B)_p \qquad \text{Formula (22)}$$

wherein, "A" is an organic group; "B" is a cross-linking group of the crosslinking agent; and "p" is an integer of two or more, preferably an integer from 2 to 10.

As the organic group of "A" in the Formula (22), there may be an aromatic group such as a binaphthalene group, a naphthalene group, a fluorene group, a phenyl group, a diphenylether group, a biphenyl group, a diphenylsulfone group, a diphenylpropane group, a diphenylhexafluoropropane group or the like; or a group having a polycyclic framework structure such as an adamantyl group, a 3,5-diphenyladamantyl group, a 3,5,7-triphenyladamantyl group, a 3,5,7,9-tetraphenyladamantyl group, a 1,1'-biadamantyl group, a 1,2'-biadamantyl group, a 2,2'-biadamantyl group, a 3,3'-diphenyl-1,1'-biadamantyl group, a 3,3',5,5'-tetraphenyl-1,1'-biadamantyl group, a 3,3',5,5',7,7'-hexaphenyl-1,1'-biadamantyl group or the like, but may not be limited thereto. A hydrogen atom of the organic group may be substituted with a fluorine atom, a methyl group, a methoxy group, a trifluoromethyl group or the like.

For example, there may be an organic group having a structure represented by the following Formula (23) to (25):

Formula (23):

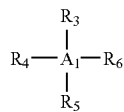

Formula (24):

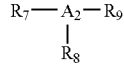

Formula (25):

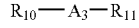

wherein, each of $A_1$, $A_2$ and $A_3$ is an organic group; each of $R_3$ to $R_{11}$ is an organic group; and at least two groups of $R_3$ to $R_6$, at least two groups of $R_7$ to $R_9$, $R_{10}$ and $R_{11}$ are crosslinking groups.

As the organic group of $A_1$ to $A_3$, there may be a binaphthalene group, a naphthalene group, a fluorene group, a phenyl group, a diphenylether group, a biphenyl group, a diphenylsulfone group, a diphenylpropane group, a diphenylhexafluoropropane group or the like, but may not be limited thereto. The group may have a diamondoid structure.

As the organic group of $R_3$ to $R_{11}$, there may be an ethynyl group, a phenylethynyl group, a naphthylethynyl group, an anthrylethynyl group, a quinolylethynyl group, a quinoxalylethynyl group, an alkylethynyl group, a propargylether group, a phenylbutadiinyl group, a biphenylene group, a cyanato group, a maleimide group, a nadiimide group, a vinyl group, a cyclopentadienyl group or the like, but may not be limited thereto.

In the present invention, a resin having a net-like structure formed by reacting crosslinking agents selected from cross-linking agents of difunctional or more, preferably trifunctional or more.

10. A Resin Composition

A resin composition of the present invention can be obtained by mixing above-mentioned components. A ratio of the benzoxazole resin precursor and the cross-linking agent may be preferably 1 to 100 parts by weight, more preferably 5 to 50 parts by weight of cross-linking agent with respect to 100 parts by weight of the benzoxazole resin precursor.

As the resin composition of the present invention, a benzoxazole resin precursor resin composition of a benzoxazole resin precursor having a functional group capable of crosslinking with the cross-linking agent and a benzoxazole resin precursor not having such a functional group can be used. Further, a resin comprising the cross-linking agent of trifunctional or more may be mixed.

In the resin composition of the present invention, if necessary, an additive including a surfactant, a coupling agent such as a silane coupling agent or the like, a radical initiator generating oxygen radical or sulfur radical by heating, or a catalyst such as disulfides or the like may be used besides the above-mentioned components.

When at least one of $R_1$ and $R_2$ in the Formula (1), (10), (13), (17) or (20) of the benzoxazole resin precursor and the diaminophenol compound has a hydrogen atom, a naphthoquinonediazide compound can be used to have a positive photosensitive resin composition. When at least one of $R_1$ and $R_2$ has a group containing a photo-crosslinking group such as a methacryloyl group, a photoinitiator can be used to have a negative photosensitive resin composition.

Also, when at least one of $R_1$ and $R_2$ has an alkyl group of 1 to 20 carbons or an alkyl group of 1 to 20 carbons bonded via a —C(=O)—O— bond, solubility to varnish can be improved.

11. Varnish

It is preferable to use the resin composition as a varnish upon producing a resin film or the like by being dissolved or dispersed in an organic solvent capable of dissolving or dispersing the resin composition. As the organic solvent, there may be N-methyl-2-pyrrolidone, γ-butyrolactone, N,N-dimethylacetamide, dimethyl sulfoxide, diethylene glycol dimethyl ether, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol-3-monomethyl ether, methyl pyruvate, ethyl pyruvate, methyl-3-methoxypropionate, methyl ethyl ketone, methyl isobutyl ketone, cyclopentanone, cyclohexanone, tetrahydrofuran, toluene, xylene, mesitylene or the like. Other organic solvents capable of dissolving or dispersing the resin composition of the present invention may be used. The organic solvent may be used alone or in combination of two or more kinds.

A ratio of the resin composition to the organic solvent may not be particularly limited if an amount is capable of dissolving or dispersing the resin composition completely. The amount may be adjusted according to the purpose of the resin composition. Generally, a solvent content in a varnish is preferably from 70 to 95 wt %.

12. Forming of Resin

The resin composition or varnish of the present invention can be formed as a molded article by applying a known method such as an injection molding method, a transfer-molding method, a compression molding method, an extrusion molding method, a cast molding method, a coating method or the like. An embodiment of the molded article may be of any kinds such as an embodiment in which the resin composition is formed a an intermediate molded article before being a final molded article or a final molded article. For example, there may be an intermediate molded article in which a resin film is formed but before a cross-linking reaction or a final molded article in which the intermediate molded article is cured. In the present invention, the final molded article can be obtained by a cross-linking reaction between the benzoxazole resin precursor or the resin thereof having a cross-linking group with a cross-linking agent.

As a method of the cross-linking reaction, there may be a heating method or a method of radiating an active energy beam such as microwave, visible light, UV-ray, X-ray or the lie, or active radiation such as an electron beam or the like.

13. Resin Film

Hereinafter, a resin film will be described.

A resin film of the present invention comprises the resin composition. Thereby, adhesion and dimensional stability can be excellent. As the resin film, for example, there may be an interlayer insulation film or a surface protection film for a semiconductor device, an interlayer insulation film for a multilayered circuit, a cover coat for a flexible copper clad plate, a solder resist film, a liquid crystal alignment layer, an etching protection film (etching stopper) an adhesive or the like. Among them, the resin film may be suitably used for the interlayer insulation film or a surface protection film for a semiconductor device or the etching protection film.

In the case that the resin film is the interlayer insulating film for a semiconductor device, for example, it is preferable that the interlayer insulating film has a pore (nanofoam) if lower permittivity is desired, but may not be limited thereto.

An average pore diameter of the nanofoam may not be particularly limited, but preferably 10 nm or less, more preferably 6 nm or less, and most preferably 3 nm or less. If the average pore diameter is within the above range, compatibility in the process is high and permittivity property upon pattern forming is excellent.

As a measuring method of the average pore diameter, there may be a small-angle X-ray scattering method, a positron annihilation method, a gas adsorption method, an elipsometric porosimetry method or the like.

In the case that the resin film is the interlayer insulating film for a semiconductor device having a nanofoam formed, it is preferable to use a polybenzoxazole resin precursor obtained by reacting the carboxyl group, amino group or hydroxyl group of the benzoxazole resin precursor with a reactive oligomer having a substituent capable of reacting therewith as the polybenzoxazole resin precursor of the resin composition. Thereby, a nanofoam can be formed easily in an interlayer insulating film. Also, a nanofoam can be formed by reacting or blending an organic compound which decomposes or scatters at high temperature.

Also, a blowing agent (porogen, pore generator) which forms a nanofoam may be added to the resin composition.

As the blowing agent, there may be, for example, carbon nanotube or fullerene having a hollow structure, polyhedral oligomeric silsesquioxane, cyclodextrin, an organic compound with high melting point, an organic compound with low volatilization property, a surfactant, an azobis compound, an organic oxide, a dendrimer, a hyperbranched polymer or the like. Among them, the surfactant, the hyperbranched polymer, the organic compound with high melting point or the organic compound with low volatilization property is preferable. Thereby, the blowing agent can be homogeneously dispersed in the polybenzoxazole resin. Following homogeneous dispersion of the blowing agent, further by heating and extraction treatment, a fine nanofoam can be obtained.

A porosity of the interlayer insulating film may not be particularly limited, but 5 to 70% is preferable, more preferably 7 to 50%. If the porosity is less than the lower limit, sufficiently low permittivity may not be exhibited, and if the porosity is more than the upper limit, mechanical strength of the film may be lowered to decline elastic modulus and adhesiveness.

A thickness of the interlayer insulating film may not be particularly limited, but preferably from 0.01 to 20 µm, more preferably from 0.05 to 10 µm, and most preferably from 0.1 to 0.7 µm. If the thickness is within the above range, process compatibility is excellent.

In the case of obtaining the interlayer insulating film, for example, the resin composition containing the benzoxazole resin precursor is dissolved in an organic solvent such as N-methyl-2-pyrolidone or the like to prepare a varnish. The varnish obtained is applied on to an appropriate substrate such as a silicon wafer, a ceramic substrate or the like. As a method for applying the varnish, there may be spin coating by means of a spinner, spray coating by means of a spray coater, dipping, printing, roll coating and so on. The coating layer is then subject to drying and heating. After removal of solvent, the precursors are each subject to a condensation reaction and a cross-linking reaction to be a polybenzoxazole resin, thus providing an interlayer insulation film constituted by a resin composition comprising thereof. If a resin changed from the benzoxazole resin precursor is dissoluble to an organic solvent, after the benzoxazole resin precursor is preliminarily changed to a benzoxazole resin, a varnish therefrom can be prepared. Then, an interlayer insulation film can be produced by the same method. At this time, since a process for changing a benzoxazole resin precursor to a resin is not necessary during heating treatment of the coating layer, heating time can be reduced.

Further, in the case of forming a nanofoam, an interlayer insulating film having pores can be produced by further heating the interlayer insulating film.

In the case of using the resin film as the protection film for a semiconductor device, similarly as the interlayer insulating film, the benzoxazole resin precursor is dissolved in an organic solvent such as carbonated propylene, diacetone alcohol, N-methyl-2-pyrolidone or the like to prepare a varnish. The varnish obtained is applied on to an appropriate substrate such as a silicon wafer, a ceramic substrate or the like. As a method for applying the varnish, there may be spin coating by means of a spinner, spray coating by means of a spray coater, dipping, printing, roll coating and so on. The coating layer is then subject to drying and heating. After removal of solvent, the precursors are each subject to a condensation reaction and a cross-linking reaction to be a polybenzoxazole resin, thus providing the protection film constituted by a resin composition comprising thereof.

A thickness of the protection film may not be particularly limited, but preferably from 0.05 to 70 µm, and more preferably from 0.1 to 50 µm. If the thickness is within the above range, protection property and workability of a semiconductor element are particularly excellent.

14. Semiconductor Device

Next, a semiconductor device will be explained based on preferred embodiments.

FIG. 1 is a sectional view schematically showing an example of a semiconductor device of the present invention.

A semiconductor device 100 comprises a semiconductor substrate 1 provided with an element, a silicon nitride layer 2 provided on the semiconductor substrate 1 (upper side of FIG. 1), an interlayer insulating film 3 provided on the silicon nitride layer 2 and a copper wiring layer 4 covered with a barrier layer 6.

The interlayer insulating film 3 is provided with a concave corresponding to a wiring pattern, and the copper wiring layer 4 is provided therein.

The interlayer insulating film 3 has a nanofoam (pore) (not shown).

A reformed processing layer 5 is provided between the interlayer insulating film 3 and the copper wiring layer 4.

A hard mask layer 7 is formed on the upper side of the interlayer insulating film 3, which is a surface opposite to the silicon nitride layer 2.

In the embodiment of the present invention, a nanofoam is formed in the interlayer insulating film 3, but the present invention may not be limited thereto.

Also, in the embodiment of the present invention, the semiconductor device 100 using the interlayer insulating film 3 is described, however, the present invention may not be limited thereto.

By using the interlayer insulating film, the semiconductor device of the present invention is excellent in dimensional accuracy and provides sufficient insulation, thus, connection reliability is excellent.

The interlayer insulating film is excellent in adhesion to a wiring layer, thus, connection reliability of a semiconductor device can be further improved.

Also, the interlayer insulating film has excellent permittivity property, thus, signal loss of a semiconductor device can be reduced.

Also, the interlayer insulating film has excellent permittivity property, thus, wiring delay can be reduced.

EXAMPLES

Hereinafter, the present invention will be explained in detail by way of examples and comparative examples, but the present invention may not be limited thereto. The following methods are used to identify obtained compounds:

1. Nuclear magnetic resonance spectrum analysis ($^1$H-NMR, $^{13}$C($^1$H)-NMR), wherein JNM-GSX400 (manufactured by: JEOL Ltd.) was used; $^1$H-NMR was measured at resonant frequency of 400 MHz and $^{13}$C (1H)—NMR was measured at resonant frequency of 100 MHz respectively; and a solvent for measurement was a deuterated solvent such as deuterated dimethyl sulfoxide DMSO-$d_6$ or CDCl$_3$;
2. Infrared Spectroscopic analysis (IR), wherein 1640 infrared Spectroscopic analyzer (manufactured by: PERKIN ELMER) was used to measure by the KBr pellet method; and
3. Mass spectrometry analysis (MS), wherein JMS-700 mass spectrometer (manufactured by: JEOL Ltd.) was used to measure by the field desorption (FD) method.

Example 1

1) Synthesis of Bisaminophenol Compound Having a Diamondoid Structure 1,3-bis-(3-amino-4-hydroxy-phenyl)-adamantane was obtained by the following three steps.

1-1) 1,3-bis(4-hydroxy-phenyl)-adamantane (synthesis of a first intermediate)

A 500 mL five-neck flask equipped with a thermometer, an agitator, a reflux tube, a nitrogen introduction tube and an exhaust tube to a trap containing 30% aqueous sodium hydroxide was cooled in an ice bath. 6.47 g (0.022 mol) of 1,3-dibromo-adamantane, 200 ml of phenol and 2.6 g (0.01 mol) of aluminum tribromide were added to the flask and agitated at 0° C. for 6 hours. The mixture was heated to react at 60° C. for 4 hours. A reactant was poured into a 2,000 L of acid iced water. After the ice was melted, an organic layer was filtered, washed by pure water and saturated sodium chloride aqueous solution, and added into methanol so as to separate a product. The obtained product was dried under reduced pressure, thus obtaining 3.5 g of the product.

The IR analysis showed that an absorption of hydroxyl group was 3,550 to 3,200 cm$^{-1}$, and the mass spectrometry analysis showed that a molecular weight was 320. The product was referred to as a first intermediate.

1-2) 1,3-bis(3-nitro-4-hydroxyphenyl)-adamantane (synthesis of a second intermediate)

200 mL (0.64 mol) of 20% nitric acid aqueous solution was charged in a 500 mL four-neck flask equipped with a thermometer, an agitator and a reflux tube. 35 g (0.11 mol) of 1,3-bis(4-hydroxy-phenyl)-adamantane obtained by repeating the above-mentioned steps was added gradually while heavily agitating and keeping the temperature inside of the flask at 20 to 30° C. After the addition and no increase in temperature observed, a reaction was continued for another one hour. Then, the mixture was charged in about 500 mL of cold water and filtered to separate a crude product. The crude product was washed with pure water, dried and recrystallized with hot ethanol.

The recrystallized product obtained was dried under reduced pressure, thus obtained a product of 30

The IR analysis showed that an absorption of nitro group was around 1,500 cm$^{-1}$ and around 1,370 cm$^{-1}$, and the mass spectrometry analysis showed that a molecular weight was 410. The product was referred to as a second intermediate.

1-3) Synthesis of 1,3-bis(3-amino-4-hydroxy-phenyl)adamantane 20 mL of concentrated hydrochloric acid and 30 mL of ethanol were charged in a 200 mL four-neck flask equipped with a thermometer, a Dimroth condenser and a nitrogen introduction tube, and 8.6 g (0.021 mol) of the second intermediate was added while agitating and then floated. 20 mL of ethanol having 15 g of tin chloride (II) dihydrate dissolved was added into the mixture at 30° C. or less for an hour. After 12 hours, separated crystals were filtered and recrystallized with an ethanol-hydrochloric acid mixture. The obtained hydrochloride was hydrolyzed with water, recrystallized with ethanol, and then dried under reduced pressure. Thus, 6.7 g of product was obtained.

The NMR analysis showed that a proton absorption of OH group was 8.8 to 9.5 ppm and a proton absorption of NH$_2$ group was 4 to 4.5 ppm, and the mass spectrometry analysis showed that a molecular weight was 350. The product was referred to as 1,3-bis-(3-amino-4-hydroxy-phenyl)adamantane, a bisaminophenol compound having a diamondoid structure.

2) Dicarboxylic Acid Having a Functional Group

A dicarboxylic acid (5-phenylethynylisophthalic acid dichloride) having a functional group was obtained by the following steps.

2-1) Synthesis of 5-bromoisophthalic acid (first intermediate)

99.18 g (0.55 mol) of 5-aminoisophthalic acid, 165 mL of 48 weight % hydrobromic acid and 150 mL of distilled water were charged in a 1 L four-neck flask equipped with a thermometer, an agitator and a dropping funnel, and then agitated. The flask was cooled to 5° C. or below, and 525 mL of distilled water containing 39.4 g (0.57 mol) of sodium nitrite was added dropwise for an hour, thus obtaining diazonium aqueous solution. 94.25 g (0.66 mol) of cuprous bromide and 45 mL of 48 weight % hydrobromic acid were charged in a 3 L four-neck flask equipped with a thermometer, a Dimroth condenser, a dropping funnel and an agitator, and agitated.

The flask was cooled to 0° C. or below and the diazonium aqueous solution was added dropwise for 2 hours, and then agitated at room temperature for 30 minutes followed by reflux for 30 minutes. After cooling, the precipitate was filtered to separate and washed two times with 2 L of distilled water. Obtained white solid was dried at 50° C. for 2 days under reduced pressure, thus obtaining 117 g of crude product, which was used for the next reaction without purification.

2-2) Synthesis of dimethyl 5-bromoisophthalate (second intermediate)

110 g of the first intermediate (5-bromoisophthalic acid), 500 mL of methanol and 10 g of concentrated sulfuric acid were charged in a 500 mL flask equipped with an agitator and a Dimroth condenser, and refluxed for 6 hours. After cooling, the mixture was added dropwise to 1 L of distilled water, and neutralized with 5 weight % sodium hydrogen carbonate solution. The precipitate was filtered to separate. After two times of washing with 2 L of distilled water, obtained white solid was dried at 50° C. for 2 days under reduced pressure. Thus, 109 g (0.4 mol) of dimethyl 5-bromoisophthalate was obtained (the yield was 89%).

2-3) Synthesis of dimethyl 5-phenylethynylisophthalate (third intermediate)

In a 1 L four-neck flask equipped with a thermometer, a Dimroth condenser, a nitrogen introduction tube and an agitator, 99.7 g (0.365 mol) of the second intermediate (dimethyl 5-bromoisophthalate), 1.1 g (0.00419 mol) of triphenylphosphine, 0.275 g (0.00144 mol) of copper iodide and 41.0 g (0.401 mol) of phenylacetylene were charged and nitrogen was passed into the flask. Then, 375 mL of dehydrated triethylamine and 200 mL of dehydrated pyridine were added therein and the mixture was agitated and dissolved. After passing the nitrogen for one hour, 0.3 g (0.000427 mol) of dichlorobis(triphenyl phosphine)palladium was quickly added and the mixture was heated and refluxed in an oil bath for one hour. Then, triethylamine and pyridine were removed under reduced pressure to obtain a brown viscous solution. The solution was added to 500 mL of water and filtered to separate a solid. The solid was washed with 500 mL of water, 500 mL of 5 mol/L hydrochloric acid and 500 mL of water each two times and dried under reduced pressure at 50° C. Thus, 80.6 g of dimethyl 5-phenylethynylisophthalate was obtained (the yield was 75%).

2-4) Synthesis of 5-phenylethynylisophthalic acid dipotassium salt (fourth intermediate)

In a 5 L four-neck flask equipped with a thermometer, a Dimroth condenser and an agitator, 3 L of n-butanol and 180 g (2.72 mol) of potassium hydrate (85%) were charged. The mixture was heated and refluxed to be dissolved. After adding 80 g (0.272 mol) of the third intermediate (dimethyl 5-phenylethynylisophthalate) therein, the mixture was heated and refluxed for 30 minutes. Next, it was cooled in an ice bath and filtered to obtain precipitated crystal. The crystal was washed with 1 L of ethanol two times followed by drying under reduced pressure at 60° C. Thus, 90.35 g of 5-phenylethynylisophthalic acid dipotassium salt was obtained.

2-5) Synthesis of 5-phenylethynylisophthalic acid dichloride

In a 2 L four-neck flask equipped with a thermometer, a Dimroth condenser and an agitator, 82.1 g (0.24 mol) of 5-phenylethynylisophthalic acid dipotassium salt and 400 mL of 1,2-dichloroethane were charged and cooled to 0° C. 391 g (4.5 mol) of thionyl chloride was added dropwise at 5° C. or below for one hour. Then, 4 mL of dimethylformamide and 4 g of hydroquinone were added therein and agitated at 45 to 50° C. for three hours. After cooling, crystal generated was removed by filtration and washed with 150 mL of chloroform. Filtrate and washing solution were condensed together under reduced pressure at 40° C. or less, and the obtained residue was subject to two times of extraction and filtration with 200 mL of diethyl ether. Diethyl ether was removed from the extract under reduced pressure to obtain a semisolid crude product. The semisolid crude product was washed with dried n-hexane and recrystallized with diethyl ether, thus obtaining 13.8 g of 5-phenylethynylisophthalic acid dichloride, which is dicarboxylic acid having a functional group (the yield was 19%)

3) Production of Benzoxazole Resin Precursor 31.5 g (0.09 mol) of 1,3-bis(3-amino-4-hydroxy-phenyl) adamantane was dissolved in 200 g of dried N-methyl-2-pyrolidone under nitrogen flow followed by the addition of 17.4 g (0.22 mol) of pyridine. The mixture was cooled to −15° C. and 30.3 g (0.10 mol) of 5-phenylethynylisophthalic acid dichloride was gradually added. Then, the mixture was agitated at −15° C. for one hour, returned to room temperature, and agitated for five hours at room temperature. And then, a reaction solution was added to 4 L of distilled water in small droplets followed by collecting and drying precipitate, thus obtained a benzoxazole resin precursor having a diamondoid structure.

Number average molecular weight (Mn) of the obtained benzoxazole resin precursor, which was measured by means of a gel permeation chromatography (manufactured by: Tosoh Corporation) using polystyrene as the standard, was 20,000.

4) Synthesis of external cross-linking agent, 9,9-bis{3-(4-phenylethynylbenzoic acid amide)-4-hydroxyphenyl}fluorene 37.8 g (0.1 mol) of 9,9-bis(3-amino-4-hydroxyphenyl) fluorene was dissolved in 200 g of dehydrated N-methyl-2-pyrolidone under nitrogen flow and cooled to −15° C. followed by gradually adding 53.0 g (0.22 mol) of 4-phenylethynylbenzoic acid chloride while agitating. After the agitation for 1 hour, the mixture was cooled to room temperature and agitated at room temperature for 5 hours. Next, the reaction solution was added dropwise to 4 L of distilled water followed by collecting precipitate. The precipitate was washed by methanol and dried by vacuum drier for 24 hours. Product obtained was measured by means of $^1$H-NMR, IR and MS, and synthesis of 9,9-bis{3-(4-phenylethynylbenzoic acid amide)-4-hydroxyphenyl}fluorene was confirmed.

5) Production of Resin Film 10 g of the benzoxazole resin precursor and 2 g of the external cross-linking agent were dissolved in 90 g of N-methyl-2-pyrrolidone and filtered by means of a Teflon (trade name) filter to obtain a varnish for coating. The varnish was applied on a silicon wafer by means of a spin coater followed by heating in an oven under a nitrogen atmosphere at 90° C. for one minute, at 250° C. for one hour and 330 DC for one hour. Thus, a resin film was obtained.

Example 2

1) Production of Resin Film

A reaction was performed similarly as in Example 1, 3) except that 31.5 g (0.09 mol) of 1,3-bis(3-amino-4-hydroxyphenyl)adamantane was altered to 48.7 g (0.09 mol) of 3,3'-bis(3-amino-4-hydroxy-phenyl)-5,5',7,7'-tetramethyl-1,1'-biadamantane, and 30.3 g (0.10 mol) of 5-phenylethynylisophthalic acid dichloride was altered to 45.1 g (0.10 mol) of 3,3'-(5,5',7,7'-tetramethyl-1,1'-biadamantane)-dicarboxylic acid dichloride, thus obtained a benzoxazole resin precursor. Another reaction was performed similarly as in Example 1, 5) except that 10 g of the benzoxazole resin precursor was used. Thus, a resin film was obtained.

Number average molecular weight (Mn) of the obtained benzoxazole resin precursor, which was measured by means of a gel permeation chromatography (manufactured by: Tosoh Corporation) using polystyrene as the standard, was 16,000.

Example 3

1) Production of Resin Film

A reaction was performed similarly as in Example 1, 3) except that 31.5 g (0.09 mol) of 1,3-bis(3-amino-4-hydroxyphenyl)adamantane was altered to 77.9 g of 3,3'-bis[3-amino-4-hydroxy-5-(1-(3,5-dimethyladamantyl))phenyl]-5,5',7,7'-tetramethyl-1,1'-biadamantane, and 30.3 g (0.10 mol) of 5-phenylethynylisophthalic acid dichloride was altered to 45.1 g (0.10 mol) of 3,3'-(5,5',7,7'-tetramethyl-1,1'-biadamantane)-dicarboxylic acid dichloride, thus obtained a benzoxazole resin precursor. Another reaction was performed similarly as in Example 1, 5) except that 10 g of the benzoxazole resin precursor was used. Thus, a resin film was obtained.

Number average molecular weight (Mn) of the obtained benzoxazole resin precursor, which was measured by means of a gel permeation chromatography (manufactured by: Tosoh Corporation) using polystyrene as the standard, was 17,000.

Example 4

1) Production of Resin Film

A reaction was performed similarly as in Example 1, 3) except that 31.5 g (0.09 mol) of 1,3-bis(3-amino-4-hydroxyphenyl)adamantane was altered to 107.1 g (0.09 mol) of 3,3'-bis[3-amino-4-hydroxy-5-(3-(5,5',7,7'-tetramethyl-1,1'-biadamantyl))phenyl]-5,5',7,7'-tetramethyl-1,1'-biadamantane, and 30.3 g (0.10 mol) of 5-phenylethynylisophthalic acid dichloride was altered to 45.1 g (0.10 mol) of 3,3'-(5,5',7,7'-tetramethyl-1,1'-biadamantane)-dicarboxylic acid dichloride, thus obtained a benzoxazole resin precursor. Another reaction was performed similarly as in Example 1, 5) except that 10 g of the benzoxazole resin precursor was used. Thus, a resin film was obtained.

Number average molecular weight (Mn) of the obtained benzoxazole resin precursor, which was measured by means of a gel permeation chromatography (manufactured by: Tosoh Corporation) using polystyrene as the standard, was 15,000.

Example 5

1) Production of Resin Film

A reaction was performed similarly as in Example 1, 3) except that 31.5 g (0.09 mol) of 1,3-bis(3-amino-4-hydroxyphenyl)adamantane was altered to 60.8 g (0.09 mol) of 2,2-bis[3-amino-4-hydroxy-5-(1-(3,5-dimethyladamantyl))phenyl]adamantane, and 30.3 g (0.10 mol) of 5-phenylethynylisophthalic acid dichloride was altered to 45.1 g (0.10 mol) of 3,3'-(5,5',7,7'-tetramethyl-1,1'-biadamantane)-dicarboxylic acid dichloride, thus obtained a benzoxazole resin precursor. Another reaction was performed similarly as in Example 1, 5) except that 10 g of the benzoxazole resin precursor was used. Thus, a resin film was obtained.

Number average molecular weight (Mn) of the obtained benzoxazole resin precursor, which was measured by means of a gel permeation chromatography (manufactured by: Tosoh Corporation) using polystyrene as the standard, was 15,000.

Example 6

1) Production of Resin Film

A reaction was performed similarly as in Example 1, 3) except that 31.5 g (0.09 mol) of 1,3-bis(3-amino-4-hydroxyphenyl)adamantane was altered to 90.0 g (0.09 mol) of 2,2-bis[3-amino-4-hydroxy-5-(3-(5,5',7,7'-tetramethyl-1,1'-biadamantyl))phenyl]adamantane, and 30.3 g (0.10 mol) of 5-phenylethynylisophthalic acid dichloride was altered to 45.1 g (0.10 mol) of 3,3'-(5,5',7,7'-tetramethyl-1,1'-biadamantane)-dicarboxylic acid dichloride, thus obtained a benzoxazole resin precursor. Another reaction was performed similarly as in Example 1, 5) except that 10 g of the benzoxazole resin precursor was used. Thus, a resin film was obtained.

Number average molecular weight (Mn) of the obtained benzoxazole resin precursor, which was measured by means of a gel permeation chromatography (manufactured by: Tosoh Corporation) using polystyrene as the standard, was 15,000.

Example 7

1) Production of Resin Film

A reaction was performed similarly as in Example 1, 3) except that 31.5 g (0.09 mol) of 1,3-bis(3-amino-4-hydroxyphenyl)adamantane was altered to 34.2 g (0.09 mol) of 9,9-bis(3-amino-4-hydroxy-phenyl)fluorene, and 30.3 g (0.10 mol) of 5-phenylethynylisophthalic acid dichloride was altered to 45.1 g (0.10 mol) of 3,3'-(5,5',7,7'-tetramethyl-1,1'-biadamantane)-dicarboxylic acid dichloride, thus obtained a benzoxazole resin precursor. Another reaction was performed similarly as in Example 1, 5) except that 10 g of the benzoxazole resin precursor was used. Thus, a resin film was obtained.

Number average molecular weight (Mn) of the obtained benzoxazole resin precursor, which was measured by means of a gel permeation chromatography (manufactured by: Tosoh Corporation) using polystyrene as the standard, was 15,000.

Example 8

1) Production of Resin Film

A reaction was performed similarly as in Example 1, 3) except that 31.5 g (0.09 mol) of 1,3-bis(3-amino-4-hydroxyphenyl)adamantane was altered to 77.9 g (0.09 mol) of 3,3'-bis[3-amino-4-hydroxy-5-(1-(3,5-dimethyladamantyl))phenyl]-5,5',7,7'-tetramethyl-1,1'-biadamantane, and 30.3 g (0.10 mol) of 5-phenylethynylisophthalic acid dichloride was altered to 15.2 g (0.05 mol) of 5-phenylethynylisophthalic acid dichloride, and 22.6 g (0.05 mol) of 3,3'-(5,5',7,7'-tetramethyl-1,1'-biadamantane)-dicarboxylic acid dichloride, thus obtained a benzoxazole resin precursor. Another reaction was performed similarly as in Example 1, 5) except that 10 g of the benzoxazole resin precursor was used. Thus, a resin film was obtained.

Number average molecular weight (Mn) of the obtained benzoxazole resin precursor, which was measured by means of a gel permeation chromatography (manufactured by: Tosoh Corporation) using polystyrene as the standard, was 18,000.

Example 9

1) Production of Resin Film

A reaction was performed similarly as in Example 1, 5) except that 10 g of the benzoxazole resin precursor was altered to 5 g of the benzoxazole resin precursor obtained in Example 1, 3) and 5 g of the benzoxazole resin precursor obtained in Example 3, thus obtained a resin film.

Example 10

1) Production of Resin Film

A reaction was performed similarly as in Example 1, 5) except that 10 g of the benzoxazole resin precursor was altered to 10 g of the benzoxazole resin precursor obtained in Example 3, and 2 g of the external cross-linking agent of 9,9-bis{3-(4-phenylethynylbenzoic acid amide)-4-hydroxyphenyl}fluorene was altered to 2 g of 7,7'-bis(3,5-diethynyl-1-phenyl)-3,3',5,5'-tetramethyl-1,1'-biadamantane. Thus, a resin film was obtained.

Example 11

1) Synthesis of external cross-linking agent, 7,7'-bis(3,5-diethynylphenyl)-3,3',5,5'-tetramethyl-1,1'-biadamantane polymer 57.5 g (0.1 mol) of 7,7'-bis(3,5-diethynylphenyl)-3,3',5,5'-tetramethyl-1,1'-biadamantane was added to 200 g of dehydrated N-methyl-2-pyrolidone under nitrogen flow followed by heating at 150° C. for four hours while agitating. The mixture was returned to room temperature and then agitated for one hour. Next, the reaction solution was gradually added dropwise to 4 L of methanol followed by collecting precipitate, was washed with methanol, and dried by vacuum drier for 24 hours. Thus, 7,7'-bis(3,5-diethynylphenyl)-3,3',5,5'-tetramethyl-1,1'-biadamantane polymer was obtained.

2) Production of Resin Film

A reaction was performed similarly as in Example 1, 5) except that 10 g of the benzoxazole resin precursor was altered to 10 g of the benzoxazole resin precursor obtained in Example 3, and 2 g of the external cross-linking agent of 9,9-bis{3-(4-phenylethynylbenzoic acid amide)-4-hydroxyphenyl}fluorene was altered to 2 g of the 7,7'-bis(3,5-diethynyl-1-phenyl)-3,3',5,5'-tetramethyl-1,1'-biadamantane polymer. Thus, a resin film was obtained.

Example 12

1) Production of Resin Film

A reaction was performed similarly as in Example 1, 5) except that 10 g of the benzoxazole resin precursor was altered to 10 g of the benzoxazole resin precursor obtained in Example 3, and 2 g of the external cross-linking agent of 9,9-bis{3-(4-phenylethynylbenzoic acid amide)-4-hydroxyphenyl}fluorene was altered to 2 g of 3,3',5,5'-tetraethynyl-1,1'-biadamantane. Thus, a resin film was obtained.

Example 13

1) Production of Resin Film

A reaction was performed similarly as in Example 1, 5) except that 10 g of the benzoxazole resin precursor was altered to 10 g of the benzoxazole resin precursor obtained in Example 3, and 2 g of the external cross-linking agent of 9,9-bis{3-(4-phenylethynylbenzoic acid amide)-4-hydroxyphenyl}fluorene was altered to 2 g of 7,7'-diethynyl-3,3',5,5'-tetramethyl-1,1'-biadamantane. Thus, a resin film was obtained.

Example 14

1) Synthesis of external cross-linking agent, 7,7'-diethynyl-3,3',5,5'-tetramethyl-1,1'-biadamantane polymer A reaction was performed similarly as in Example 11, 1) except that 57.5 g (0.1 mol) of 7,7'-bis(3,5-diethynylphenyl)-3,3',5,5'-tetramethyl-1,1'-biadamantane was altered to 37.5 g (0.1 mol) of 7,7'-diethynyl-3,3',5,5'-tetramethyl-1,1'-biadamantane. Thus, an external cross-linking agent of 7,7'-diethynyl-3,3',5,5'-tetramethyl-1,1'-biadamantane polymer was obtained.

2) Production of Resin Film

A reaction was performed similarly as in Example 1, 5) except that 10 g of the benzoxazole resin precursor was altered to 10 g of the benzoxazole resin precursor obtained in Example 3, and 2 g of the external cross-linking agent of 9,9-bis{3-(4-phenylethynylbenzoic acid amide)-4-hydroxyphenyl}fluorene was altered to 2 g of the 7,7'-diethynyl-3,3',5,5'-tetramethyl-1,1'-biadamantane polymer. Thus, a resin film was obtained.

Comparative Example 1

1) Bisaminophenol Compound not Having a Functional Group

As bisaminophenol not having a functional group, 3,3'-dihydroxy-4,4'-diamino-biphenyl (manufactured by: Tokyo Chemical Industry Co., Ltd.) was used.

2) Dicarboxylic Acid not Having a Functional Group

As dicarboxylic acid not having a functional group, isophthalic acid dichloride (manufactured by: Tokyo Chemical Industry Co., Ltd.) was used.

3) Production of Benzoxazole Resin Precursor

A reaction was performed similarly as in Example 1, 3) except that 31.5 g (0.09 mol) of 1,3-bis(3-amino-4-hydroxyphenyl)adamantane was altered to 19.5 g (0.09 mol) of 3,3'-dihydroxy-4,4'-diamino-bipheny, and 30.3 g (0.10 mol) of 5-phenylethynylisophthalic acid dichloride was altered to 20.3 g (0.10 mol) of isophthalic acid dichloride. Thus, a benzoxazole resin precursor was obtained.

Number average molecular weight (Mn) of the obtained benzoxazole resin precursor, which was measured by means of a gel permeation chromatography (manufactured by: Tosoh Corporation) using polystyrene as the standard, was 17,000.

Evaluation of resin films obtained in Examples 1 to 14 and Comparative example 1 was conducted as follows. The results obtained are shown in Table 1.

1. Solubility 1 g of polybenzoxazole resin precursor and 3 g of N-methyl-2-pyrrolidone were precisely weighed in a glass sample container with a lid and agitated with a stirrer for one hour. Solubility was then determined by the presence of insoluble matter observed in the container.

2. Heat Resistance

Heat resistance was evaluated by the glass transition temperature and the thermally decomposing temperature. The glass transition temperature of obtained resin film was measured by means of a dynamic viscoelasticity measurement device (product name: DMS6100; manufactured by: Seiko Instruments Inc.) under a nitrogen flow of 300 mL/min, at a heating rate of 3° C./min and a frequency of 1 Hz. A peak top temperature of tan δ was referred to as the glass transition temperature.

The thermally decomposing temperature of obtained resin film was measured by means of a TG/DTA measurement device (product name: TG/DTA220; manufactured by: Seiko Instruments Inc.) under a nitrogen flow of 200 mL/min and at a heating rate of 10° C./min. The temperature when the reduction of weight reached 5% was referred to as the thermally decomposing temperature.

3. Relative permittivity

With reference to JIS-K6911, a measurement of the capacity of a resin film was carried out by means of a Precision LCR Meter (HP-4284A; manufactured by: Hewlett-Packard Development Company, L.P.) at a frequency of 100 kHz. Then, relative permittivity was calculated by the following formula:

Relative permittivity=(measured capacity×film thickness)/(vacuum permittivity×measured area)

TABLE 1

|  | Example 1 | Example 2 | Example 3 | Example 4 | Example 5 | Example 6 | Example 7 | Example 8 |
|---|---|---|---|---|---|---|---|---|
| Solubility | Yes | Yes | Yes | Yes | Yes | Yes | Yes | Yes |
| Glass transition temperature (° C.) | 420 | 430 | 430 | 430 | 430 | 430 | 420 | 420 |
| Thermally decomposing temperature (° C.) | 530 | 550 | 550 | 550 | 550 | 550 | 540 | 540 |
| Relative permittivity | 2.7 | 2.5 | 2.4 | 2.3 | 2.4 | 2.3 | 2.6 | 2.5 |

|  | Example 9 | Example 10 | Example 11 | Example 12 | Example 13 | Example 14 | Comparative Example 1 |
|---|---|---|---|---|---|---|---|
| Solubility | Yes | Yes | Yes | Yes | Yes | Yes | No |
| Glass transition temperature (° C.) | 430 | 430 | 430 | 430 | 430 | 430 | — |
| Thermally decomposing temperature (° C.) | 540 | 550 | 550 | 550 | 550 | 550 | — |
| Relative permittivity | 2.5 | 2.3 | 2.3 | 2.2 | 2.2 | 2.2 | — |

As it is clear from Table 1, in Examples 1 to 14, the glass transition temperature and the thermally decomposing temperature were high and the heat resistance was excellent.

It is also shown that Examples 1 to 14 have solubility in a solvent, low permittivity, excellent workability and excellent permittivity property.

In Comparative example 1, a resin film was not prepared due to poor solubility and it was not able to measure the glass transition temperature, the thermal decomposition temperature and the permittivity.

Next, an interlayer insulating film and a semiconductor device will be described.

Example 15

Production of Varnish for Coating and Semiconductor Device

The benzoxazole resin precursor obtained in Example 1 was dissolved in N-methyl-2-pyrrolidone and filtered with a Teflon (trade name) filter to obtain a varnish for coating.

A silicon nitride layer was formed on a semiconductor substrate and the varnish for coating was applied on the silicon nitride layer followed by heating at 250° C. for one hour and 420° C. for one hour to form an interlayer insulating film with a thickness of 0.3 μm.

Next, a metal wiring was formed in the interlayer insulating film to form a predetermined pattern. Thus, a semiconductor device was obtained.

Evaluation of the interlayer insulating film and semiconductor device obtained was conducted similarly as for the resin film. The results obtained are shown in Table 2.

TABLE 2

|  | Example 15 |
| --- | --- |
| Solubility | Yes |
| Glass transition temperature (° C.) | 450 or more |
| Thermally decomposing temperature (° C.) | 545 |
| Relative permittivity | 2.5 |

As is clear from Table 2, in Example 15, the glass transition temperature and the thermally decomposing temperature were high and the heat resistance was excellent.

It is also shown that Example 15 has solubility in a solvent, particularly low permittivity, particularly excellent workability and particularly excellent permittivity property.

Next, rate of wiring delay of the obtained semiconductor device was evaluated.

The wiring delay of the semiconductor device obtained using the interlayer insulating film of Example 15 was compared with that of a semiconductor device having the same structure but a $SiO_2$ insulating film. A signal delay time determined by converting an oscillation frequency of a ring oscillator was used as an evaluation criterion. As a result of comparing those, it was confirmed that the semiconductor device of the present invention has less wiring delay, and the rate improved by about 100 in Example 15.

The invention claimed is:

1. A resin composition comprising:
   (1) a benzoxazole resin precursor,
      wherein the benzoxazole resin precursor has a first repeating unit obtained by reacting a bisaminophenol compound and a dicarboxylic acid compound and having a diamondoid structure selected from structural units having an adamantane structure,
      wherein the first repeating unit is selected from:
      (a) a repeating unit obtained by reacting a bisaminophenol compound having a diamondoid structure and a dicarboxylic acid compound not having a diamondoid structure;
      (b) a repeating unit obtained by reacting a bisaminophenol compound not having a diamondoid structure and a dicarboxylic acid compound having a diamondoid structure; and
      (c) a repeating unit obtained by reacting a bisaminophenol compound having a diamondoid structure and a dicarboxylic acid compound having a diamondoid structure,
      wherein the bisaminophenol compound having a diamondoid structure is selected from a bisaminophenol compound having a diamondoid structure in a bisaminophenol skeleton or a bisaminophenol compound having a diamondoid structure bonded to a bisaminophenol skeleton directly or via other atom, and
      the dicarboxylic acid compound having a diamondoid structure is selected from a dicarboxylic acid compound having a diamondoid structure in a dicarboxylic acid skeleton and a dicarboxylic acid compound having a diamondoid structure bonded to a dicarboxylic acid skeleton directly or via other atom; and
   (2) a cross-linking agent having the formula $A(B)_p$,
      wherein A is an organic group which includes an adamantyl group, a 3,5-diphenyladamantyl group, a 3,5,7-triphenyladamantyl group, a 3,5,7,9-tetraphenyladamantyl group, a 1,1'-biadamantyl group, a 1,2'-biadamantyl group, a 2,2'-biadamantyl group, a 3,3'-diphenyl-1,1'-biadamantyl group, a 3,3',5,5'-tetraphenyl-1,1'-biadamantyl group, or a 3,3',5,5',7,7'-hexaphenyl-1,1'-biadamantyl group p is at least two or more and B is a cross linking group capable of linking benzoxazole resin precursor and capable of linking with a cross-linking agent to form a net-like structure.

2. The resin composition according to claim 1, wherein the benzoxazole resin precursor having the first repeating unit further contains a second repeating unit obtained by reacting a bisaminophenol compound not having a diamondoid structure and a dicarboxylic acid compound not having a diamondoid structure.

3. The resin composition according to claim 1 or 2, wherein at least one of the first repeating unit and the cross-linking agent has a functional group having a diamondoid structure and a functional part other than the diamondoid structure, and at least a part of the diamondoid structure of the first repeating unit and the cross-linking agent exists as a part of the functional group.

4. The resin composition according to claim 1 or 2, wherein the bisaminophenol compound not having a diamondoid structure or the dicarboxylic acid compound not having a diamondoid structure or both of them, which are contained in one or both of the first repeating unit and the second repeating unit, have a functional group other than the diamondoid structure.

5. The resin composition according to claim 1, wherein the diamondoid structure is at least a group selected from the group consisting of an adamantyl group, a diamantyl group, a triamantyl group, a tetramantyl group, a pentamantyl group, a hexamantyl group, a heptamantyl group, an octamantyl group, a nonamantyl group, a decamantyl group, an undecamantyl group, a biadamantyl group, a triadamantyl group, a tetraadamantyl group, a pentaadamantyl group, a hexaadamantyl group, a heptaadamantyl group, an octaadamantyl group, a nonaadamantyl group, a decaadamantyl group and an undecaadamantyl group.

6. The resin composition according to claim 1, wherein the diamondoid structure has an alkyl group and/or a fluoroalkyl group.

7. The resin composition according to claim 3, wherein the functional group having a diamondoid structure and a functional part other than the diamondoid structure defined in claim 3 or a functional group other than the diamondoid structure of the bisaminophenol compound not having a diamondoid structure or the dicarboxylic acid compound not having a diamondoid structure or both of them, which are contained in one or both of the first repeating unit and the second repeating unit, is a crosslinking functional group.

8. The resin composition according to claim 7, wherein a crosslinking functional group contained in the first repeating unit defined in claim 1, the second repeating unit defined in claim 3 or both of them is a group capable of causing a crosslinking reaction in at least one combination selected from the first repeating units, the second repeating units and the first and second repeating units.

9. The resin composition according to claim 7, wherein a crosslinking reaction is caused between the cross-linking agent and the crosslinking functional group of the first repeating unit and/or the second repeating unit.

10. The resin composition according to claim 3, wherein the group capable of causing a crosslinking reaction of the cross-linking agent or one or both of crosslinking functional groups of the first and second repeating units is a group having an acetylene bond.

11. The resin composition according to claim 1, wherein the dicarboxylic acid having the diamondoid structure is adamantanedicarboxylic acid, biadamantanedicarboxylic acid and/or tetraadamantanedicarboxylic acid.

12. The resin composition according to claim 2, wherein the benzoxazole resin precursor is a copolymer comprising the first repeating unit defined by claim 1 and the second repeating unit defined by claim 2.

13. A resin composition comprising a benzoxazole resin precursor having a third repeating unit represented by the following Formula (1) and a cross-linking agent having at least two or more groups capable of causing a cross linking reaction in a molecule by reacting crosslinking agents to form a net-like structure and wherein the crosslinking agent has the formula $A(B)_p$, wherein A is an organic group which includes an adamantly group, a 3,5-diphenyladamantyl group, a 3,5,7-triphenyladamantyl group, a 3,5,7,9-tetraphenyladamantyl group, a 1,1'-biadamantyl group, a 1,2'- biadamantyl group, a 2,2'-biadamantyl group, a 3,3'-diphenyl-1,1'-biadamantyl group, a 3,3',5,5'-tetraphenyl-1,1'-biadamantyl group, or a 3,3',5,5',7,7'-hexaphenyl-1,1'- biadamantyl group, p is at least two or more and B is a cross linking group capable of linking benzoxazole resin precursor and capable of linking with a cross-linking agent to form a net-like structure:

Formula (1):

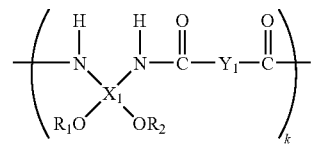

wherein, in the Formula (1), each of $R_1$ and $R_2$ is independently a hydrogen atom or an organic group; "k" is an integer of 2 to 1000; $X_1$ is at least a group selected from the group consisting of groups represented by the following Formula (2-1) and the following Formula (2-2) and groups represented by the following Formula (3); $Y_1$ is at least a group selected from the group consisting of groups represented by the following Formula (4), Formula (6-1), Formula (6-2), Formula (7-1), Formula (7-2), Formula (8) and Formula (9); and the hydrogen atom of carbocycle contained in $X_1$ and $Y_1$ may be substituted by an alkyl group and/or a fluoroalkyl group:

Formula (2-1):

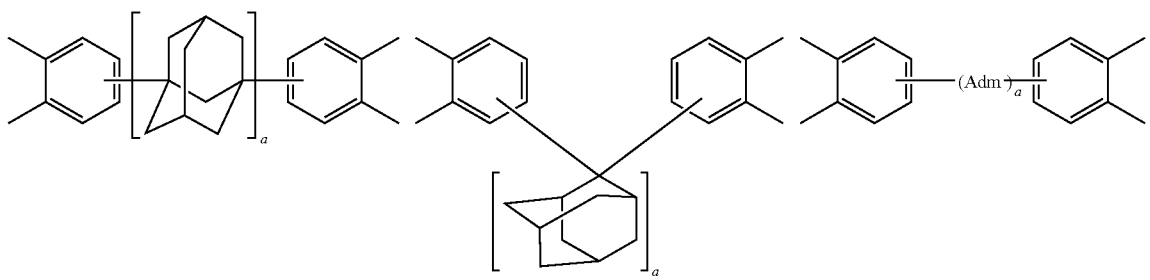

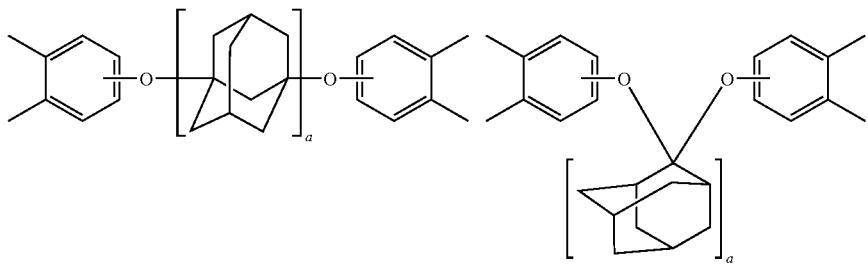

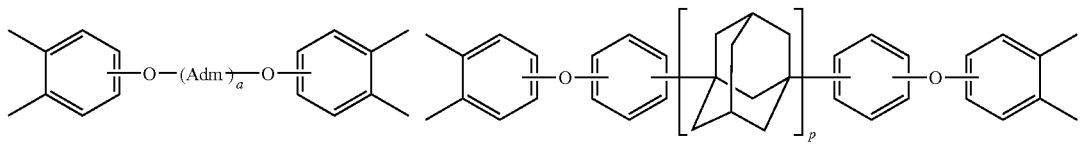

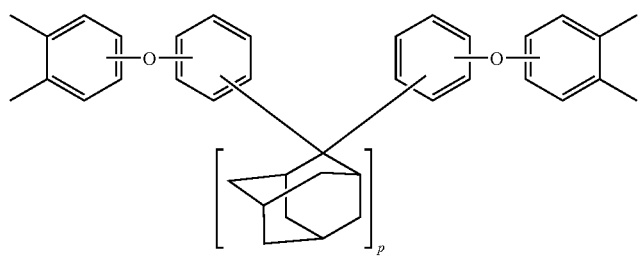
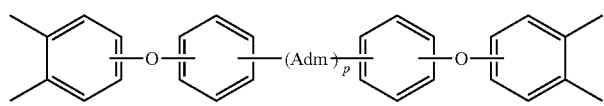
Formula (2-2):
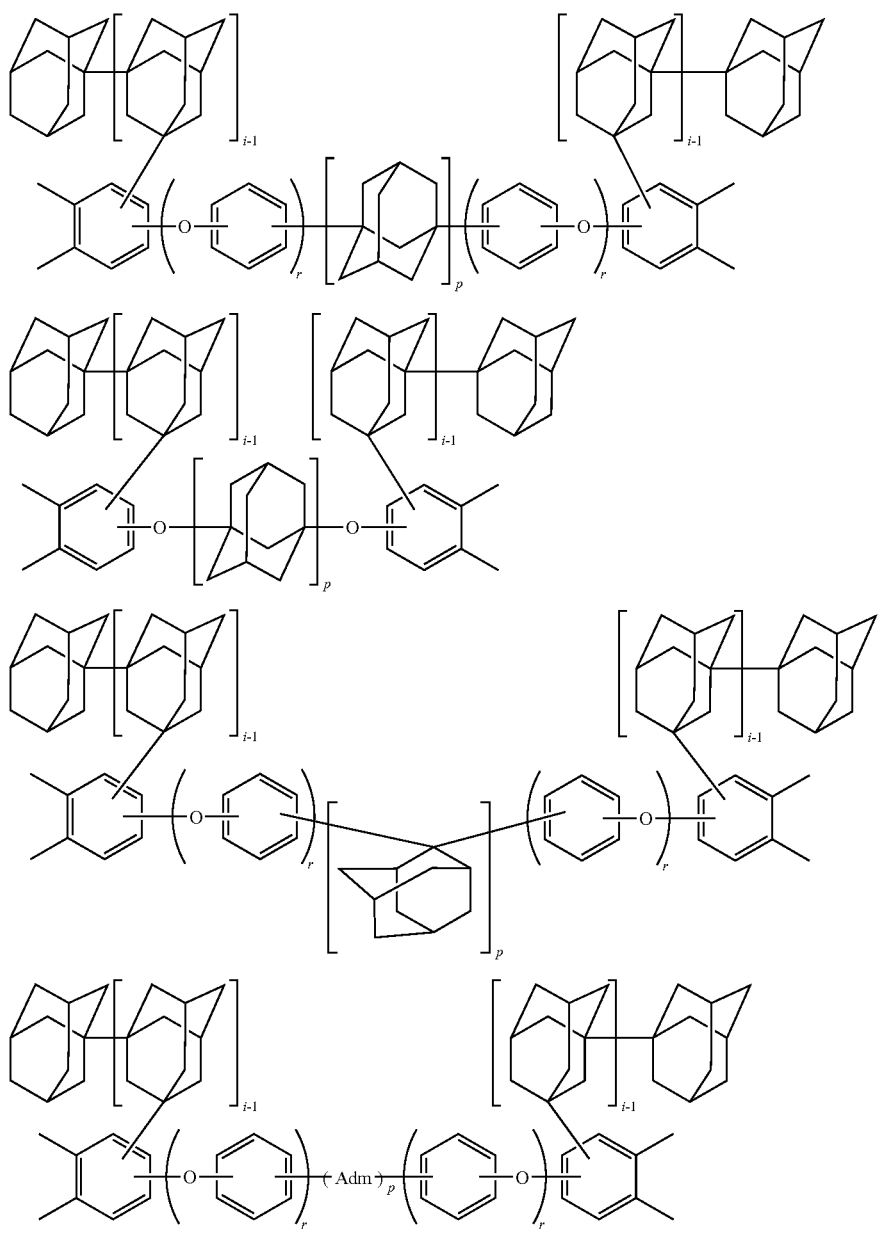

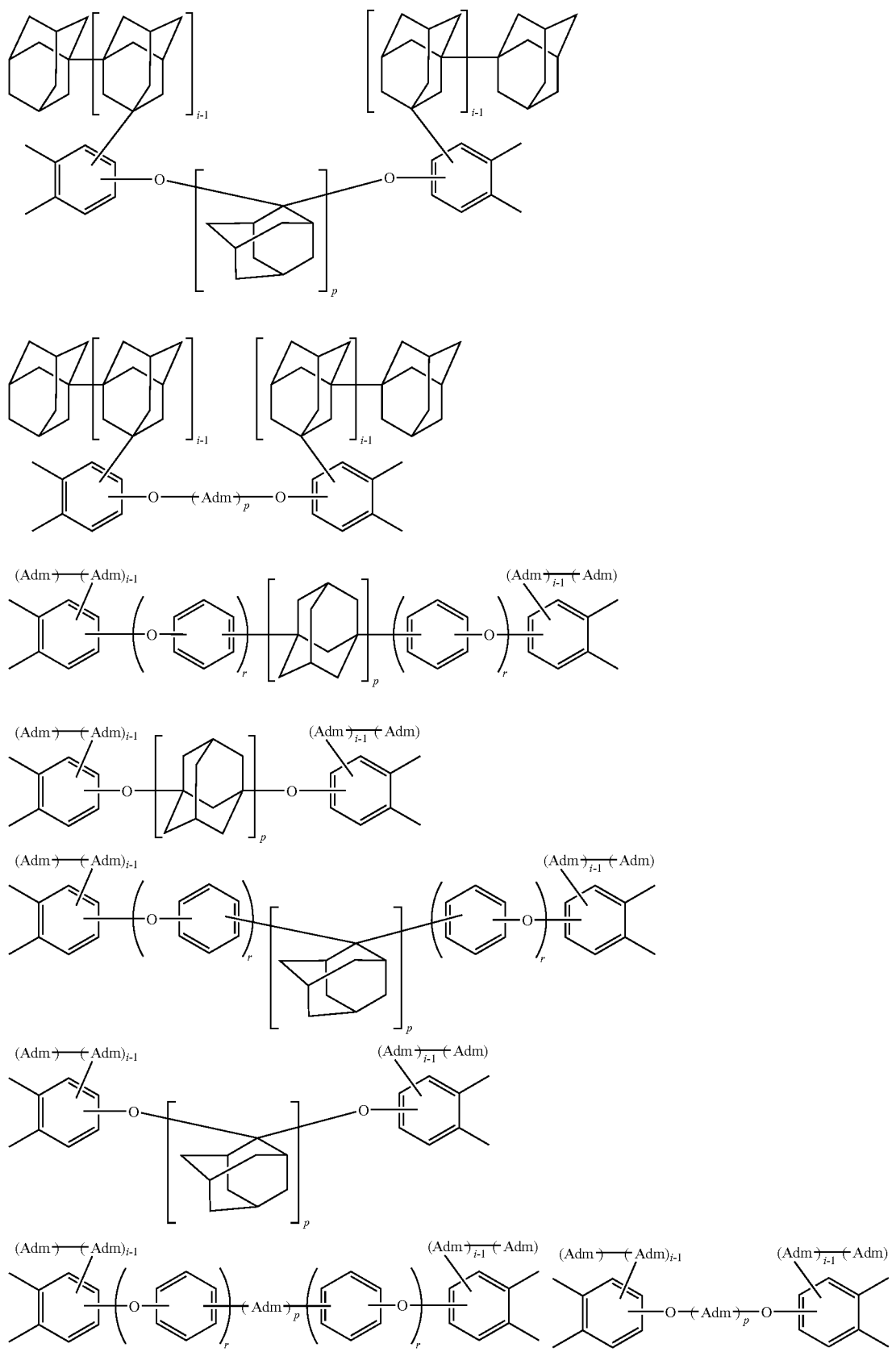

wherein, in the Formula (2-1) and Formula (2-2), "Adm" represents a diamondoid structural unit based on an adamantane structure; "a" is from 2 to 12; "p" is from 1 to 12; "i" is from 1 to 12; and "r" is 0 or 1, Formula (3):

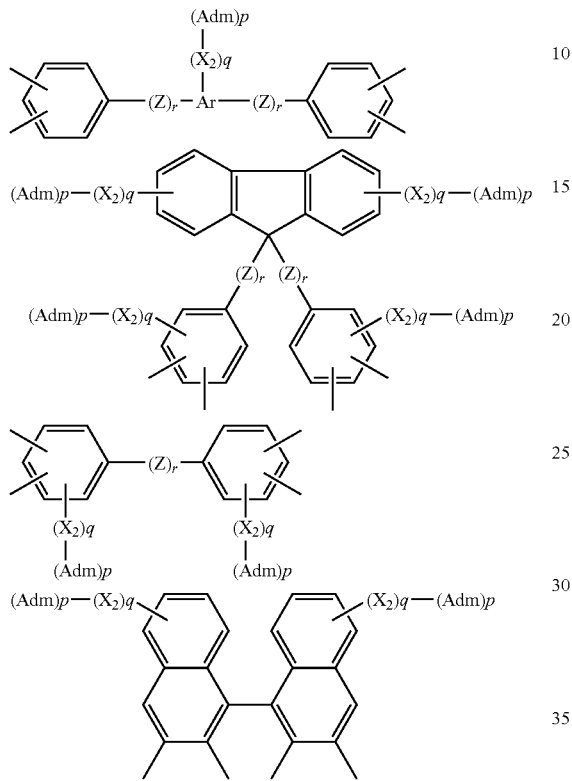

wherein, in the Formula (3), "Adm" represents a diamondoid structural unit based on an adamantane structure; "p" is from 1 to 12; $X_2$ is an ethynyl group or a propargylether group; "Z" is —O—, —SO$_2$—, —CH$_2$—, —C(CH$_3$)$_2$—, —C(CF$_3$)$_2$— or an aromatic group; Ar is an aromatic group of trivalent or more; "r" is 0 or 1; and "q" is an integer of 1 to 4;

Formula (4):

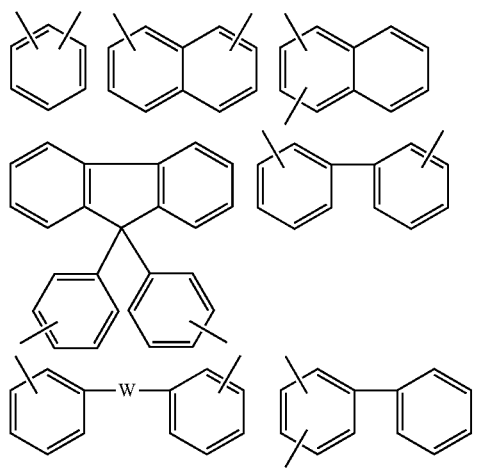

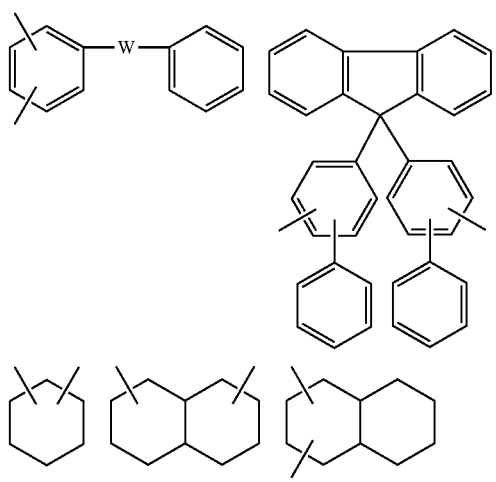

wherein, in the Formula (4), "W" is at least a group selected from the group consisting of groups represented by the following Formula (5):

Formula (5):

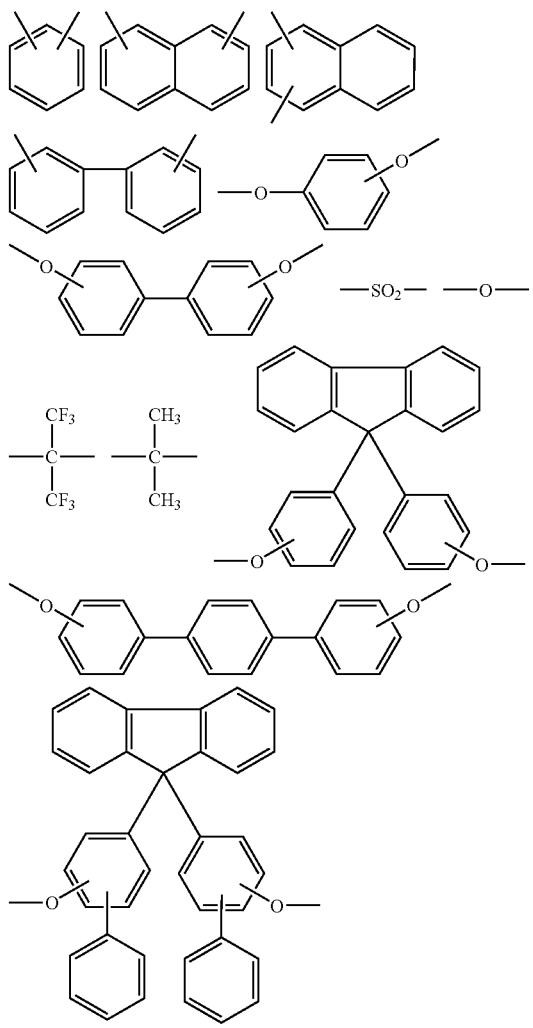

-continued
Formula (6-1):
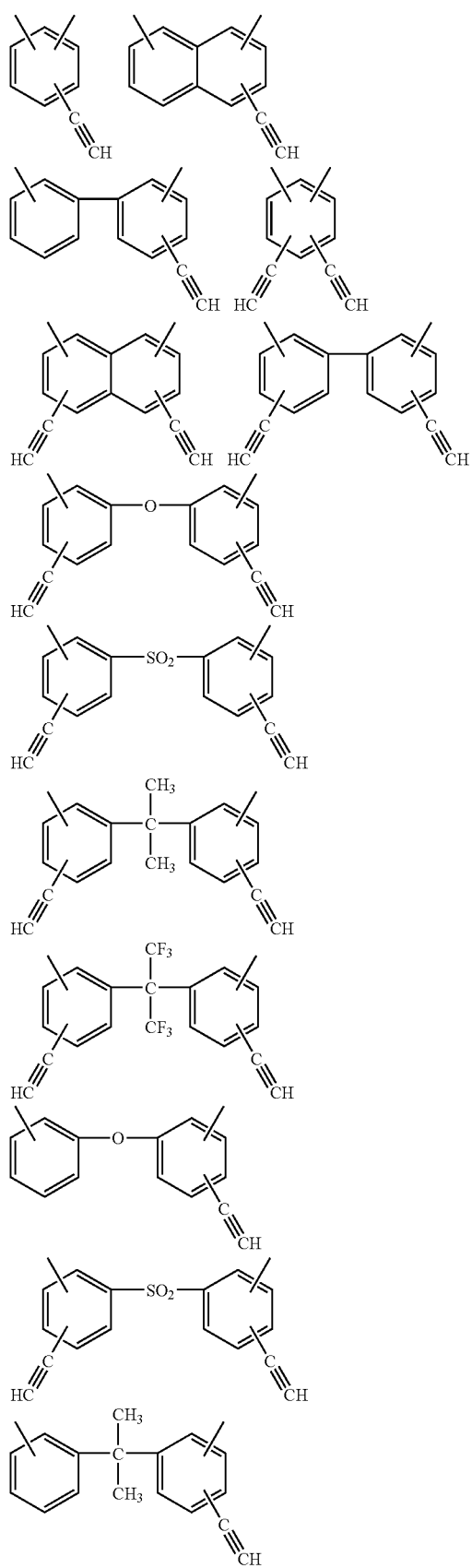
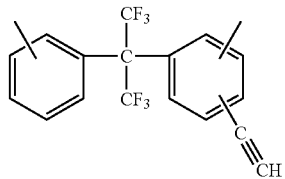
Formula (6-2):
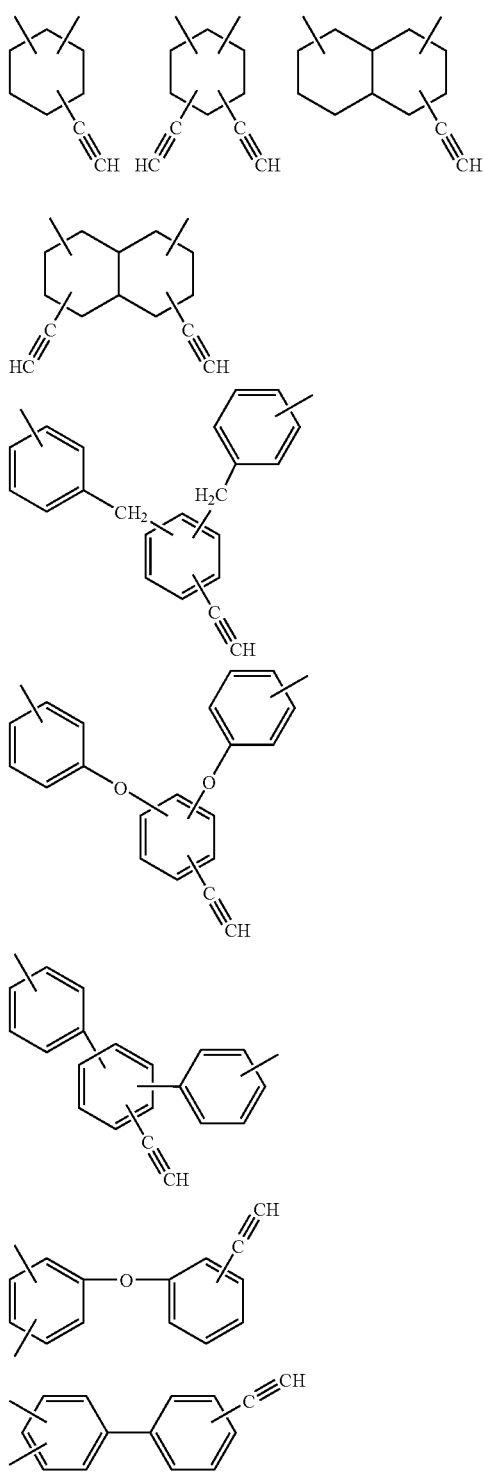

75
-continued
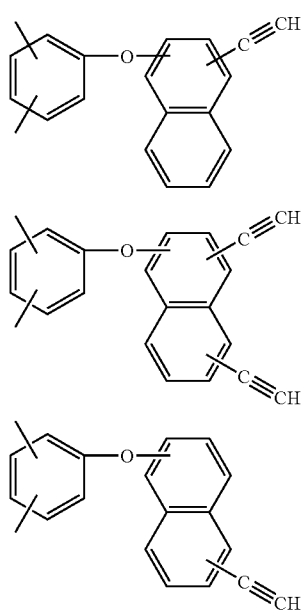
Formula (7-1):
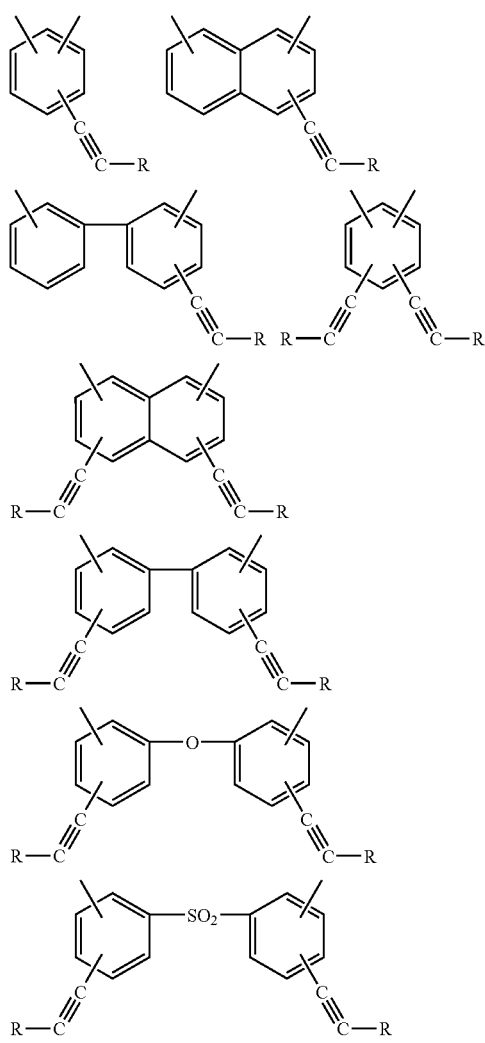
76
-continued
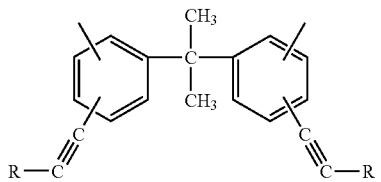
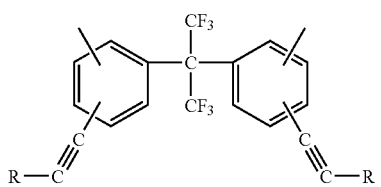
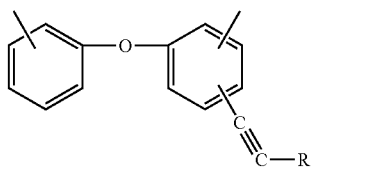
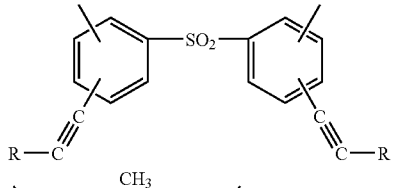
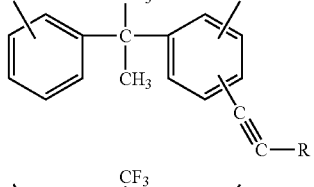
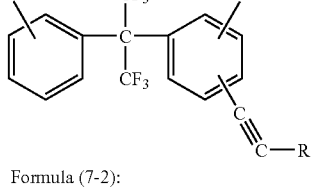
Formula (7-2):
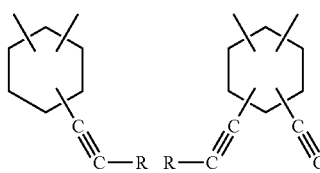
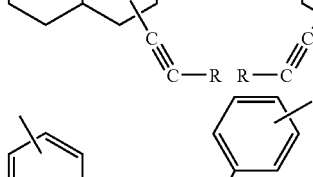
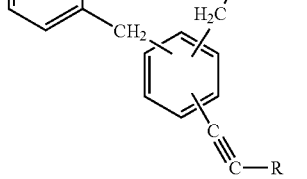

-continued

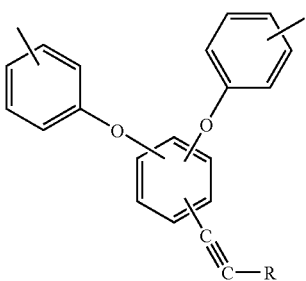

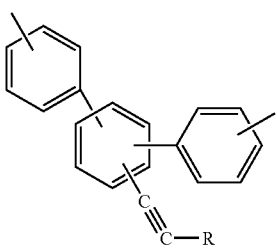

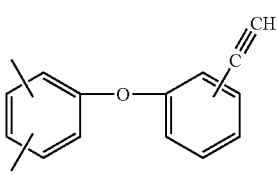

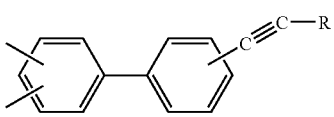

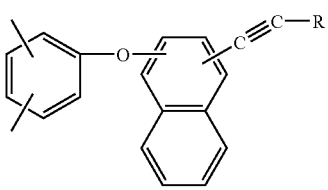

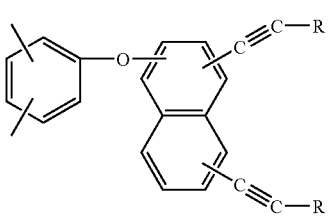

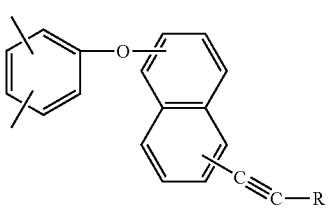

wherein, in the Formula (7-1) and Formula (7-2), "R" is an organic group,

Formula (8):

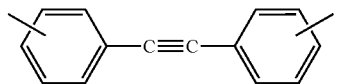

Formula (9):

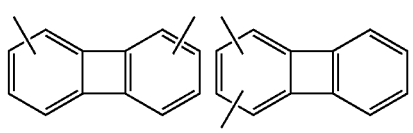

14. A resin composition comprising a benzoxazole resin precursor having a fourth repeating unit represented by the following Formula (10) and a cross-linking agent having at least two or more groups capable of causing a cross linking reaction in a molecule by reacting crosslinking agents to form a net-like structure and wherein the crosslinking agent has the formula $A(B)_p$, wherein A is an organic group which includes an adamantyl group, a 3,5-diphenyladamantyl group, a 3,5,7-triphenyladamantyl group, a 3,5,7,9-tetraphenyladamantyl group, a 1,1'-biadamantyl group, a 1,2'-biadamantyl group, a 2,2'-biadamantyl group, a 3,3'-diphenyl-1,1'-biadamantyl group, a 3,3',5,5'-tetraphenyl-1,1'-biadamantyl group, or a 3,3',5,5',7,7'-hexaphenyl-1,1'-biadamantyl group, p is at least two or more and B is a cross linking group capable of linking benzoxazole resin precursor and capable of linking with a cross-linking agent to form a net-like structure:

Formula (10):

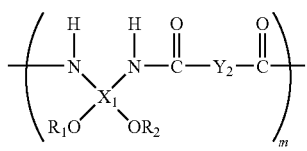

wherein, in the Formula (10), each of $R_1$ and $R_2$ is independently a hydrogen atom or an organic group; "m" is an integer of 2 to 1000; $X_1$ is at least a group selected from the group consisting of groups represented by the following Formula (2-1), Formula (2-2) and Formula (3); $Y_2$ is at least a group selected from the group consisting of groups represented by the following Formula (11-1), Formula (11-2), Formula (12-1) and Formula (12-2); and the hydrogen atom of carbocycle contained in $X_1$ and $Y_2$ may be substituted by an alkyl group and/or a fluoroalkyl group:

Formula (2-1)
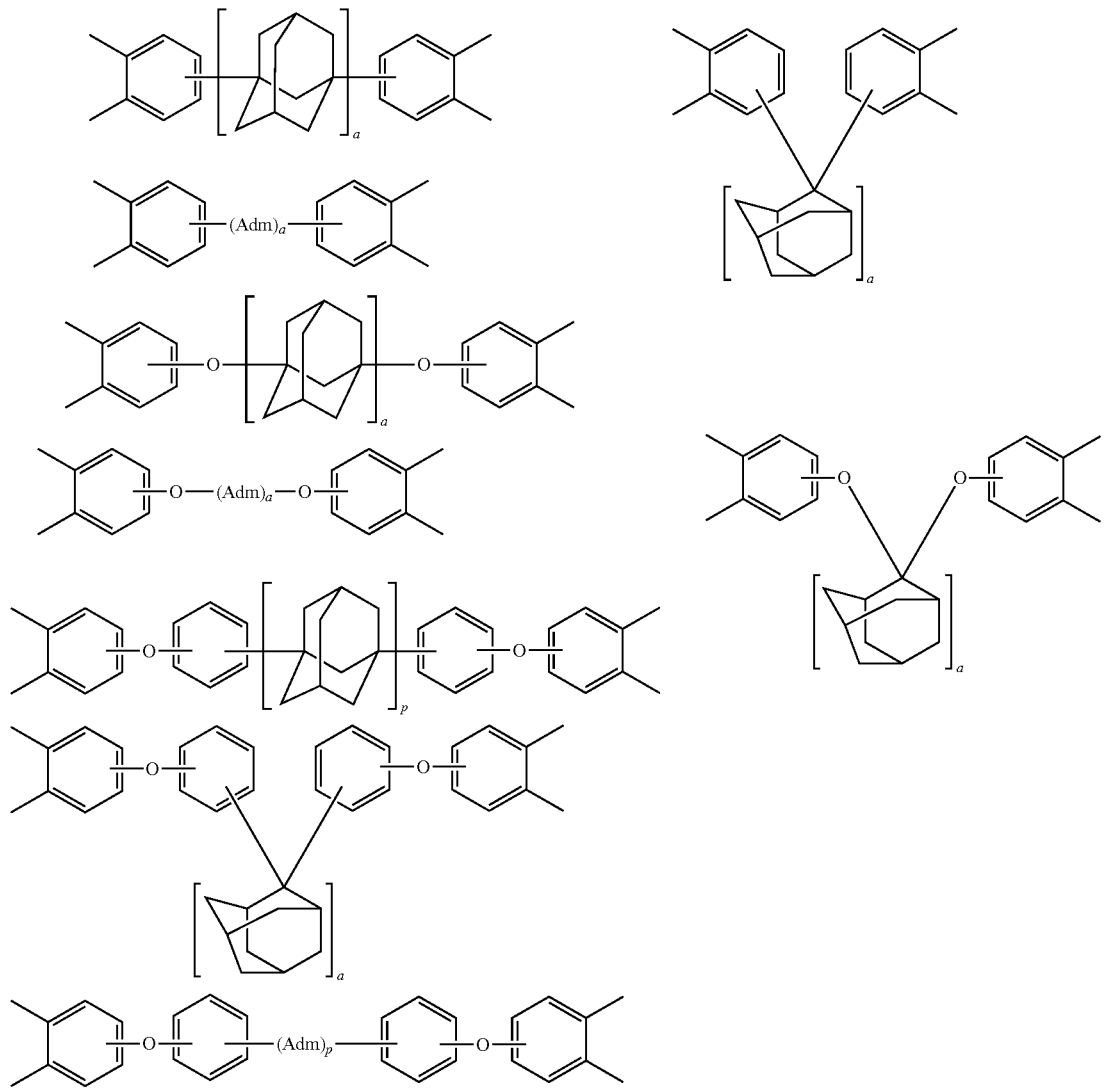
Formula (2-2)
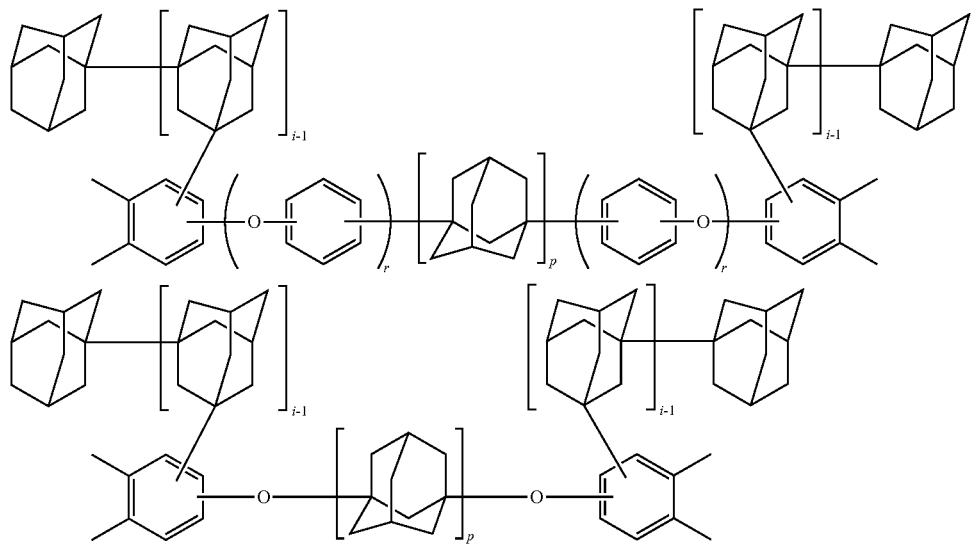

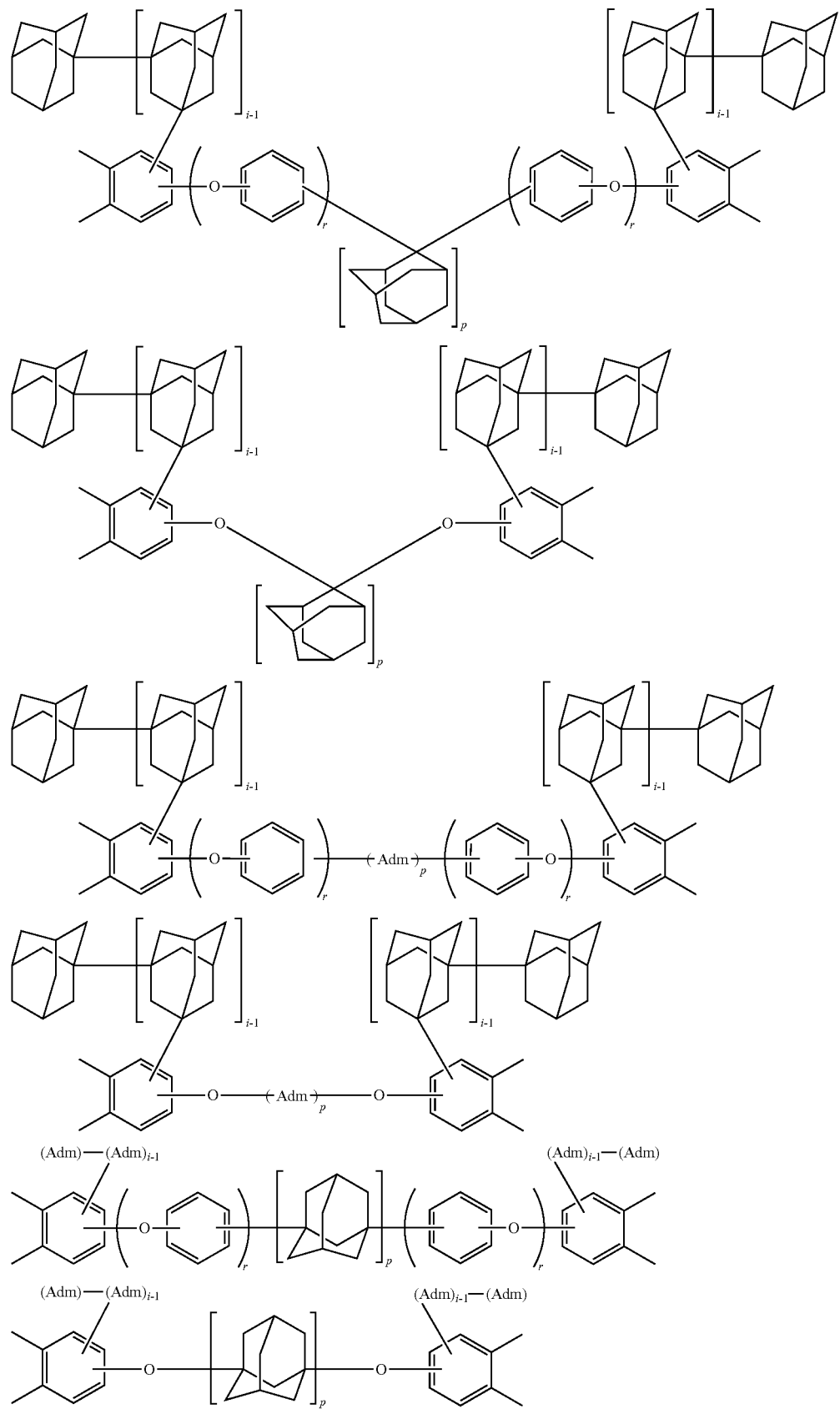

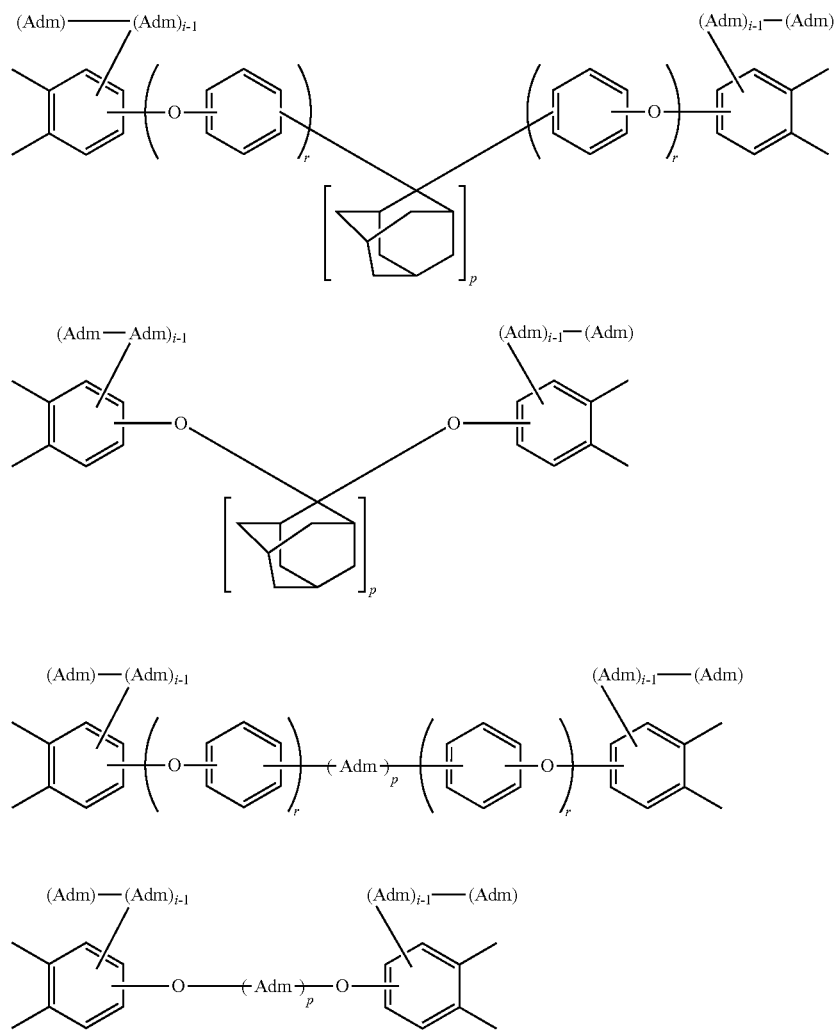

wherein, in the Formula (2-1) and Formula (2-2), "Adm" represents a diamondoid structural unit based on an adamantane structure; "a" is from 2 to 12; "p" is from 1 to 12; "i" is from 1 to 12; and "r" is 0 or 1, Formula (3):

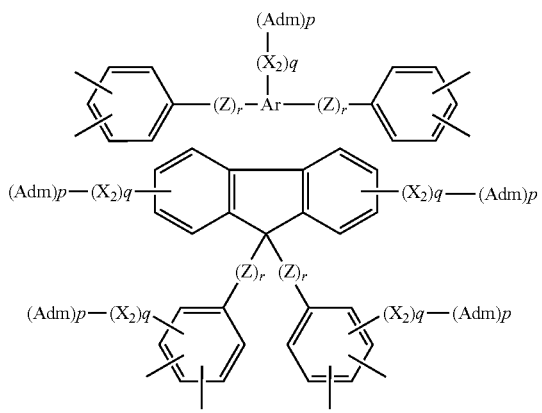

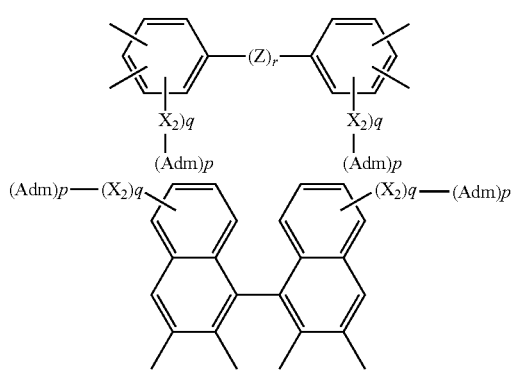

wherein, in the Formula (3), "Adm" represents a diamondoid structural unit based on an adamantane structure; "p" is from 1 to 12; $X_2$ is an ethynyl group or a propargylether group; "Z" is —O—, —SO$_2$—, —CH$_2$—, —C(CH$_3$)$_2$—, —C(CF$_3$)$_2$— or an aromatic group; Ar is an aromatic group of trivalent or more; "r" is 0 or 1; and "q" is an integer of 1 to 4;

Formula (11-1):
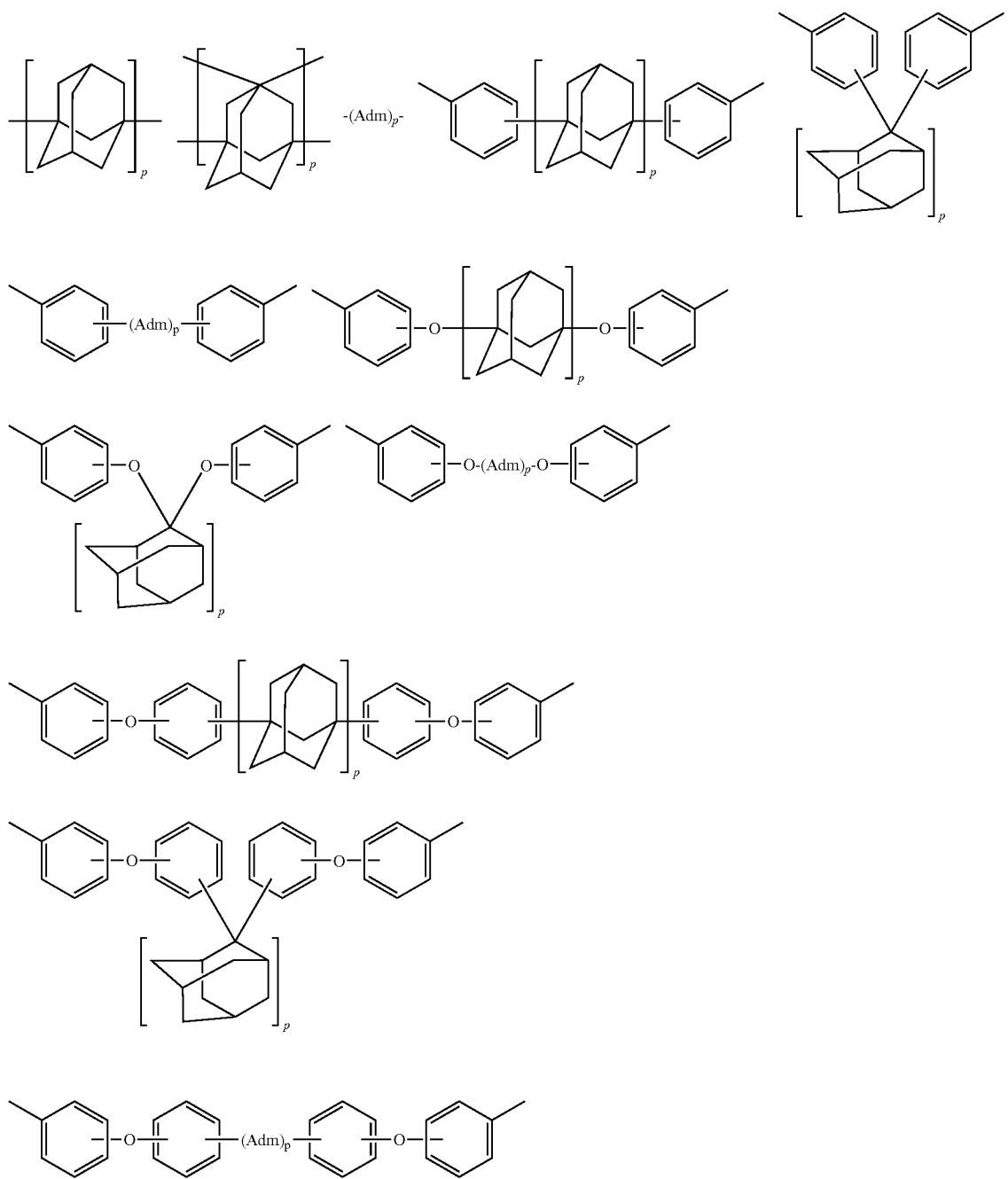
Formula (11-2):
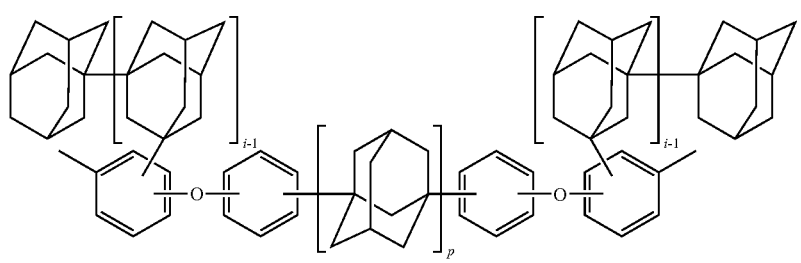

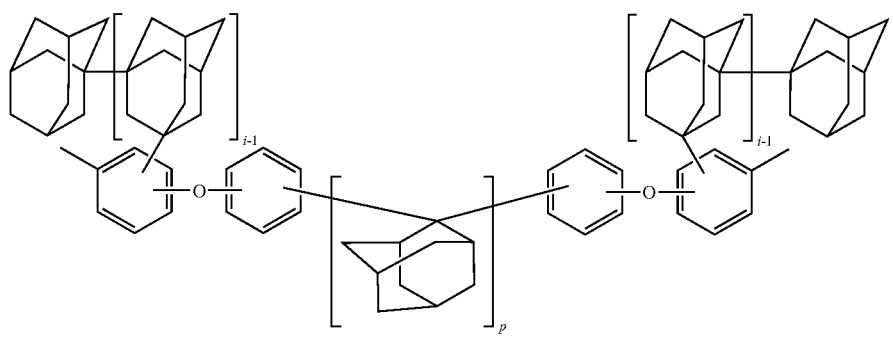
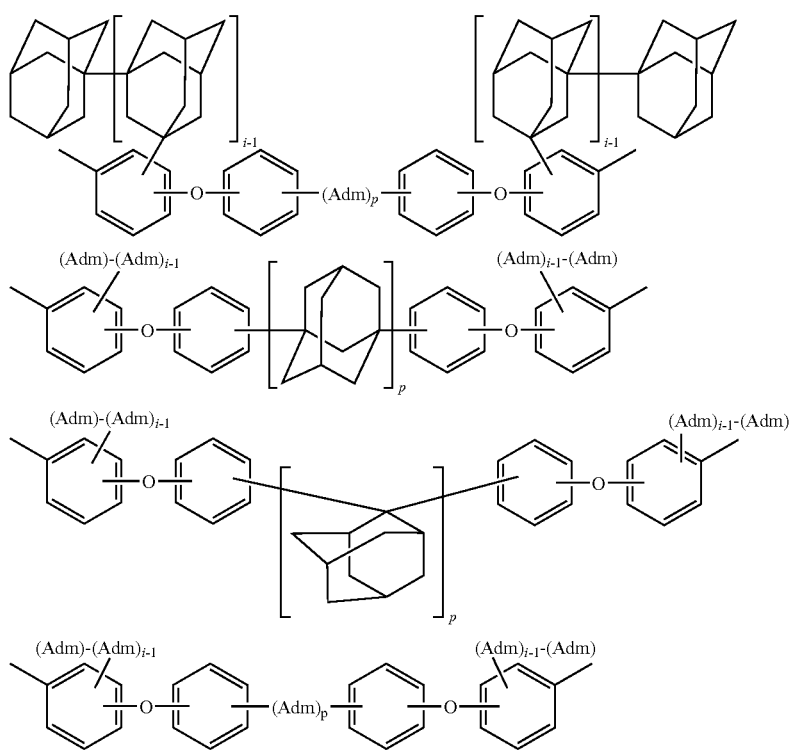
Formula (12-1):
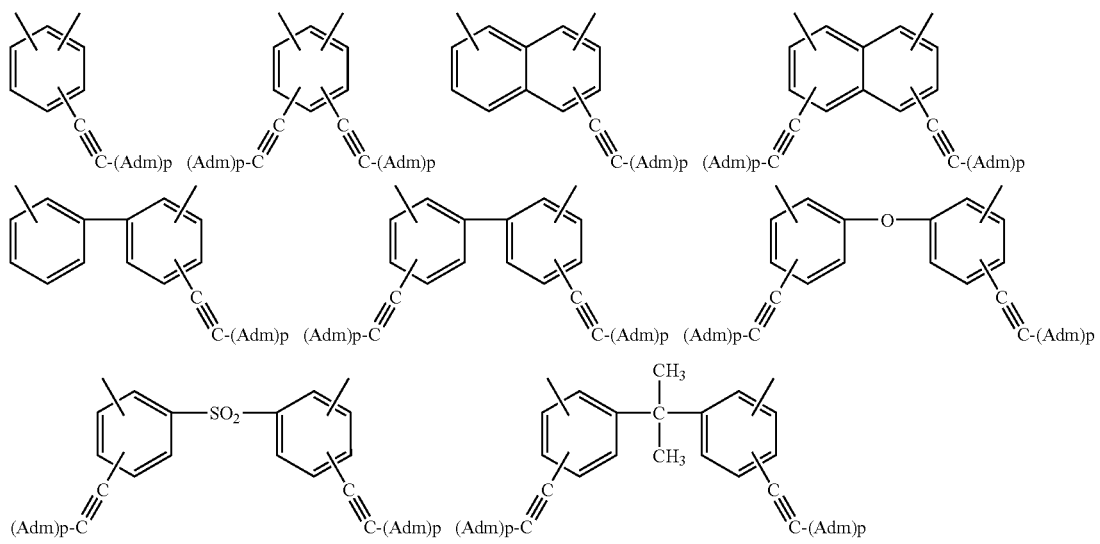

-continued

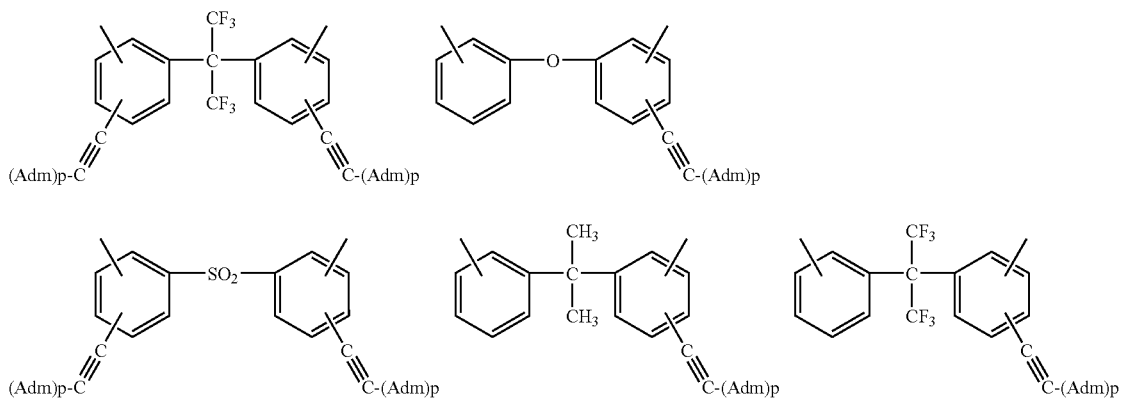

Formula (12-2):

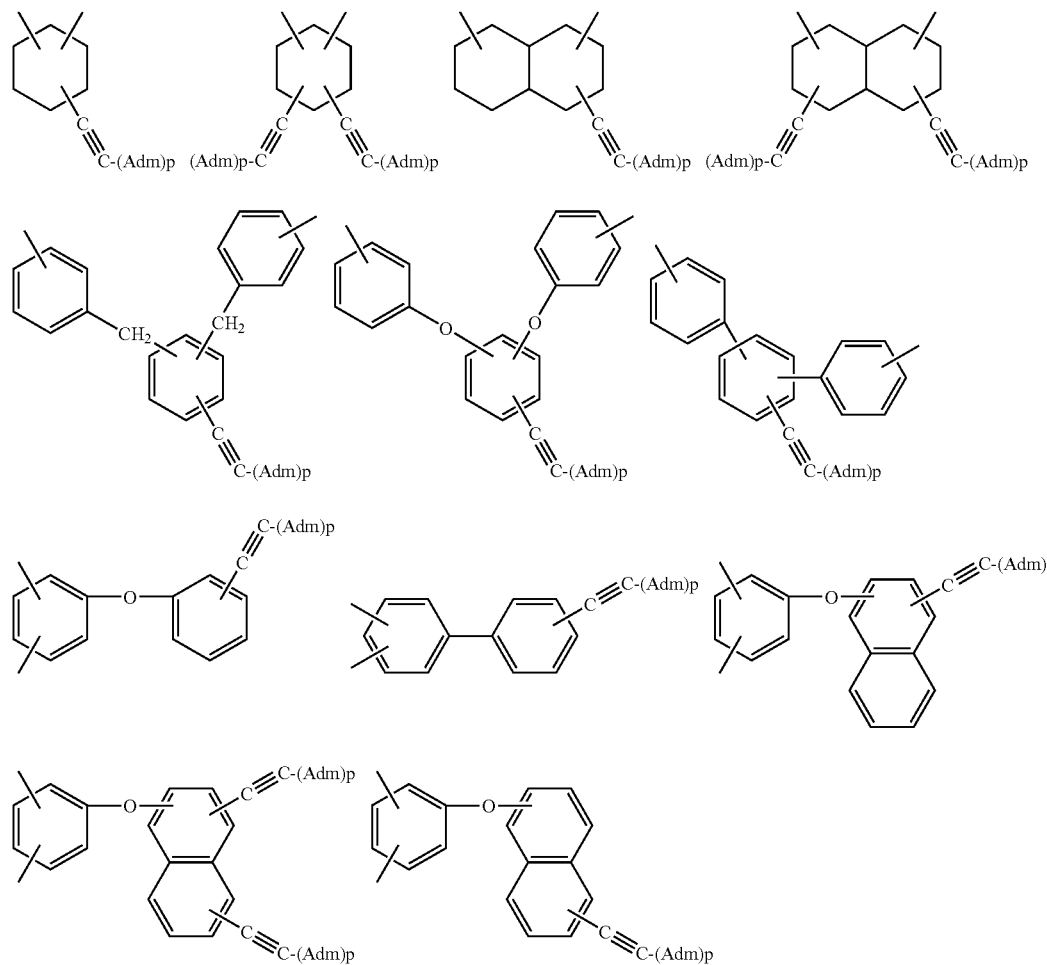

wherein, in the Formula (2-1) and Formula (2-2), "Adm" represents a diamondoid structural unit based on an adamantane structure; "a" is from 2 to 12; "p" is from 1 to 12; and "i" is from 1 to 12.

15. The resin composition according to claim 14, wherein the benzoxazole resin precursor having the fourth repeating unit further has a third repeating unit represented by the following Formula (1):

Formula (1):

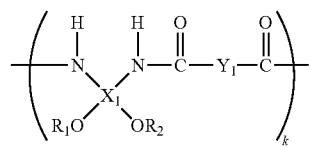

wherein, in the Formula (1), each of $R_1$ and $R_2$ is independently a hydrogen atom or an organic group; "k" is an integer of 2 to 1000; $X_1$ is at least a group selected from the group consisting of groups represented by the following Formula (2-1) and the following Formula (2-2) and groups represented by the following Formula (3); $Y_1$ is at least a group selected from the group consisting of groups represented by the following Formula (4), Formula (6-1), Formula (6-2), Formula (7-1), Formula (7-2), Formula (8) and Formula (9); and the hydrogen atom of carbocycle contained in $X_1$ and $Y_1$ may be substituted by an alkyl group and/or a fluoroalkyl group:

Formula (2-1):

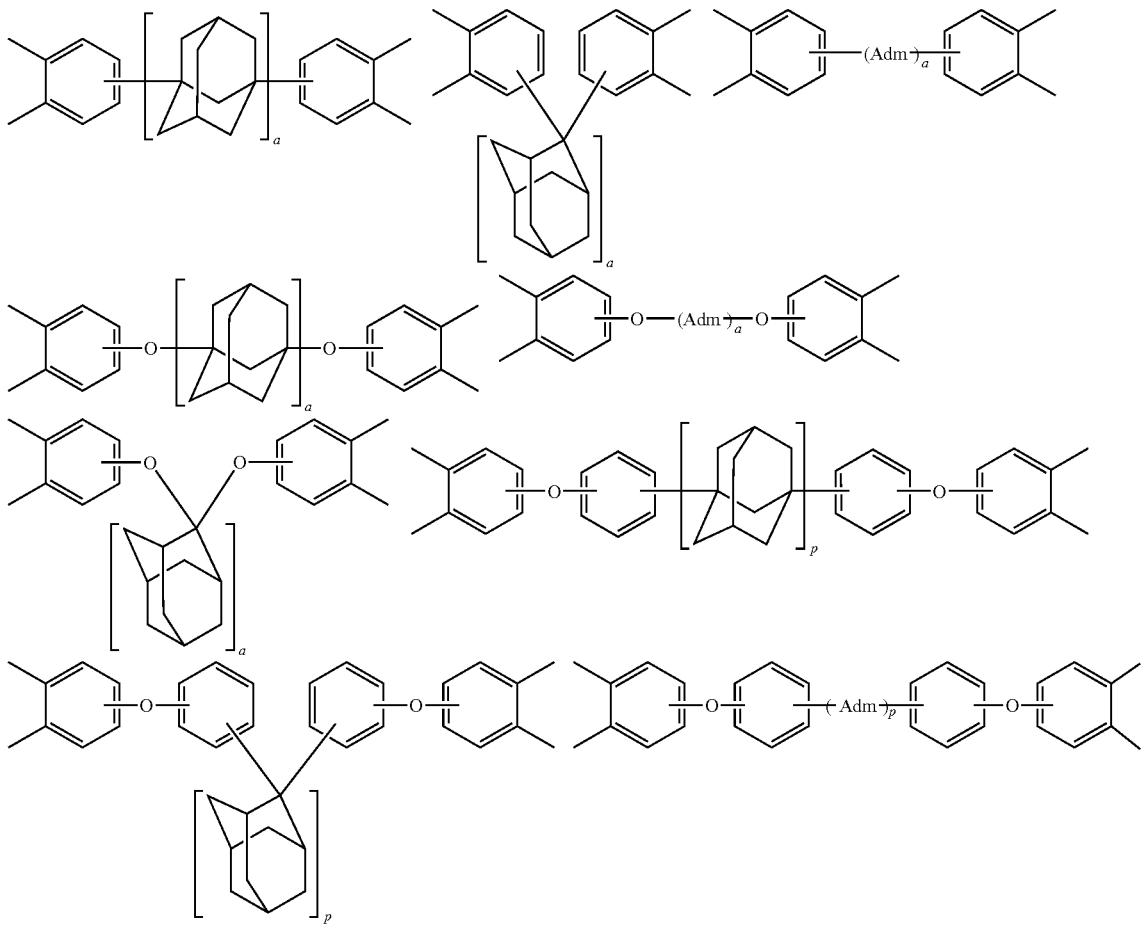

Formula (2-2):

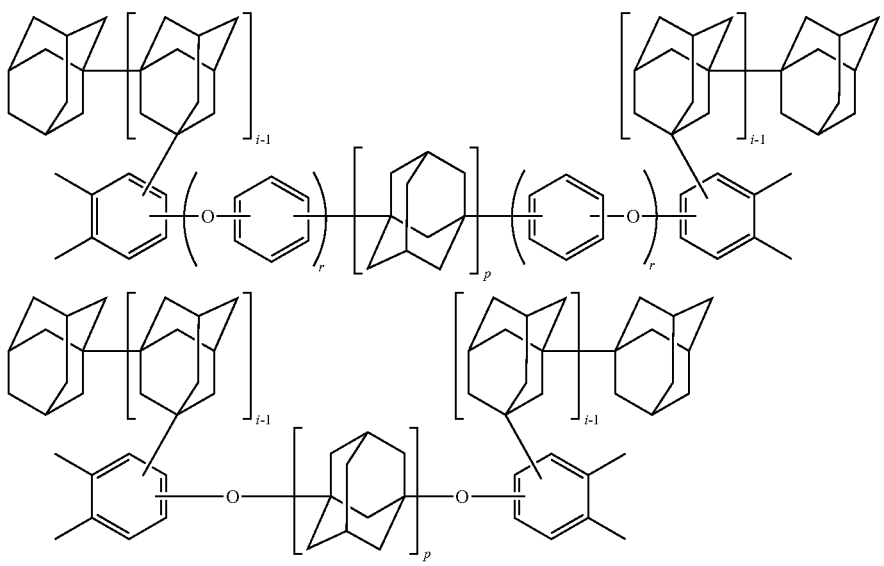

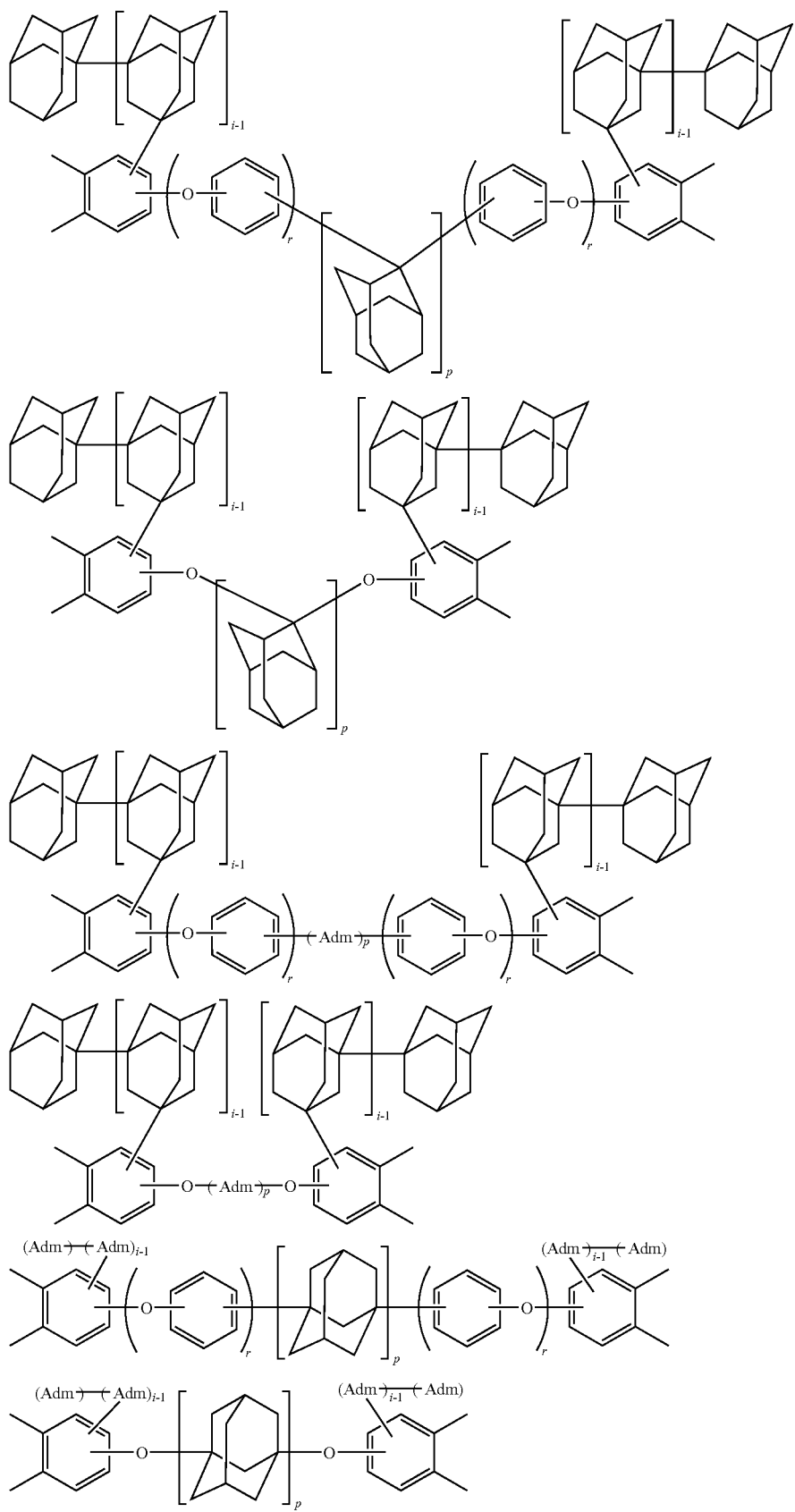

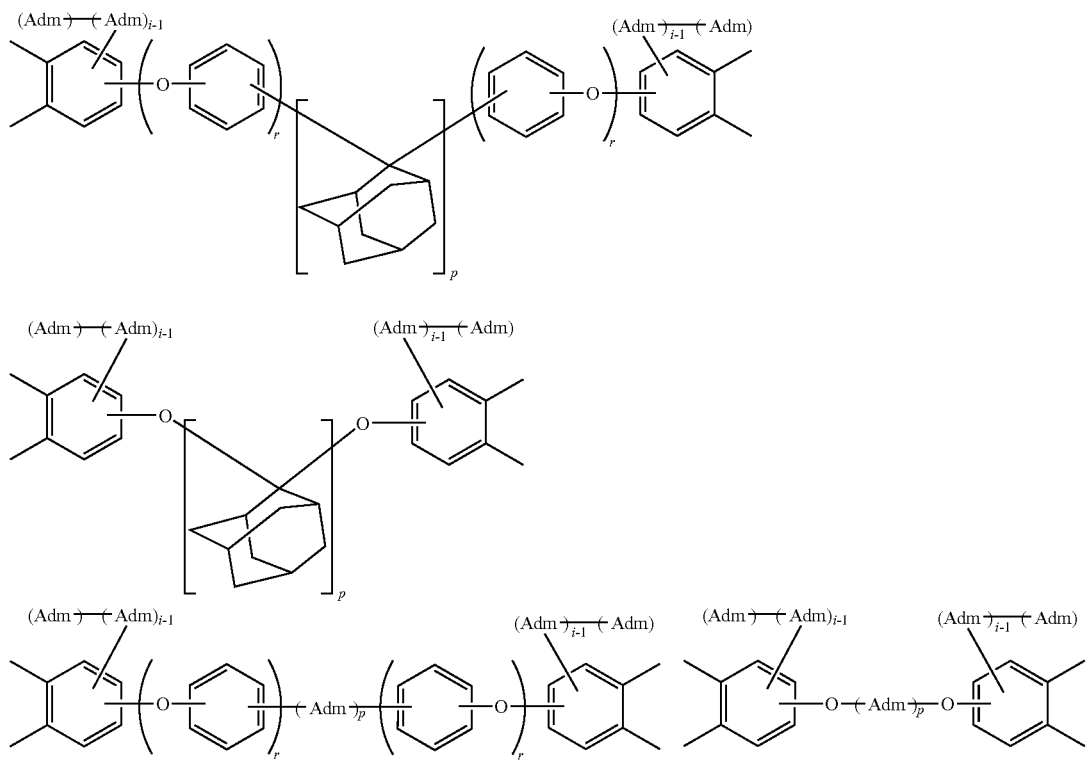

wherein, in the Formula (2-1) and Formula (2-2), "Adm" represents a diamondoid structural unit based on an adamantane structure; "a" is from 2 to 12; "p" is from 1 to 12; "i" is from 1 to 12; and "r" is 0 or 1, Formula (3):

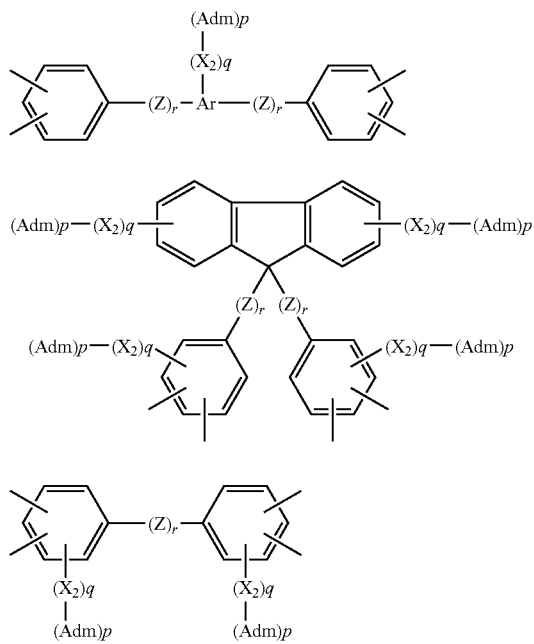

wherein, in the Formula (3), "Adm" represents a diamondoid structural unit based on an adamantane structure; "p" is from 1 to 12; $X_2$ is an ethynyl group or a propargylether group; "Z" is —O—, —SO$_2$—, —CH$_2$—, —C(CH$_3$)$_2$—, —C(CF$_3$)$_2$— or an aromatic group; Ar is an aromatic group of trivalent or more; "r" is 0 or 1; and "q" is an integer of 1 to 4;

Formula (4):

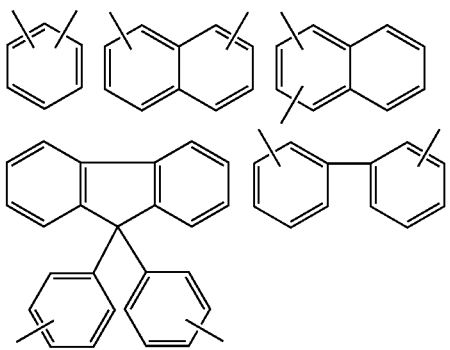

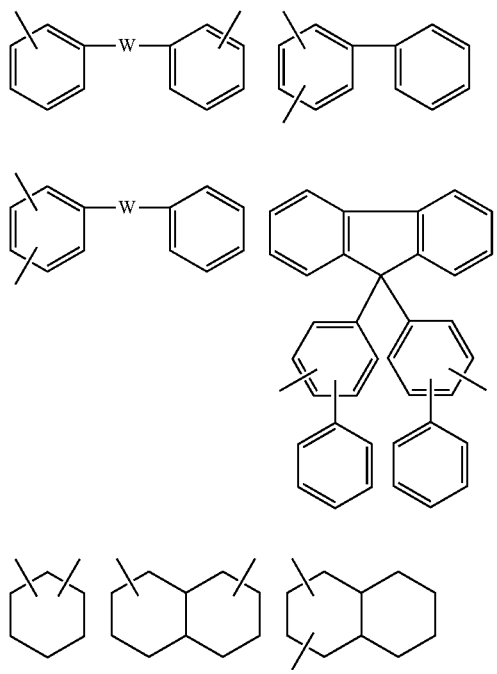
wherein, in the Formula (4), "W" is at least a group selected from the group consisting of groups represented by the following Formula (5):
Formula (5):
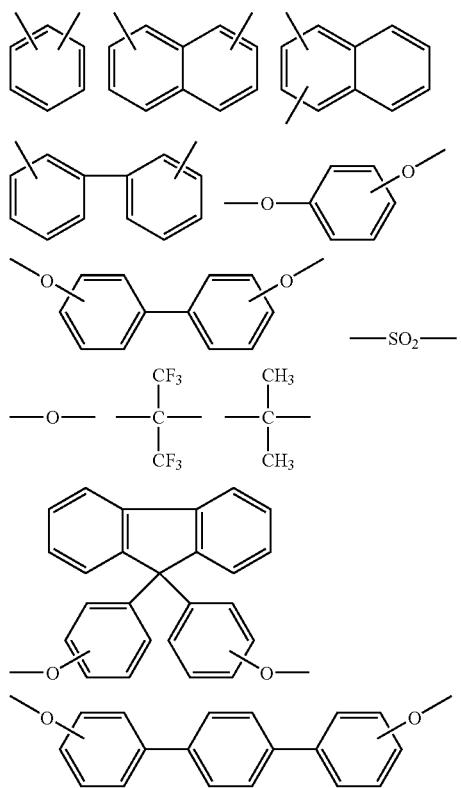
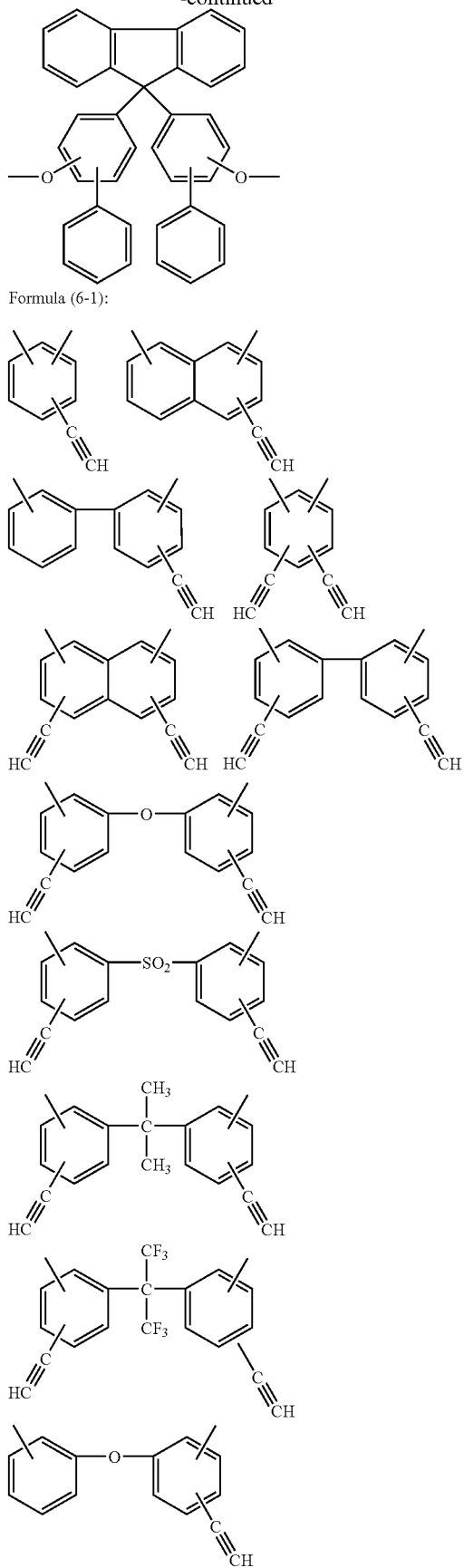
Formula (6-1):

99
-continued
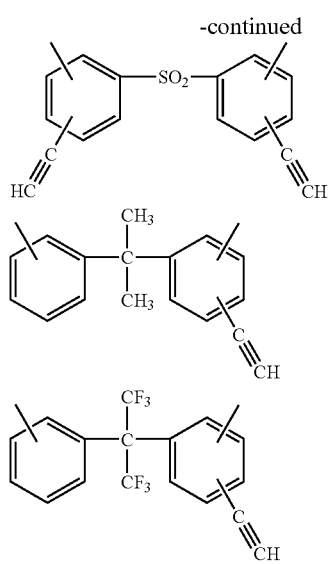
Formula (6-2):
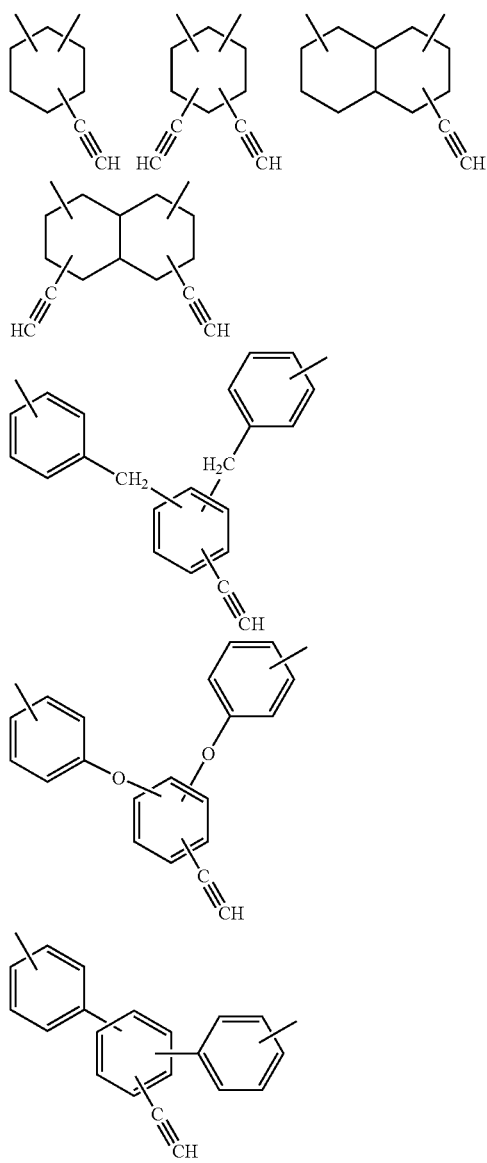
100
-continued
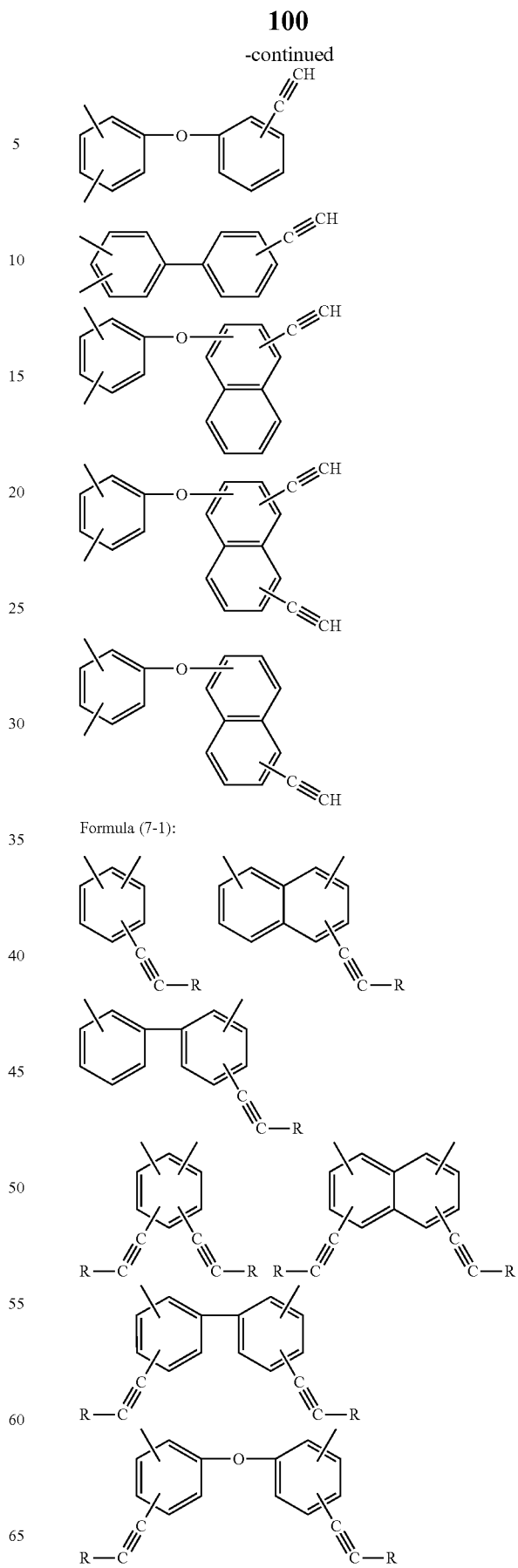
Formula (7-1):

101
-continued
102
-continued
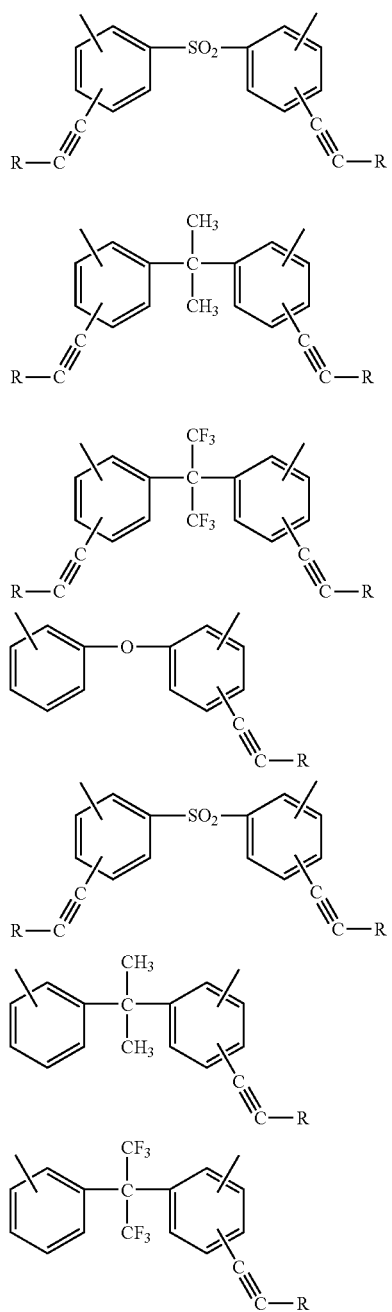
Formula (7-2):
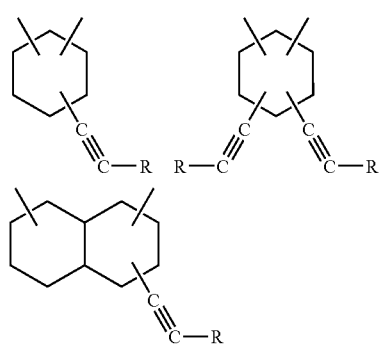
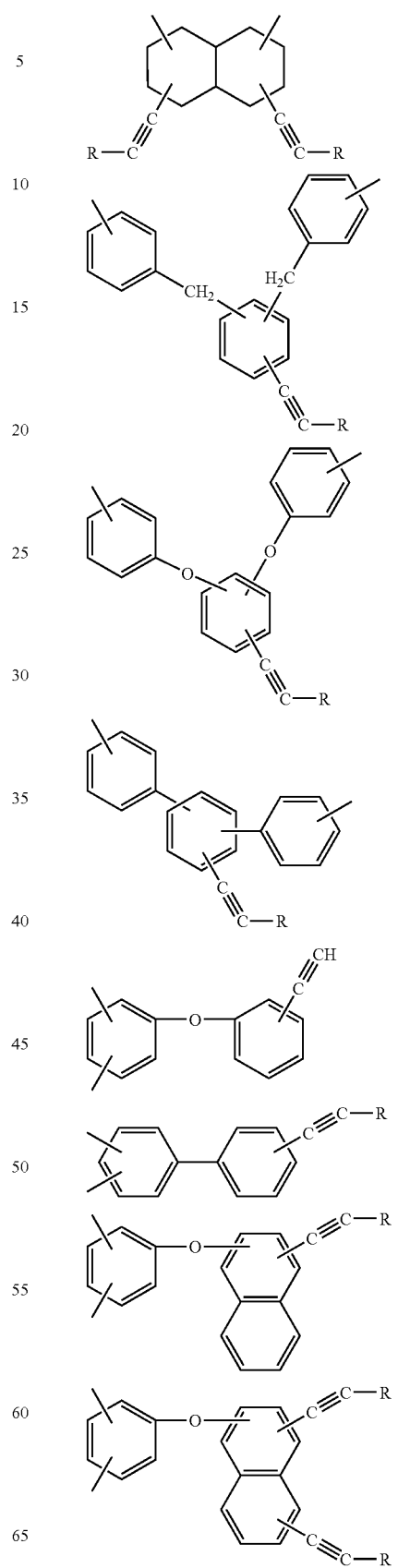

-continued

Formula (14):

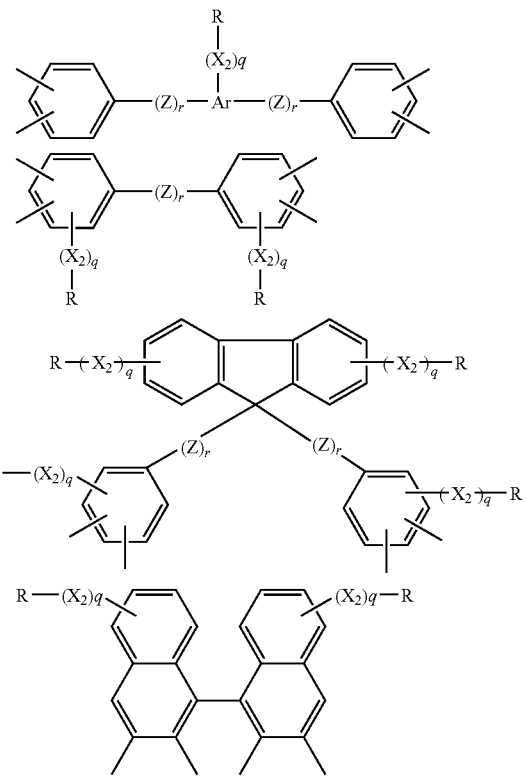

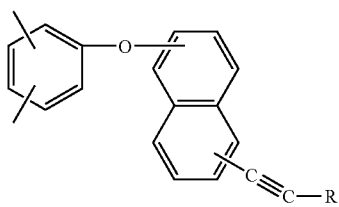

wherein, in the Formula (7-1) and Formula (7-2), "R" is an organic group,

Formula (8):

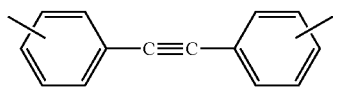

Formula (9):

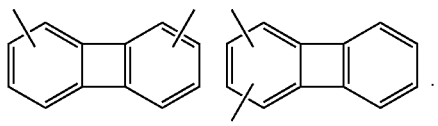

16. A resin composition comprising a benzoxazole resin precursor having a fifth repeating unit represented by the following Formula (13) and a cross-linking agent having at least two or more groups capable of causing a cross linking reaction in a molecule by reacting crosslinking agents to form a net-like structure and wherein the crosslinking agent has the formula $A(B)_p$, wherein A is an organic group which includes an adamantyl group, a 3,5-diphenyladamantyl group, a 3,5,7-triphenyladamantyl group, a 3,5,7,9-tetraphenyladamantyl group, a 1,1'-biadamantyl group, a 1,2'-biadamantyl group, a 2,2'-biadamantyl group, a 3,3'-diphenyl-1,1'-biadamantyl group, a 3,3',5,5'-tetraphenyl-1,1'-biadamantyl group, or a 3,3',5,5',7,7'-hexaphenyl-1,1'-biadamantyl group, p is at least two or more and B is a cross linking group capable of linking benzoxazole resin precursor and capable of linking with a cross-linking agent to form a net-like structure:

Formula (13):

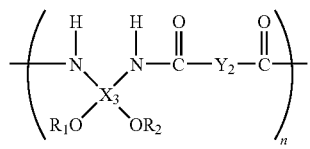

wherein, in the Formula (13), each of $R_1$ and $R_2$ is independently a hydrogen atom or an organic group; "n" is an integer of 2 to 1,000; $X_3$ is at least a group selected from the group consisting of groups represented by the following Formula (14) and Formula (15); $Y_2$ is at least a group selected from the group consisting of groups represented by the following Formula (11-1), Formula (11-2), Formula (12-1) and Formula (12-2); and the hydrogen atom of carbocycle contained in $X_3$ or $Y_2$ may be substituted with an alkyl group and/or fluoroalkyl group:

wherein, in the Formula (14), $X_2$ is an ethynyl group or a propargylether group; "Z" is —O—, —SO$_2$—, —CH$_2$—, —C(CH$_3$)$_2$—, —C(CF$_3$)$_2$— or an aromatic group; "Ar" is an aromatic group of trivalent or more; "R" is a hydrogen atom or an organic group; "r" is 0 or 1; and "q" is an integer of 1 to 4, Formula (15):

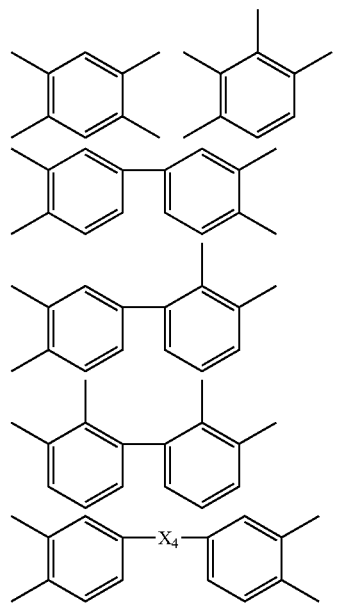

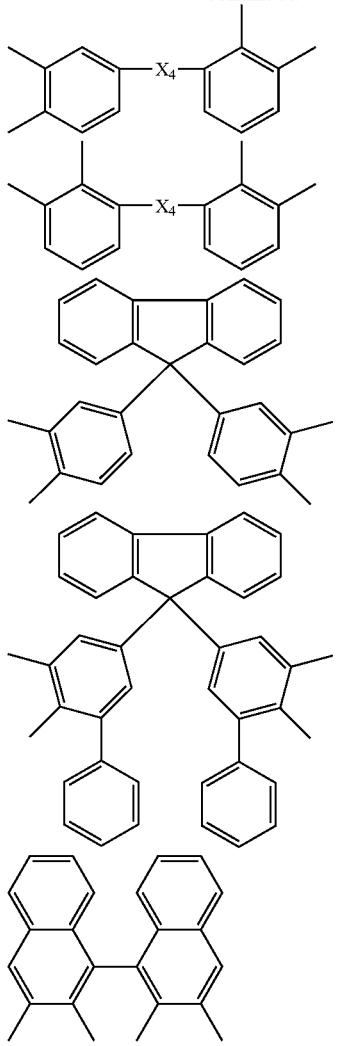
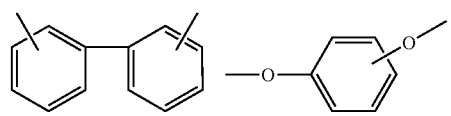
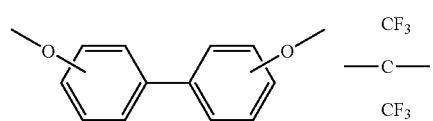
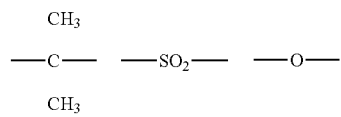
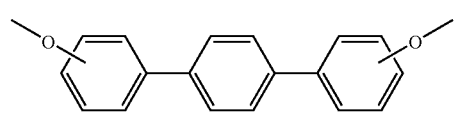
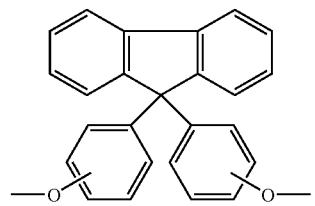
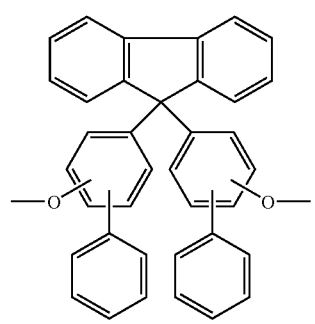
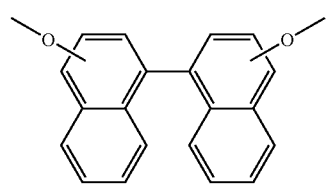
wherein, in the Formula (15), $X_4$ is at least a group selected from the group consisting of groups represented by the following Formula (16):
Formula (16):
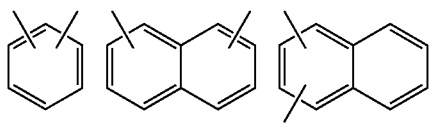
Formula (11-1)
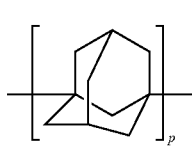 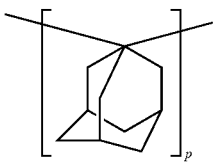

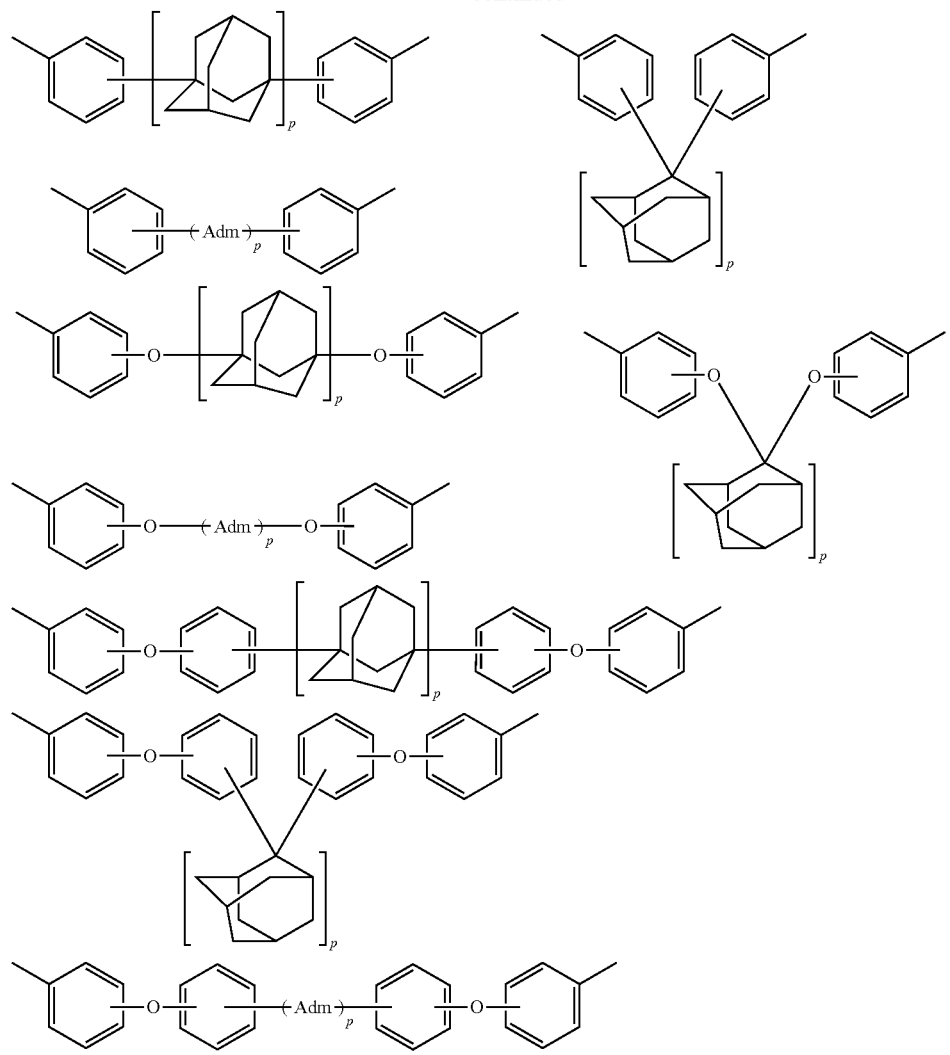
Formula (11-2)
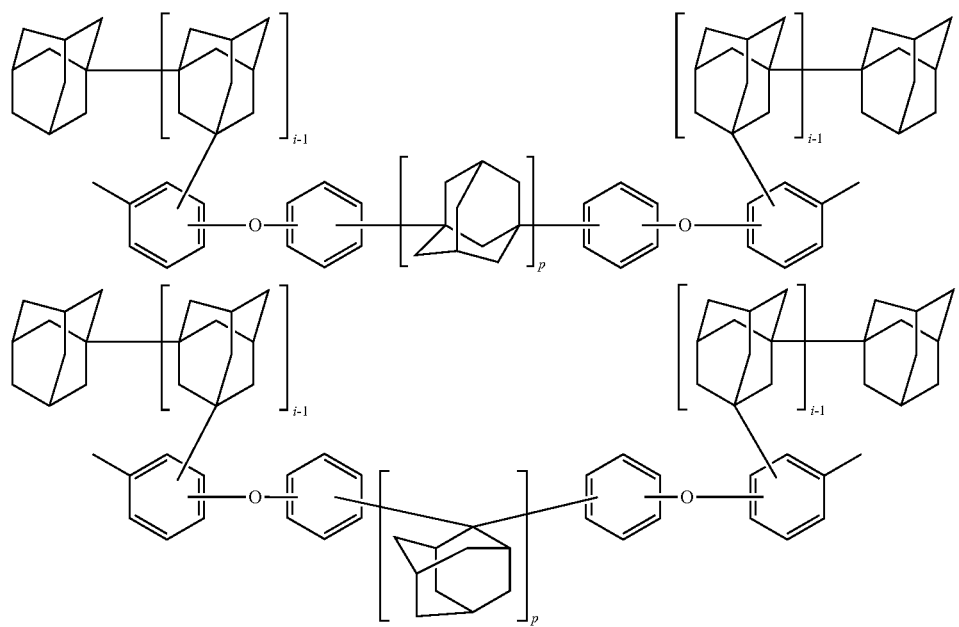

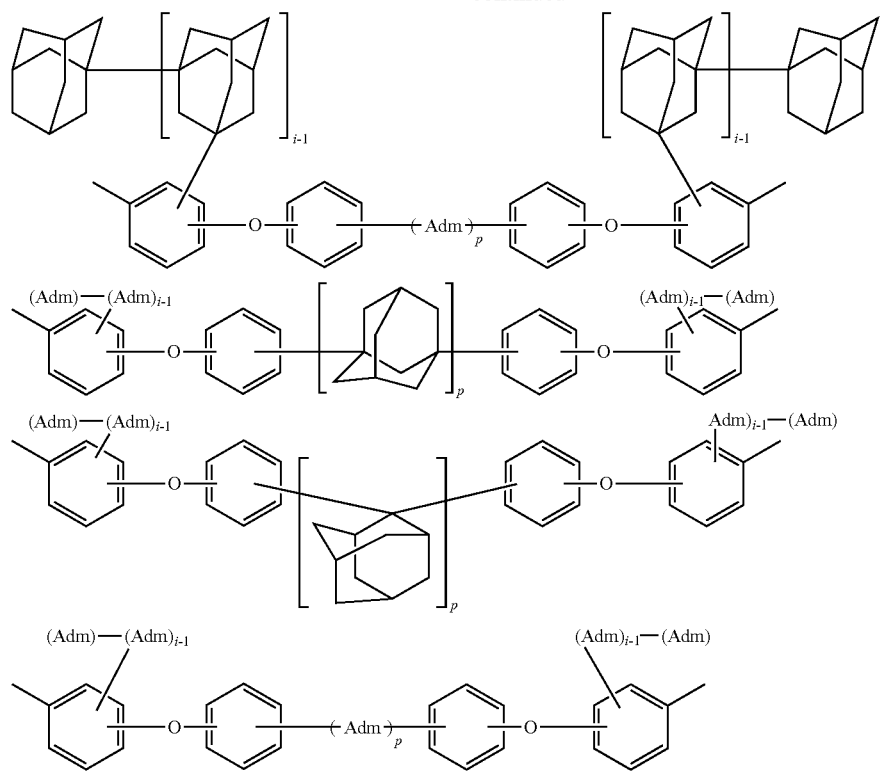
Formula (12-1)
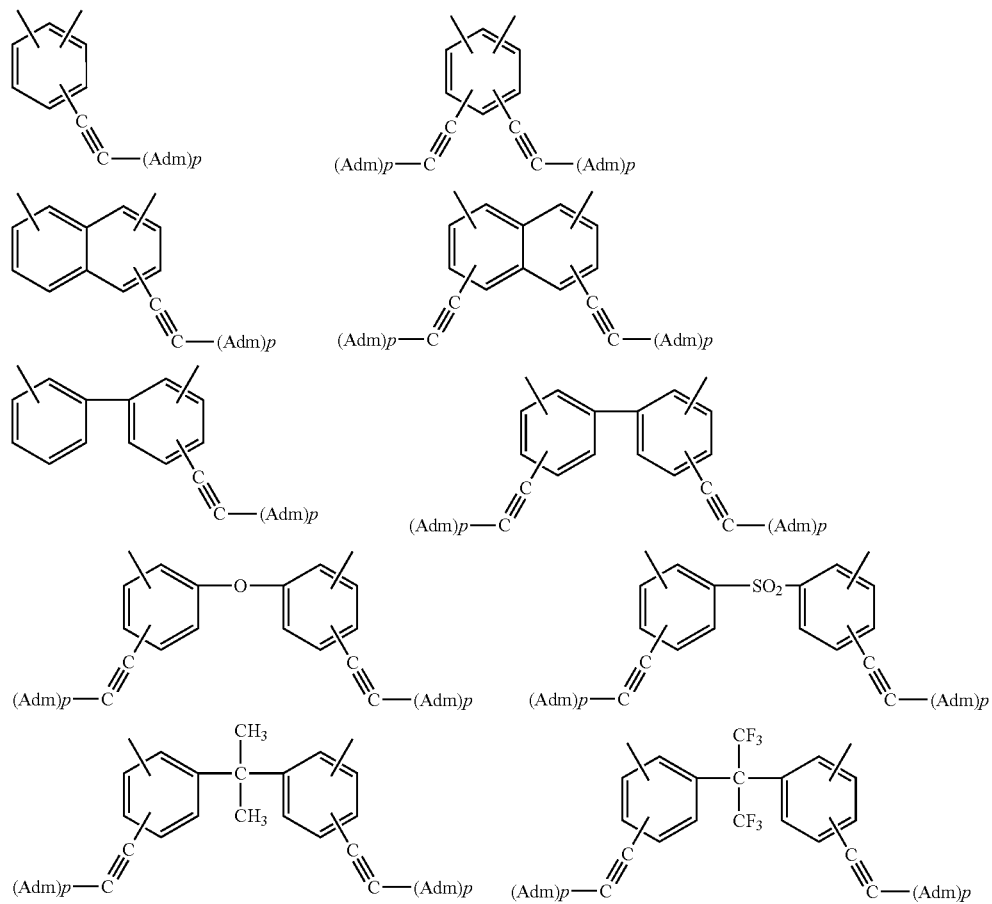

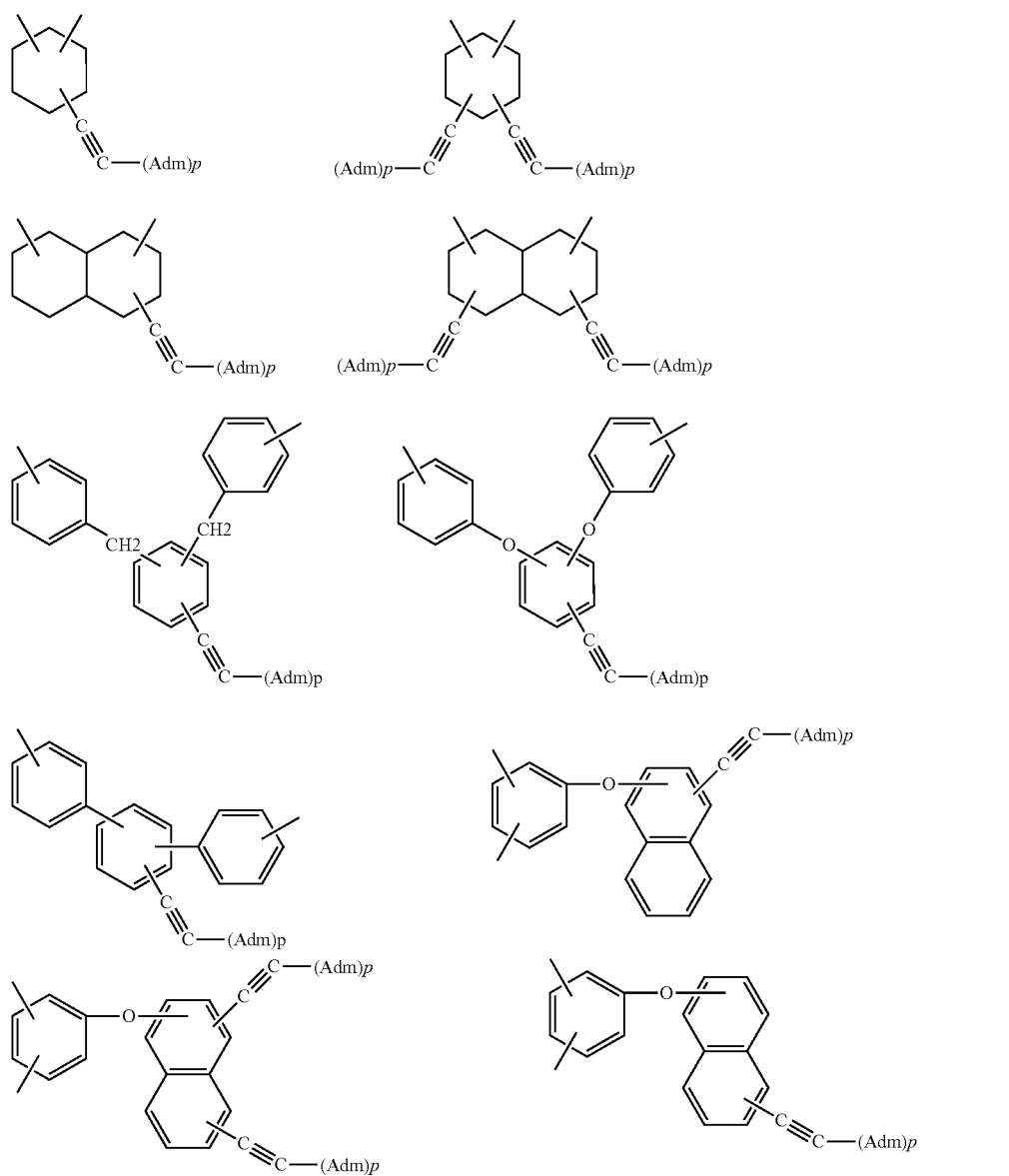
wherein, in the Formula (2-1) and Formula (2-2), "Adm" represents a diamondoid structural unit based on an adamantane structure; and "p" is from 1 to 12.
17. The resin composition according to claim 16, wherein the benzoxazole resin precursor having the fifth repeating unit further has a third repeating unit represented by the following Formula (1), a fourth repeating unit represented by the following Formula (10) or both of them:

Formula (1):

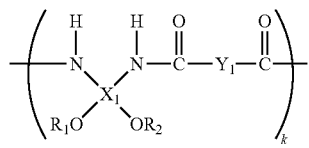

wherein, in the Formula (1), each of $R_1$ and $R_2$ is independently a hydrogen atom or an organic group; "k" is an integer of 2 to 1000; $X_1$ is at least a group selected from the group consisting of groups represented by the following Formula (2-1) and the following Formula (2-2) and groups represented by the following Formula (3); $Y_1$ is at least a group selected from the group consisting of groups represented by the following Formula (4), Formula (6-1), Formula (6-2), Formula (7-1), Formula (7-2), Formula (8) and Formula (9); and the hydrogen atom of carbocycle contained in $X_1$ and $Y_1$ may be substituted by an alkyl group and/or a fluoroalkyl group:

Formula (2-1):

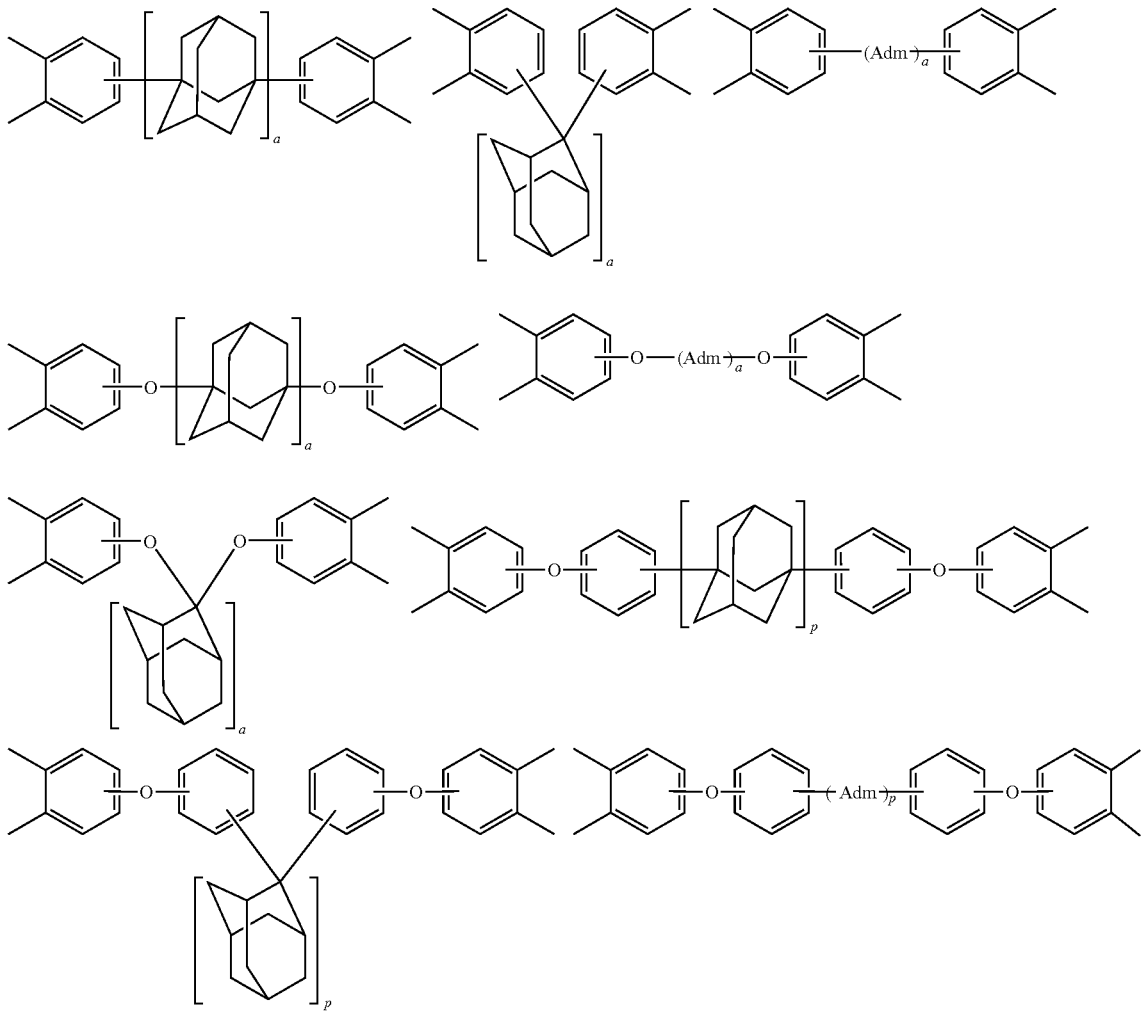

Formula (2-2):

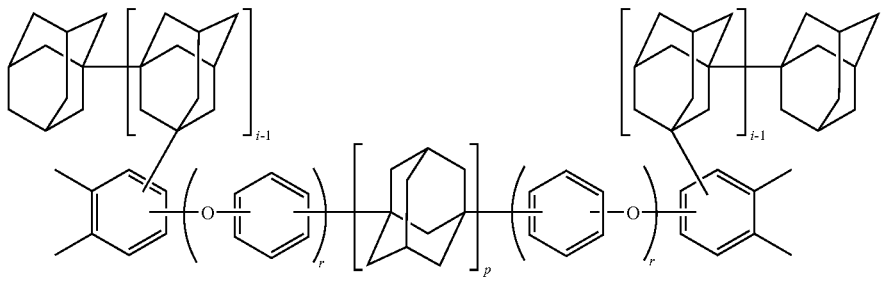

-continued
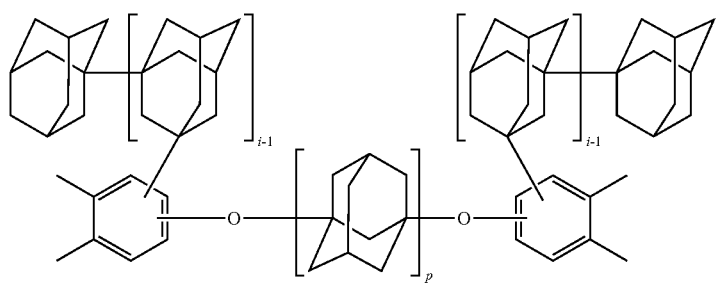
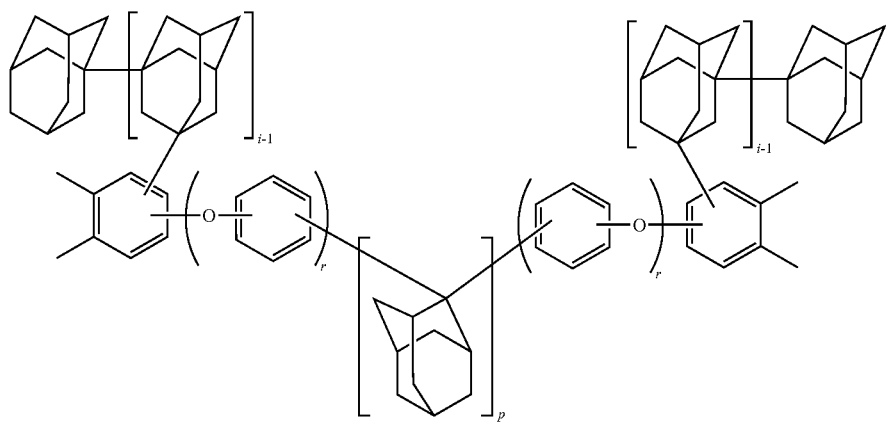
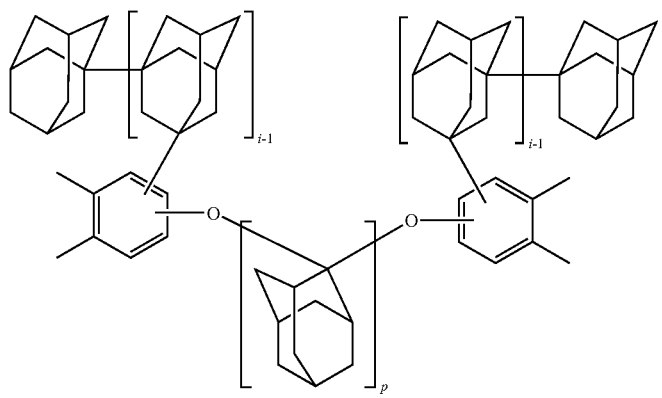
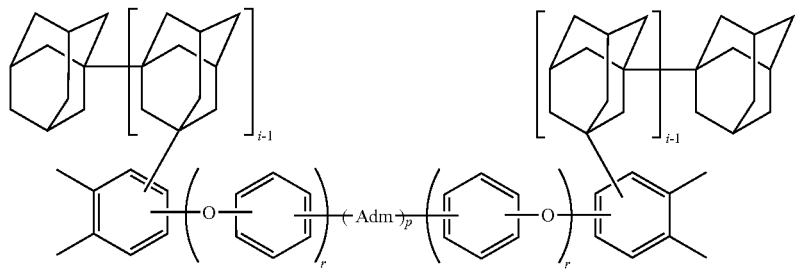
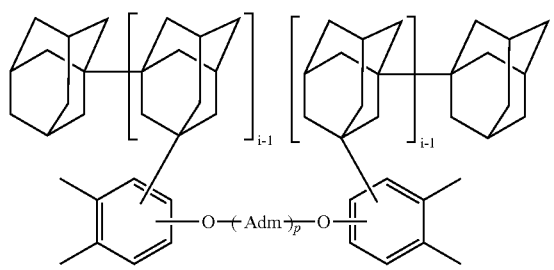

-continued

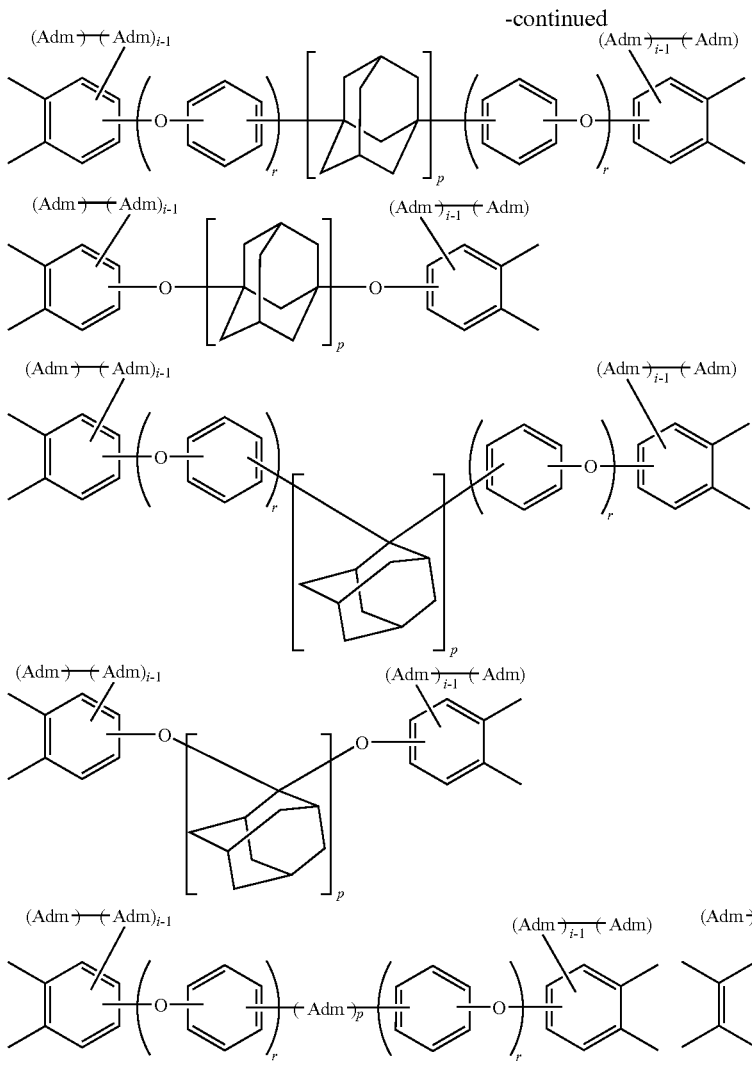

wherein, in the Formula (2-1) and Formula (2-2), "Adm" represents a diamondoid structural unit based on an adamantane structure; "a" is from 2 to 12; "p" is from 1 to 12; "i" is from 1 to 12; and "r" is 0 or 1, Formula (3):

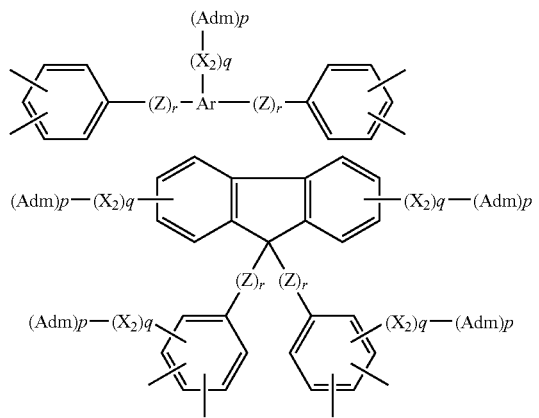

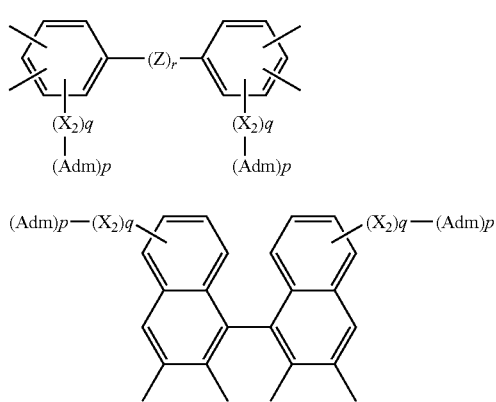

wherein, in the Formula (3), "Adm" represents a diamondoid structural unit based on an adamantane structure; "p" is from 1 to 12; $X_2$ is an ethynyl group or a propargylether group; "Z" is —O—, —$SO_2$—, —$CH_2$—, —$C(CH_3)_2$—, —$C(CF_3)_2$— or an aromatic group; Ar is an aromatic group of trivalent or more; "r" is 0 or 1; and "q" is an integer of 1 to 4;

Formula (4):
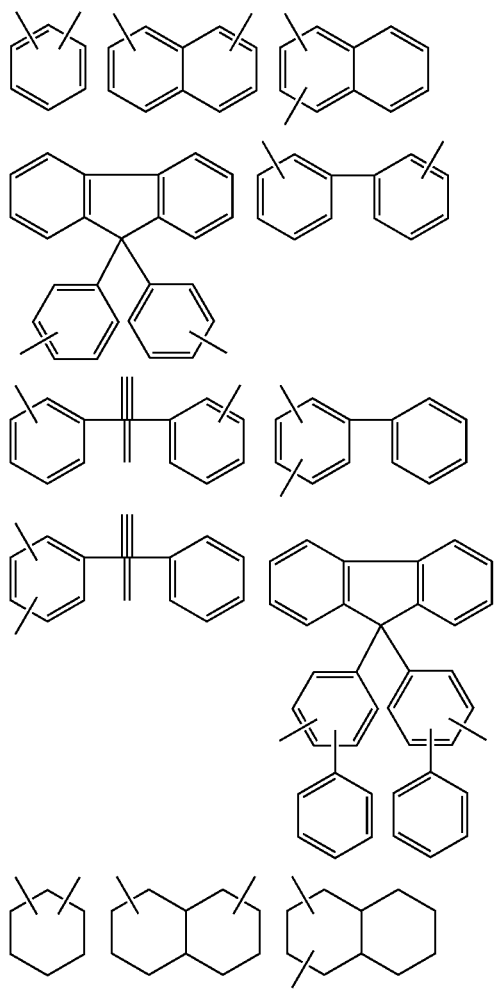
wherein, in the Formula (4), "W" is at least a group selected from the group consisting of groups represented by the following Formula (5):
Formula (5):
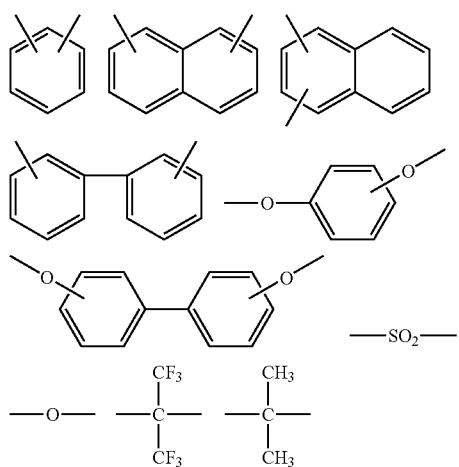
-continued
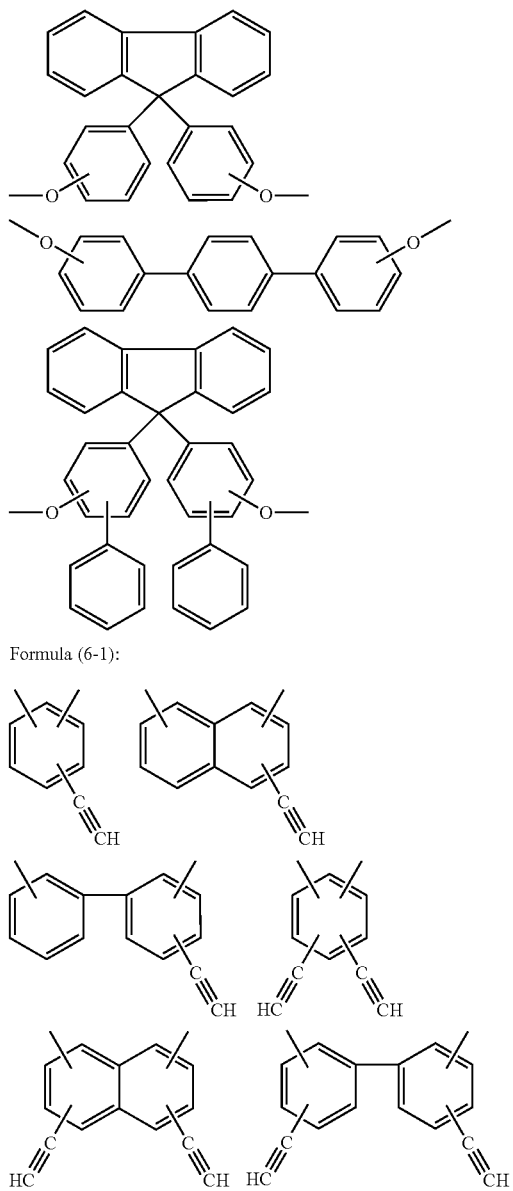
Formula (6-1):
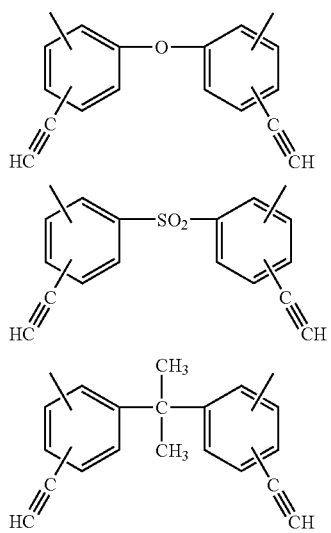

-continued
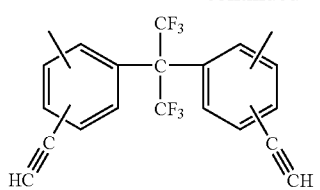
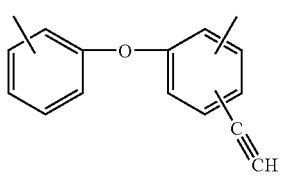
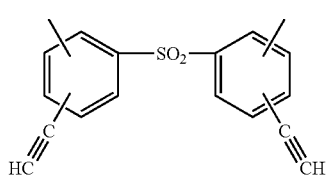
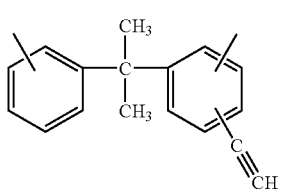
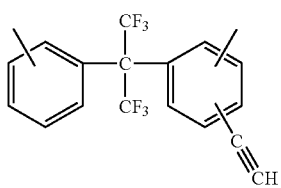
Formula (6-2):
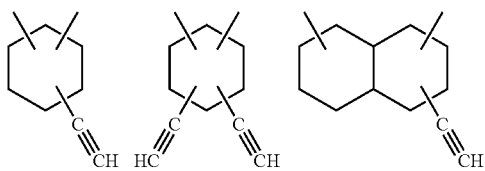
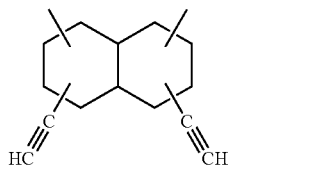
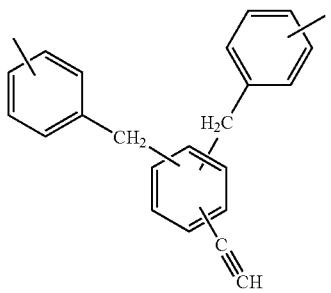
-continued
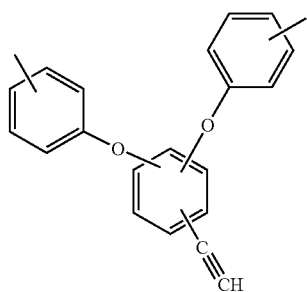
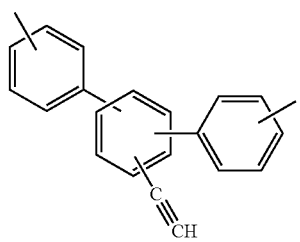
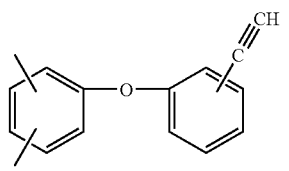
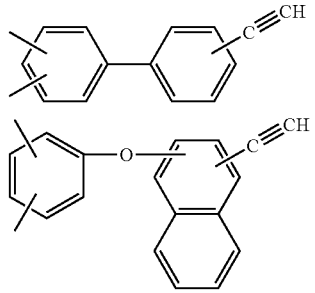
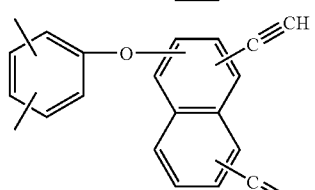
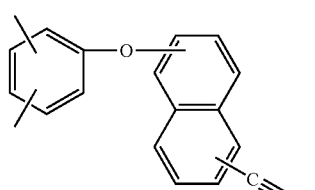
Formula (7-1):
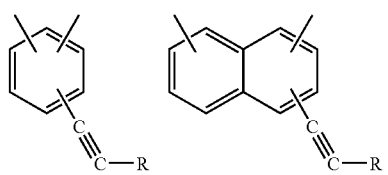

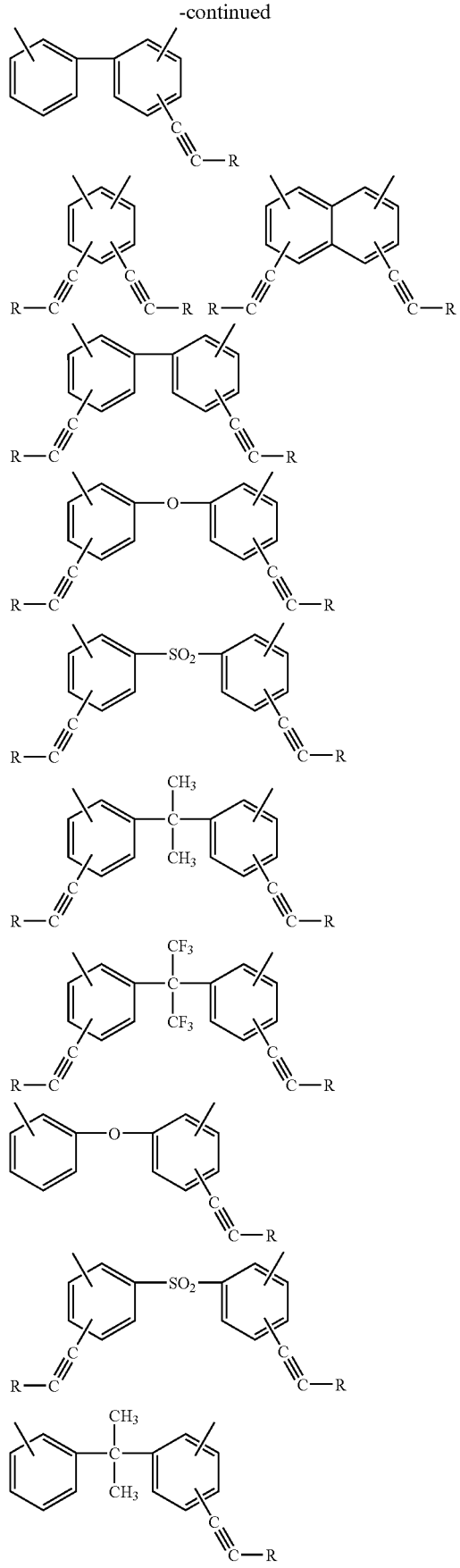
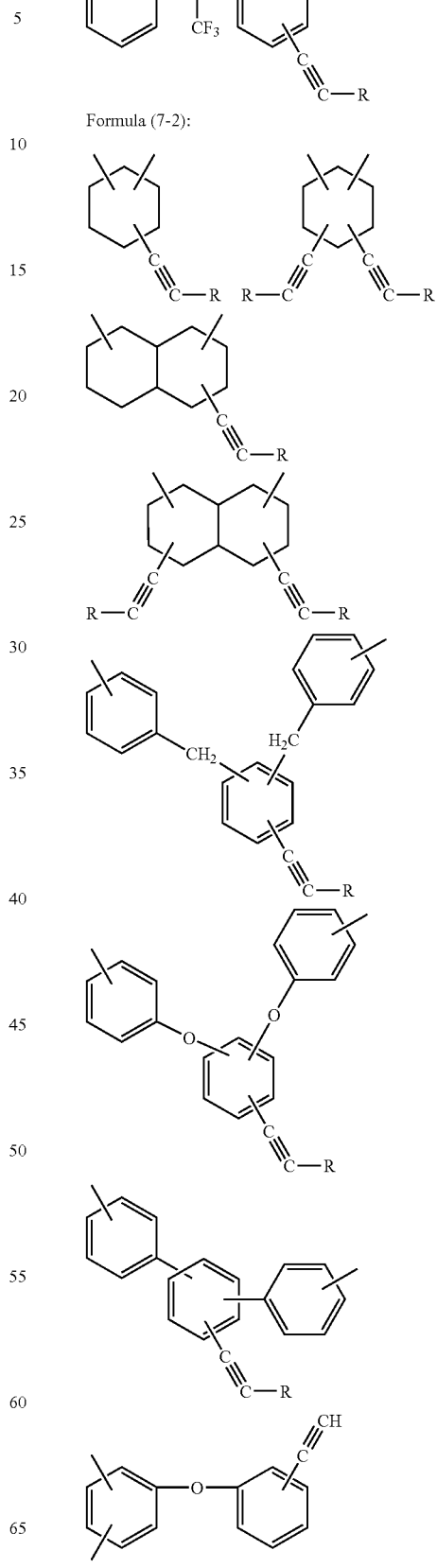
Formula (7-2):

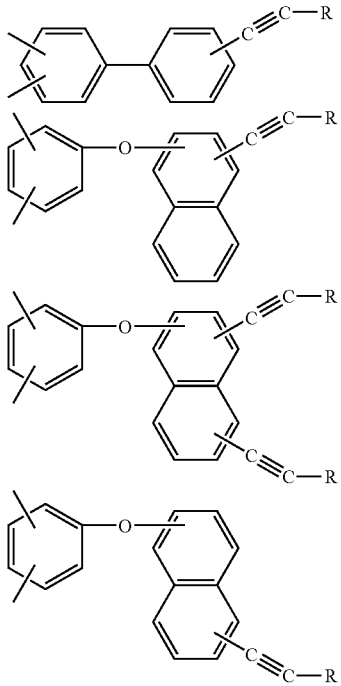

wherein, in the Formula (7-1) and Formula (7-2), "R" is an organic group,

Formula (8):

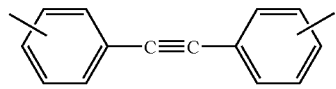

Formula (9):

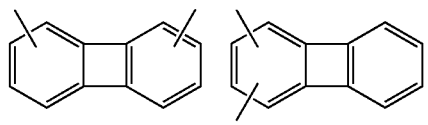

Formula (10):

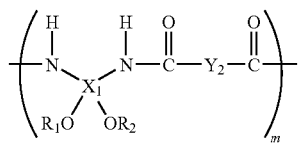

wherein, in the Formula (10), each of $R_1$ and $R_2$ is independently a hydrogen atom or an organic group; "m" is an integer of 2 to 1000; $X_1$ is at least a group selected from the group consisting of groups represented by the Formula (2-1), Formula (2-2) and Formula (3); $Y_2$ is at least a group selected from the group consisting of groups represented by the Formula (11-1), Formula (11-2), Formula (12-1) and Formula (12-2); and the hydrogen atom of carbocycle contained in $X_1$ and $Y_2$ may be substituted by an alkyl group and/or a fluoroalkyl group:

Formula (11-1):

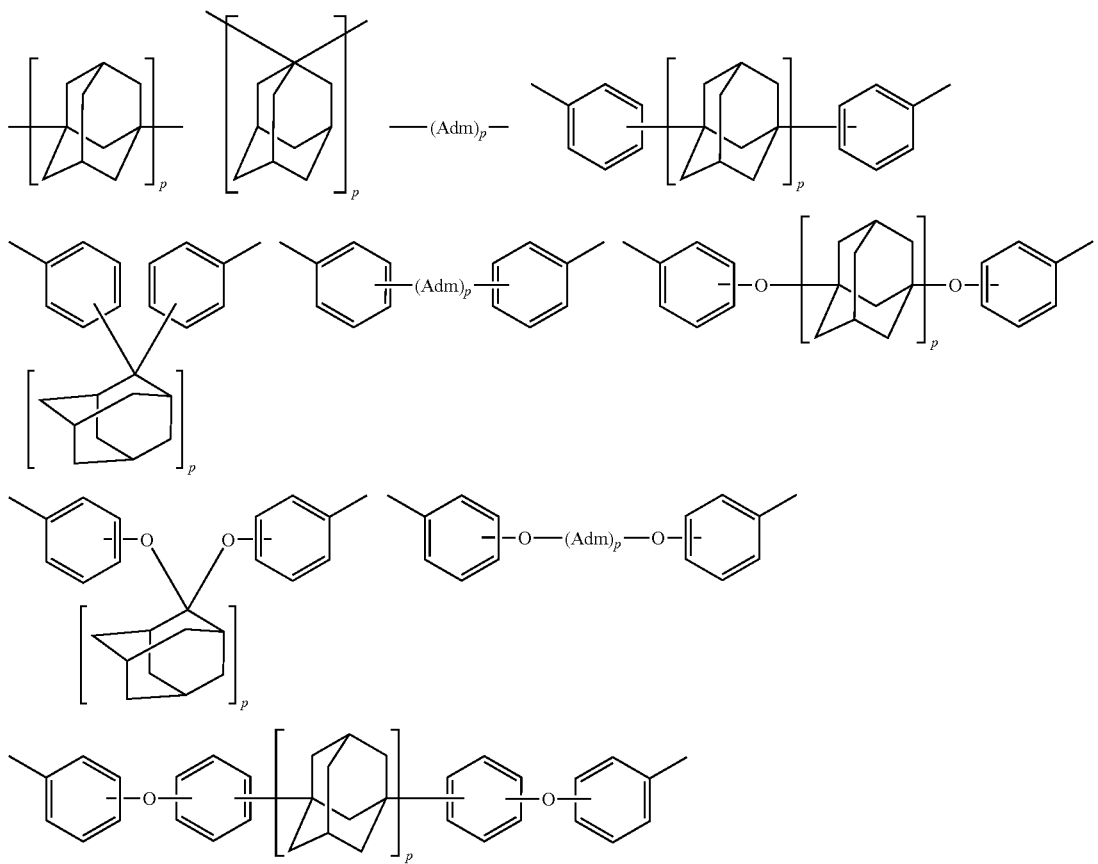

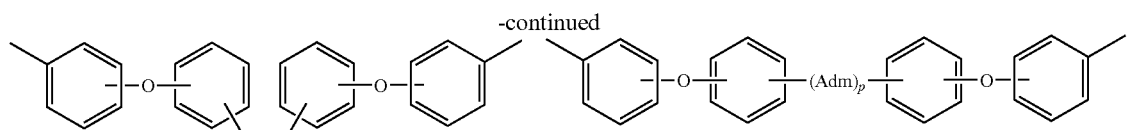
Formula (11-2):
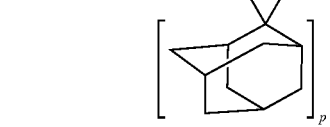
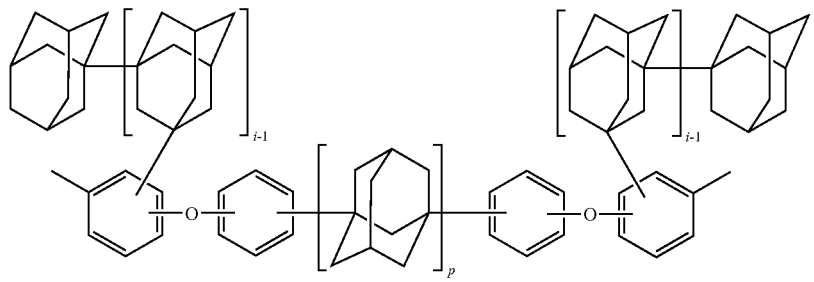
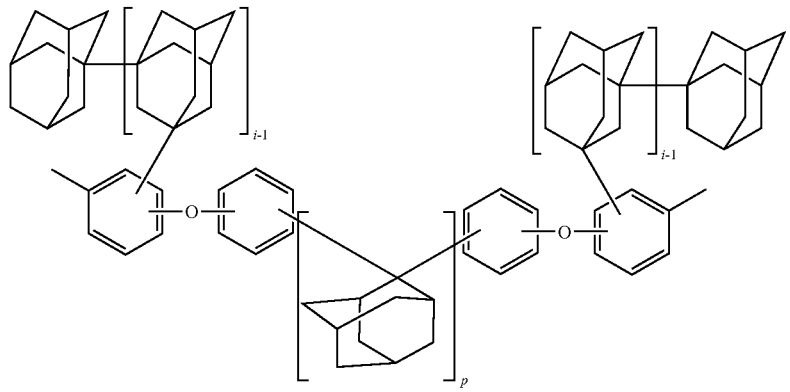
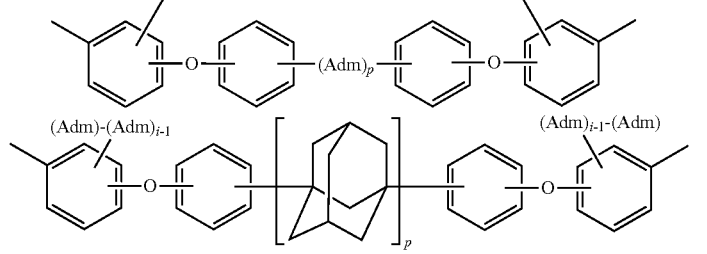
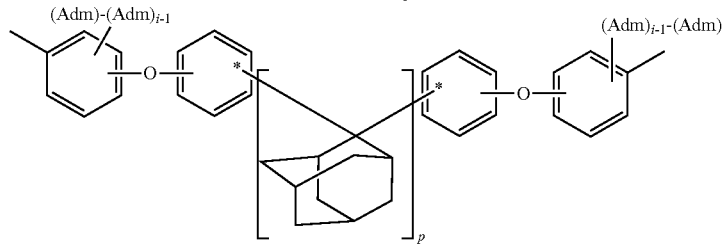
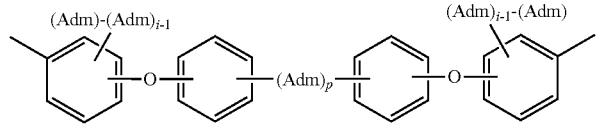

Formula (12-1):
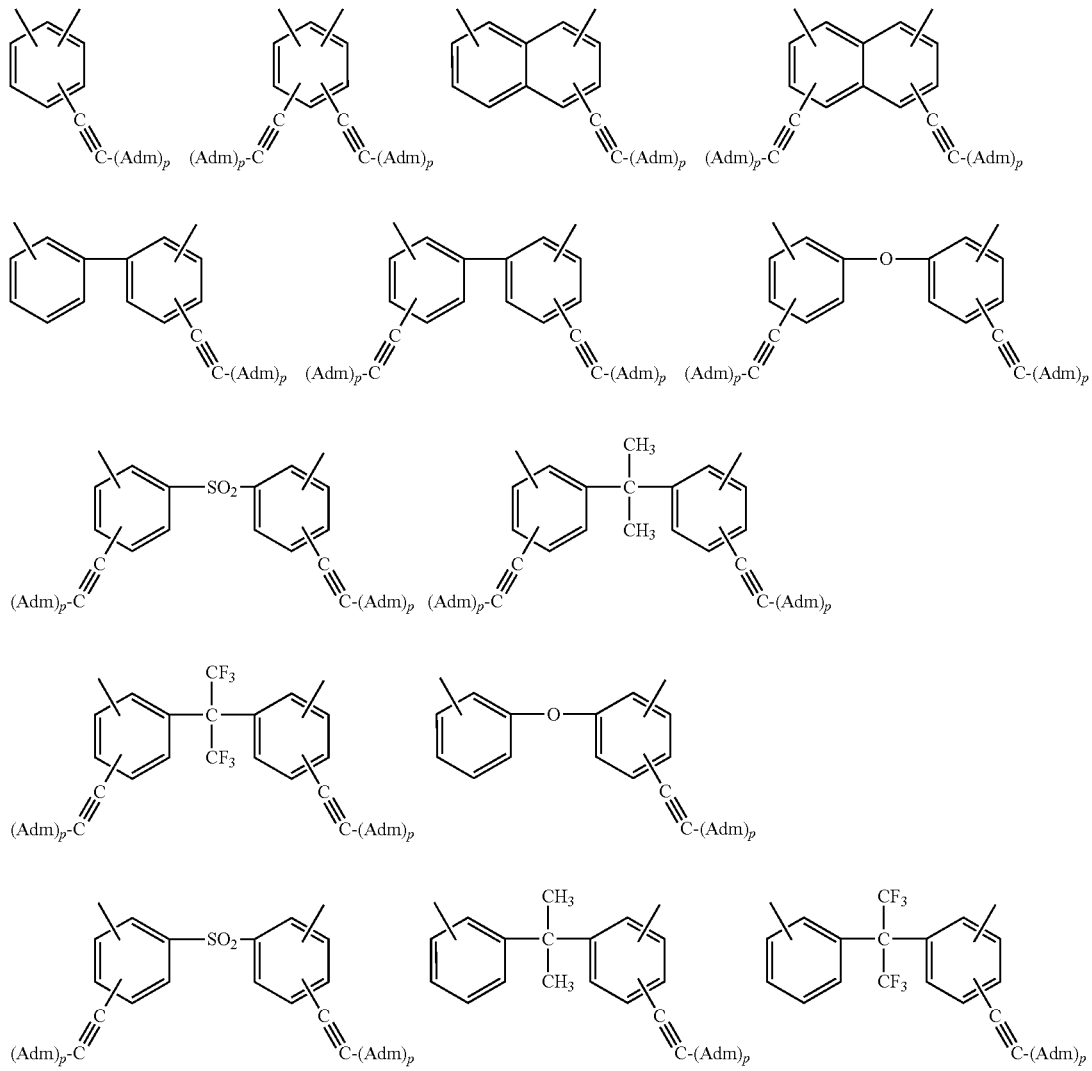
Formula (12-2):
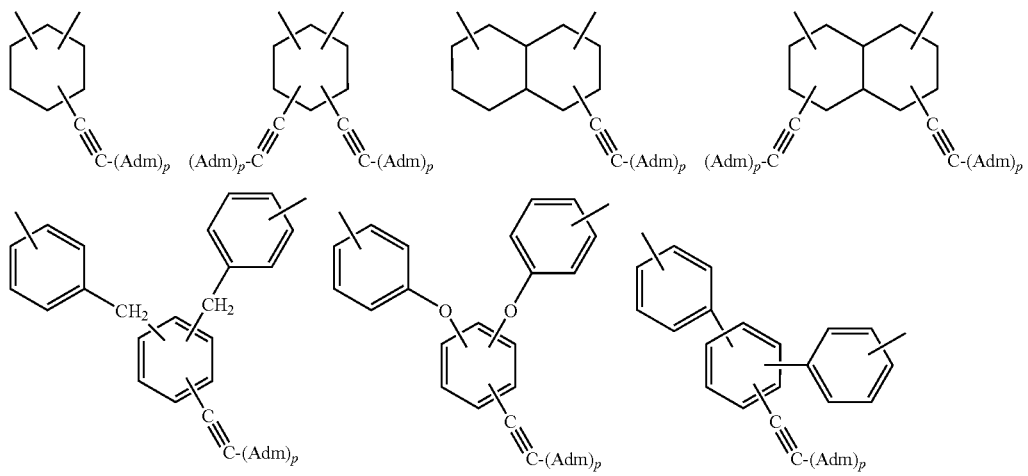

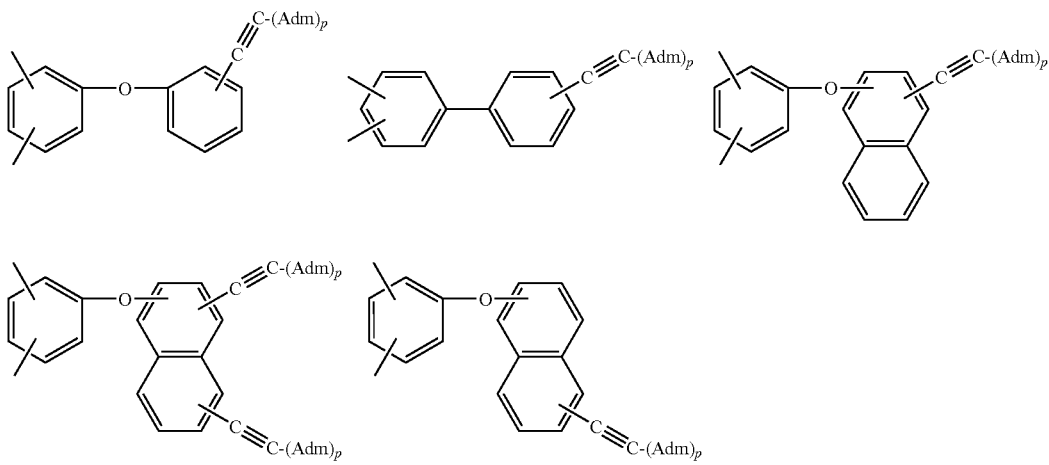

wherein, in the following Formula (11-1), Formula (11-2), Formula (12-1) and Formula (12-2), "Adm" represents a diamondoid structural unit based on an adamantane structure; "p" is from 1 to 12; and "i" is from 1 to 12.

18. The resin composition according to any one of claims 13 to 17, wherein the benzoxazole resin precursor having the third repeating unit defined in claim 13, the fourth repeating unit defined in claim 14 or the fifth repeating unit defined in claim 16, or two or more repeating units selected from them further has a sixth repeating unit represented by the following Formula (17):

Formula (17):

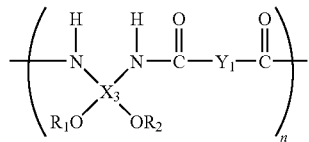

wherein, in the Formula (17), each of $R_1$ and $R_2$ is independently a hydrogen atom or an organic group; "n" is an integer of 2 to 1,000; $X_3$ is at least a group selected from the group consisting of groups represented by the Formua (14) and Formula (15); $Y_1$ is at least a group selected from the group consisting of groups represented by the Formula (4), Formula (6-1), Formula (6-2), Formula (7-1), Formula (7-2), Formula (8) and Formula (9); and a hydrogen atom of carbocycle contained in $X_3$ and $Y_1$ may be substituted with an alkyl group and/or a fluoroalkyl group.

19. The resin composition according to any one of claims 1, 2, 13, 14 and 16, wherein the resin composition contains a polybenzoxazole resin obtained by a dehydration and ring-closure reaction of the benzoxazole resin precursor defined by any one of claims 1, 2, 13, 14 and 16.

20. A resin composition comprising:
a benzoxazole resin precursor composition containing, as an essential component, a benzoxazole resin precursor having a third repeating unit represented by the following Formula (1), a benzoxazole resin precursor having a fourth repeating unit represented by the following Formula (10) or a benzoxazole resin precursor having a fifth repeating unit represented by the following Formula (13), and two or more kinds selected from the group consisting of the benzoxazole resin precursor having the third repeating unit, the benzoxazole resin precursor having the forth repeating unit, the benzoxazole resin precursor having the fifth repeating unit and a benzoxazole resin precursor having a sixth repeating unit represented by the following Formula (17), and a cross-linking agent having at least two or more groups capable of causing a cross linking reaction in a molecule by reacting crosslinking agents to form a net-like structure and wherein the crosslinking agent has the formula $A(B)_p$, wherein A is an organic group which includes adamantyl group, a 3,5-diphenyladamantyl group, a 3,5,7-triphenyladamantyl group, a 3,5,7,9-tetraphenyladamantyl group, a 1,1'-biadamantyl group, a 1,2'-biadamantyl group, a 2,2'-biadamantyl group, a 3,3'-diphenyl-1,1'-biadamantyl group, a 3,3',5,5'-tetraphenyl-1,1'-biadamantyl group, or a 3,3',5,5',7,7'-hexaphenyl-1,1'-biadamantyl group, p is at least two or more and B is a cross linking group capable of linking benzoxazole resin precursor and capable of linking with a cross-linking agent to form a net-like structure:

Formula (1):

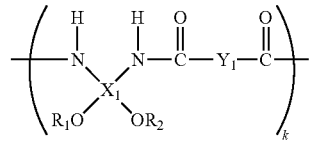

wherein, in the Formula (1), each of $R_1$ and $R_2$ is independently a hydrogen atom or an organic group; "k" is an integer of 2 to 1000; $X_1$ is at least a group selected from the group consisting of groups represented by the following Formula (2-1) and the following Formula (2-2) and groups represented by the following Formula (3); $Y_1$ is at least a group selected from the group consisting of groups represented by the following Formula (4), Formula (6-1), Formula (6-2), (7-1), Formula (7-2), Formula (8) and Formula (9); and the hydrogen atom of carbocycle contained in $X_1$ and $Y_1$ may be substituted by an alkyl group and/or a fluoroalkyl group:

Formula (2-1):
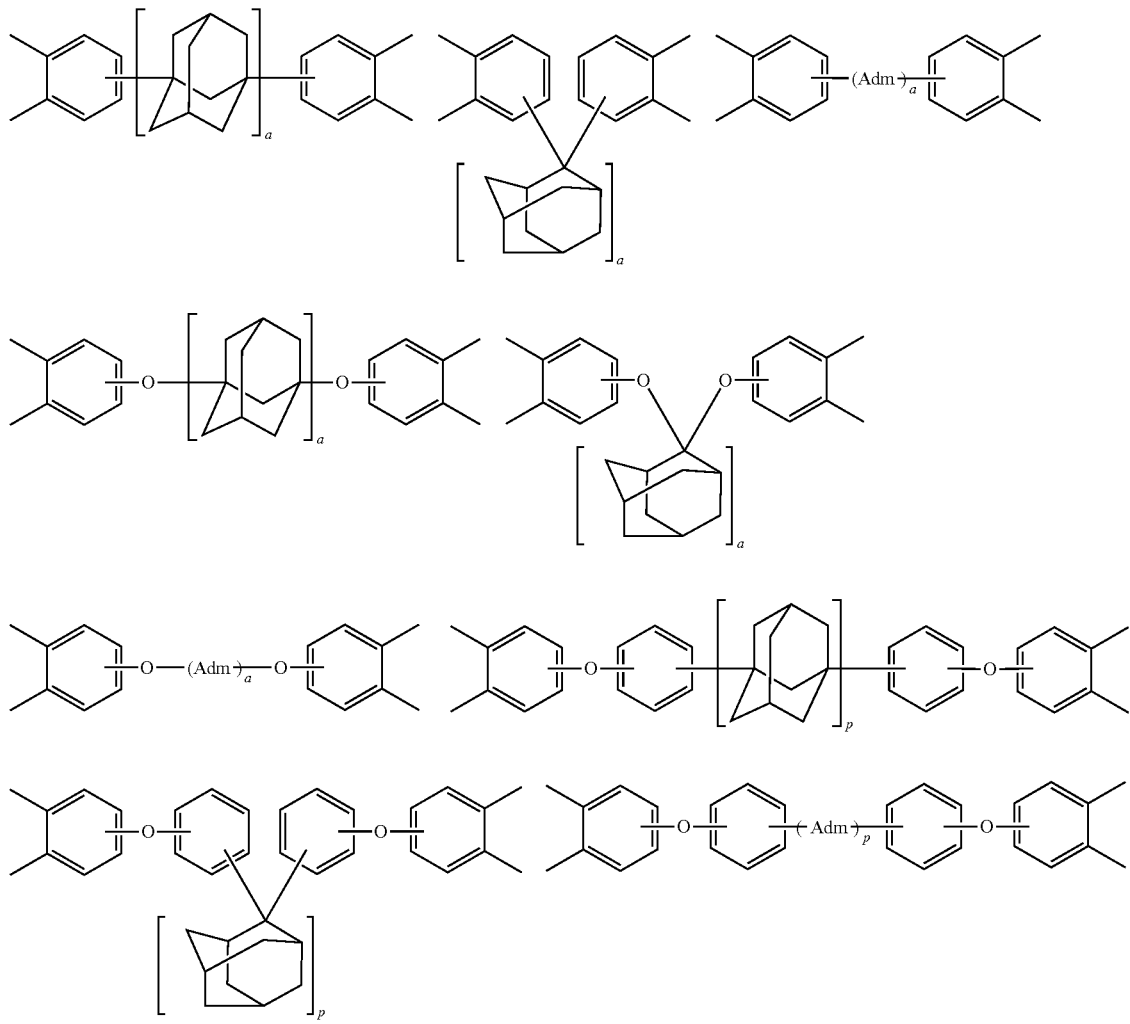
Formula (2-2):
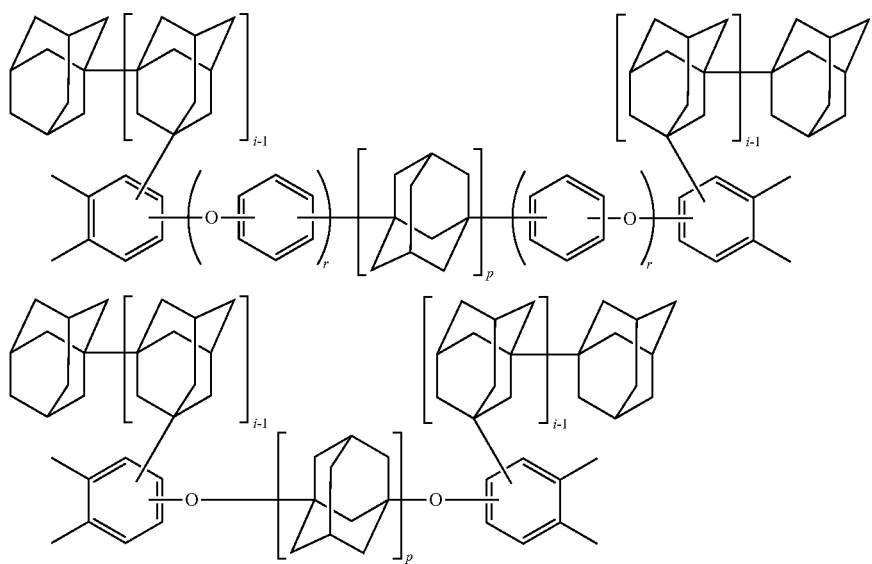

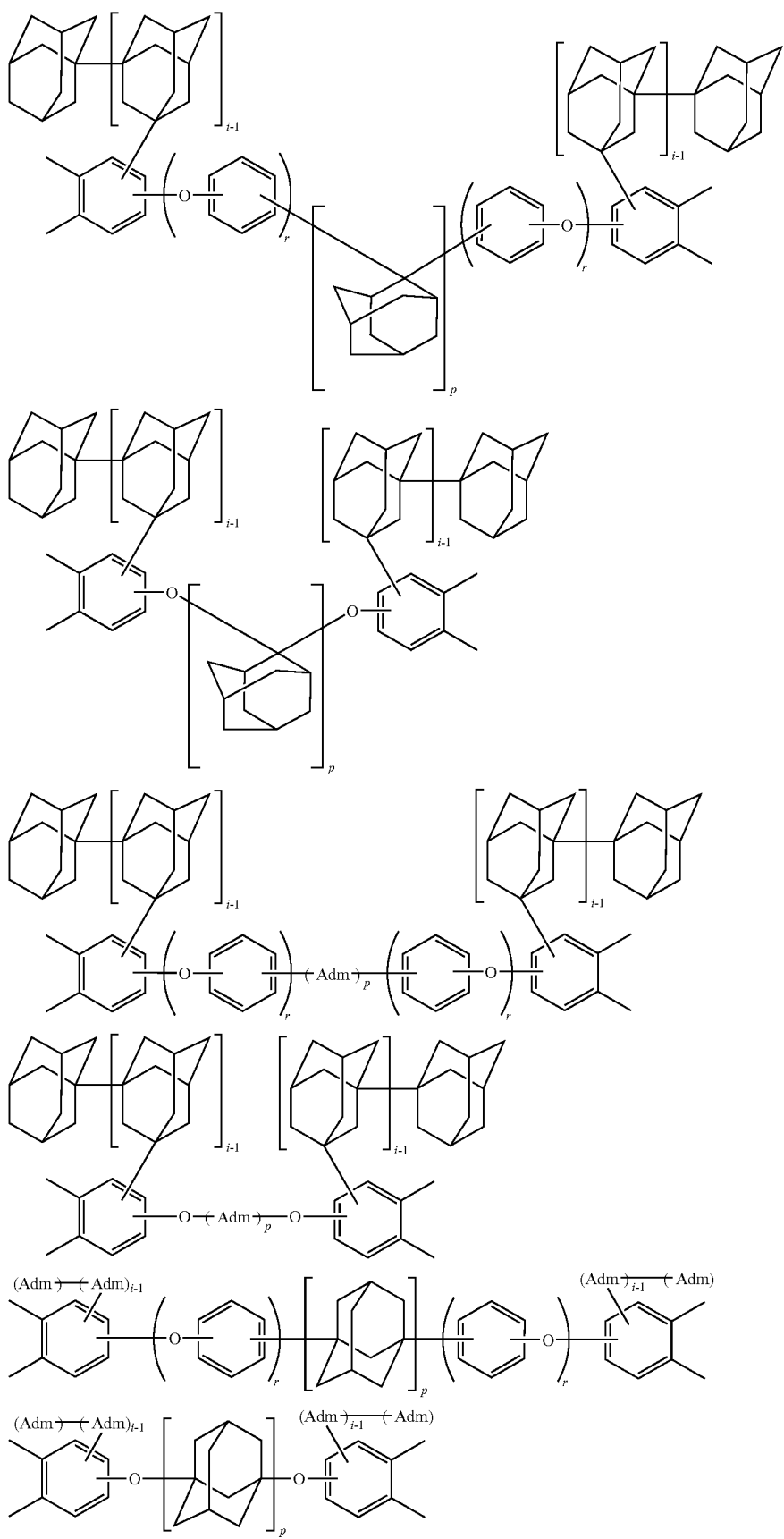

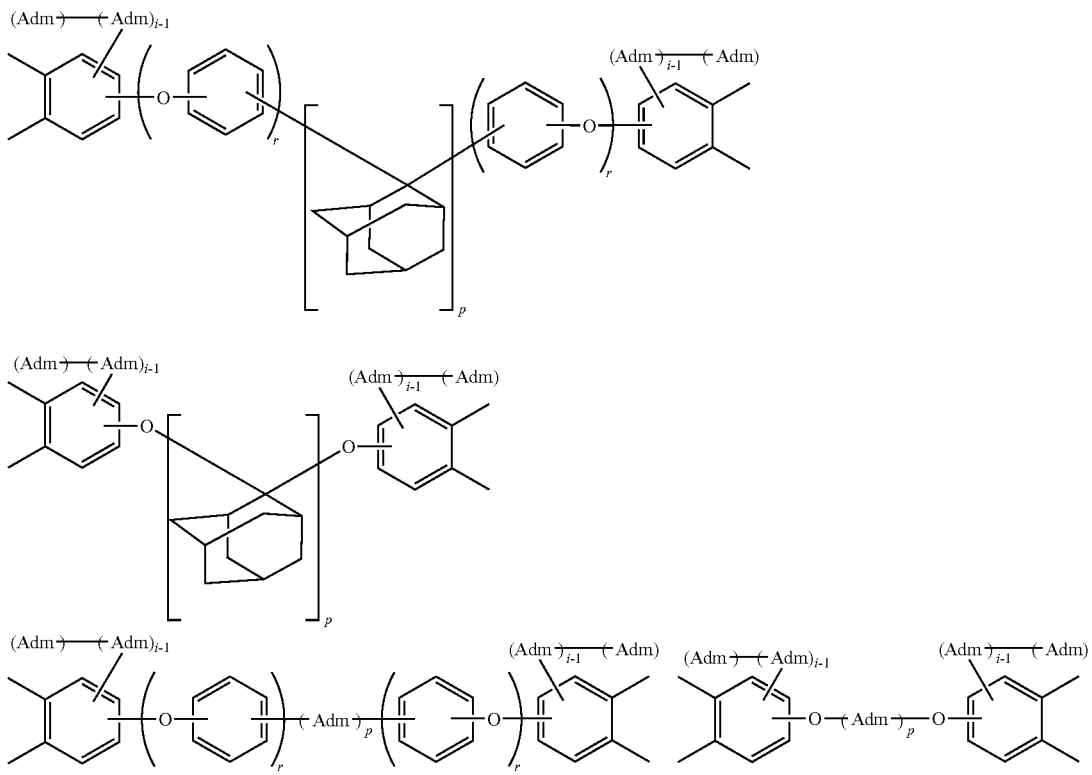

wherein, in the Formula (2-1) and Formula (2-2), "Adm" represents a diamondoid structural unit based on an adamantane structure; "a" is from 2 to 12; "p" is from 1 to 12; "i" is from 1 to 12; and "r" is 0 or 1, Formula (3):

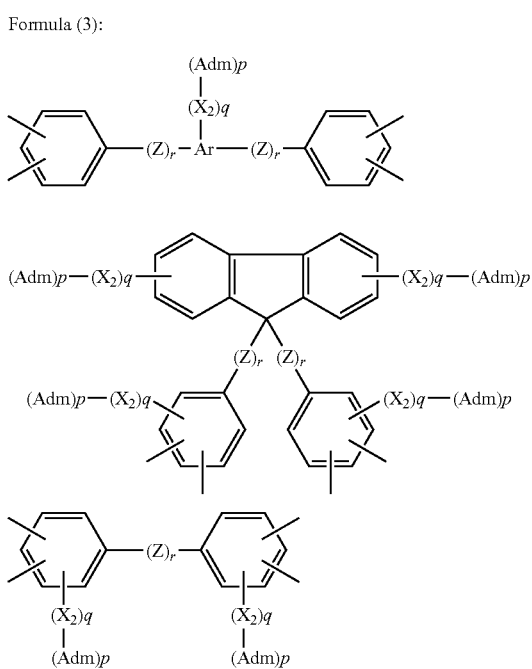

-continued

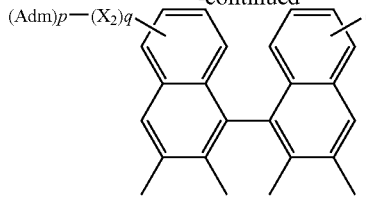

wherein, in the Formula (3), "Adm" represents a diamondoid structural unit based on an adamantane structure; "p" is from 1 to 12; $X_2$ is an ethynyl group or a propargylether group; "Z" is —O—, —$SO_2$—, —$CH_2$—, —$C(CH_3)_2$—, —$C(CF_3)_2$— or an aromatic group; Ar is an aromatic group of trivalent or more; "r" is 0 or 1; and "q" is an integer of 1 to 4;

Formula (4):

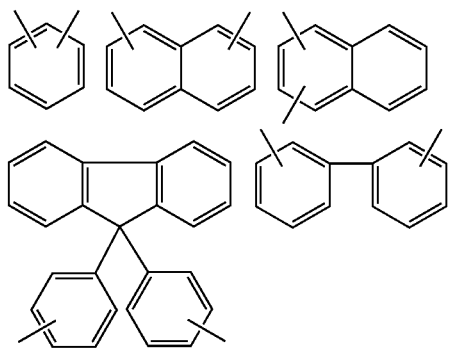

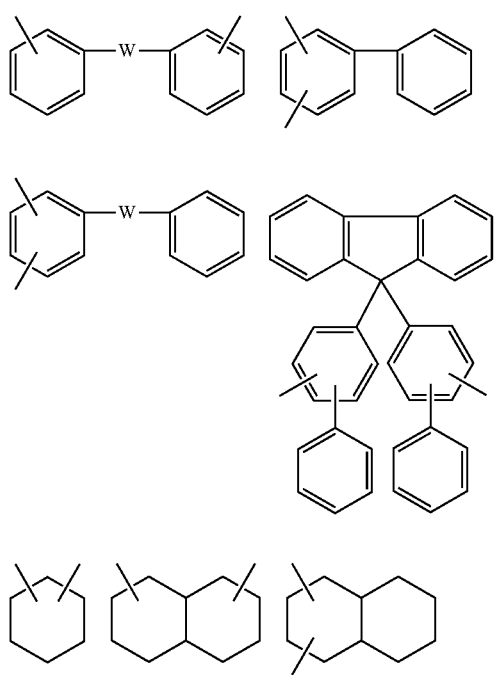
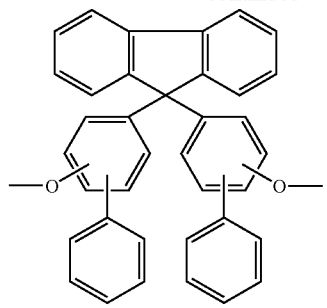
Formula (6-1):
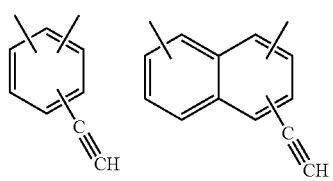
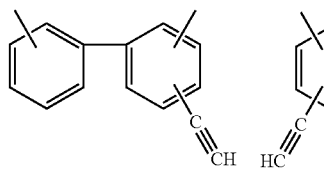
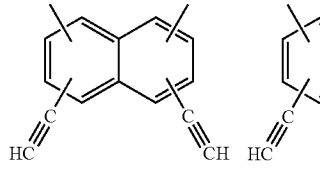
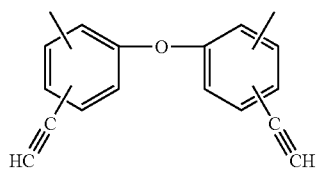
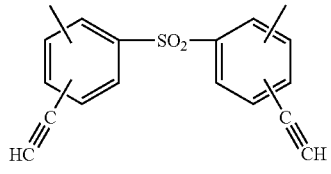
wherein, in the Formula (4), "W" is at least a group selected from the group consisting of groups represented by the following Formula (5):
Formula (5):
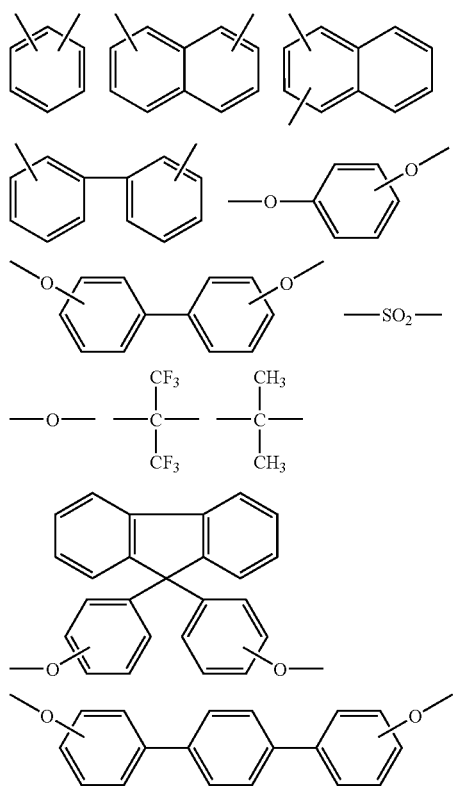
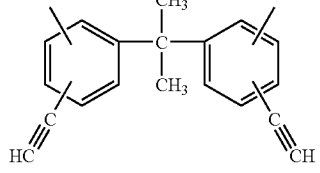
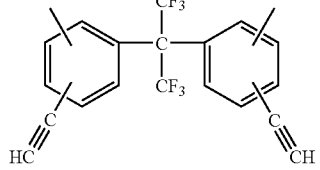
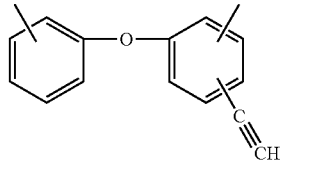

-continued
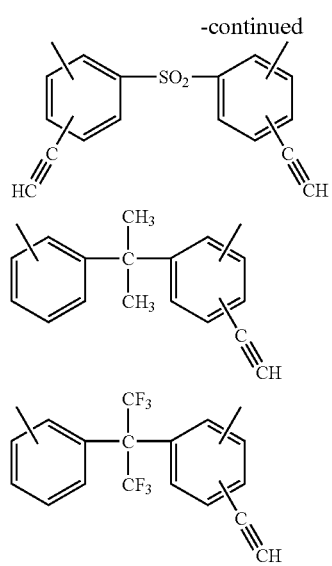
Formula (6-2):
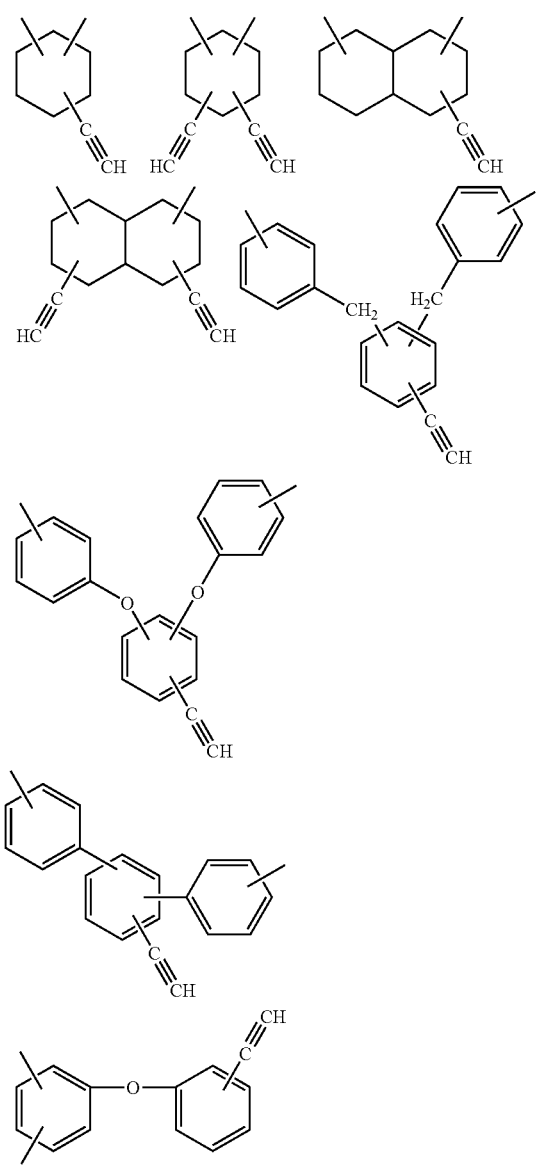
-continued
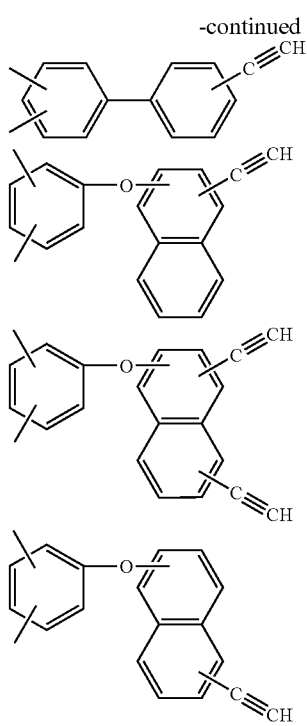
Formula (7-1):
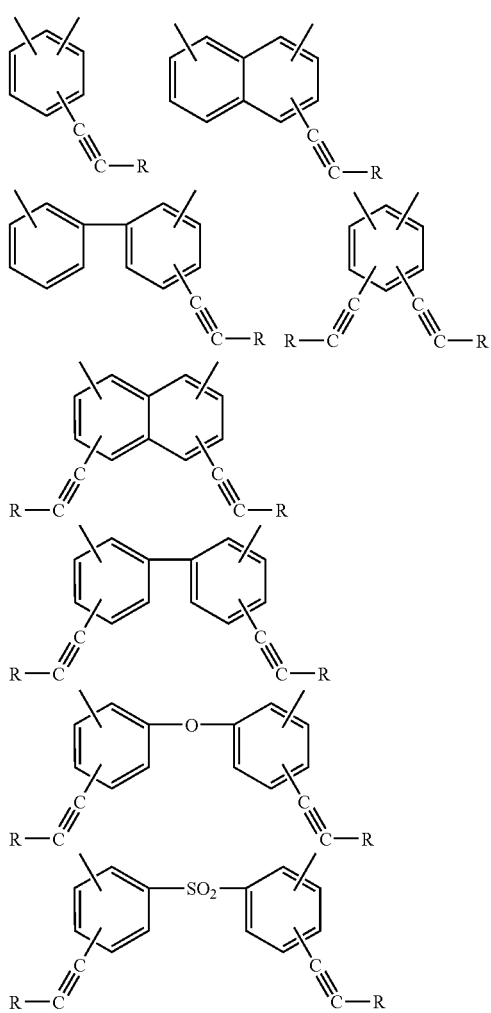

-continued
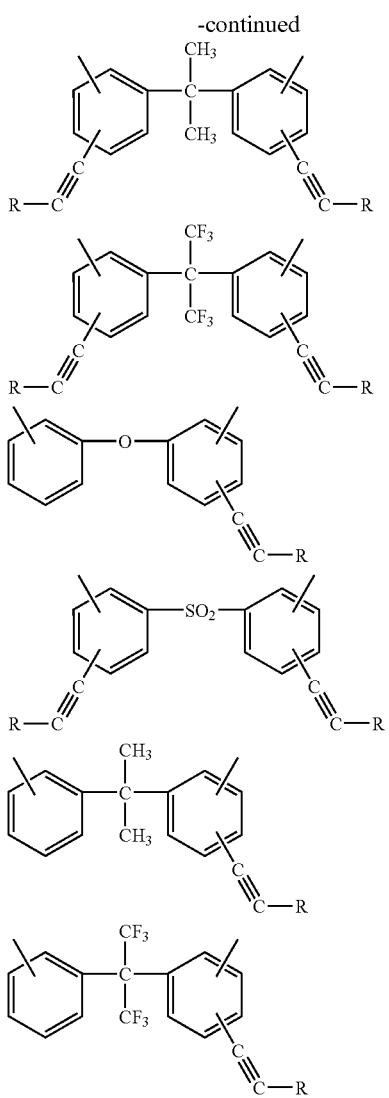
Formula (7-2):
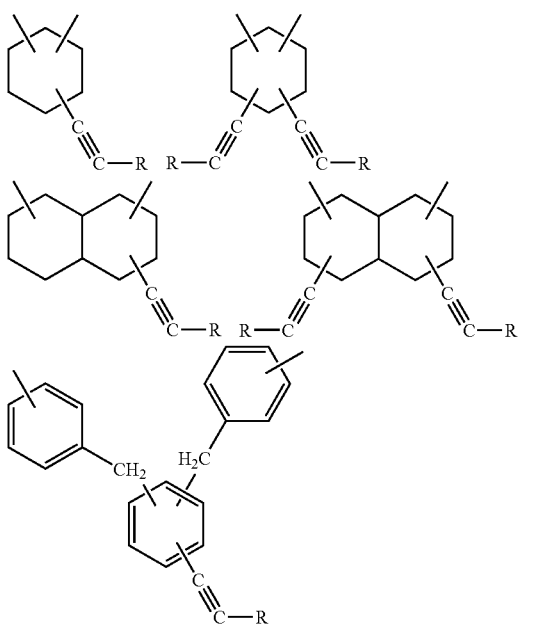
-continued
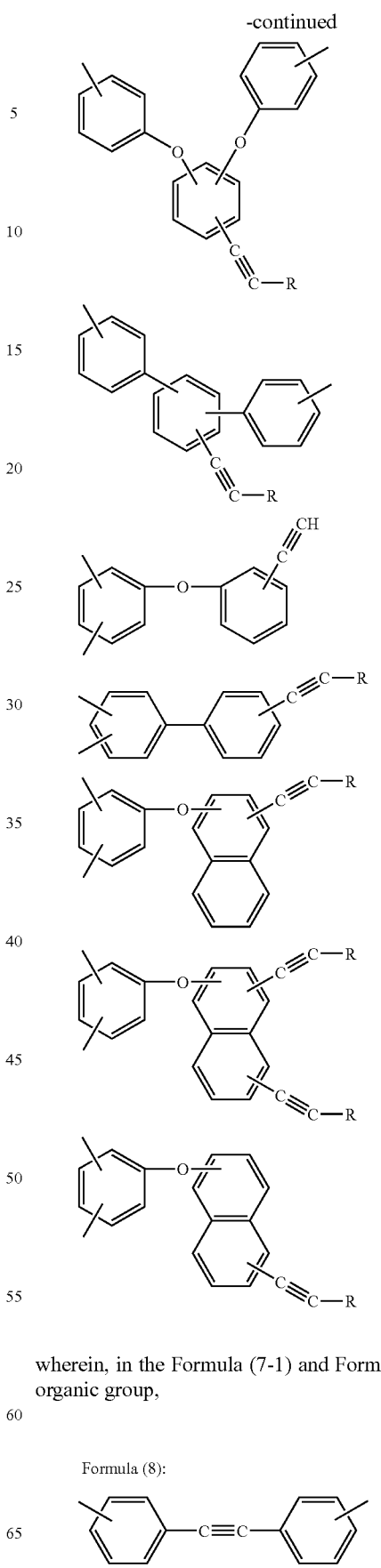
wherein, in the Formula (7-1) and Formula (7-2), "R" is an organic group,
Formula (8):
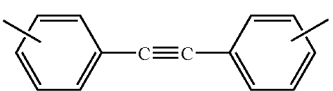

Formula (9):

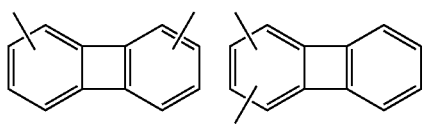

Formula (10):

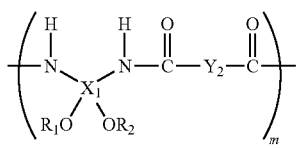

wherein, in the Formula (10), each of $R_1$ and $R_2$ is independently a hydrogen atom or an organic group; "m" is an integer of 2 to 1000; $X_1$ is at least a group selected from the group consisting of groups represented by the Formula (2-1), Formula (2-2) and Formula (3); $Y_2$ is at least a group selected from the group consisting of groups represented by the following Formula (11-1), Formula (11-2), Formula (12-1) and Formula (12-2); and the hydrogen atom of carbocycle contained in $X_1$ and $Y_2$ may be substituted by an alkyl group and/or a fluoroalkyl group:

Formula (11-1):

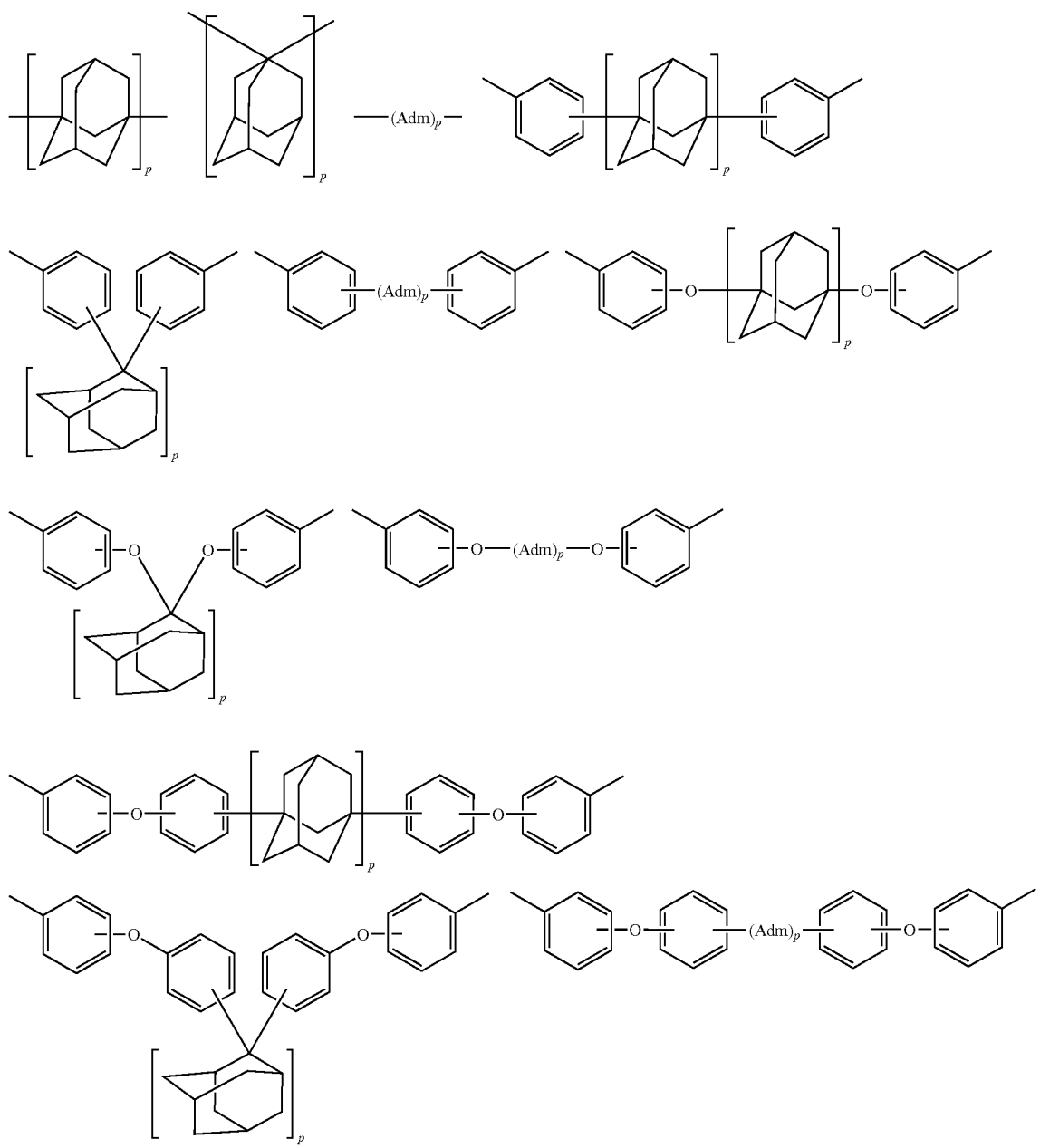

Formula (11-2):
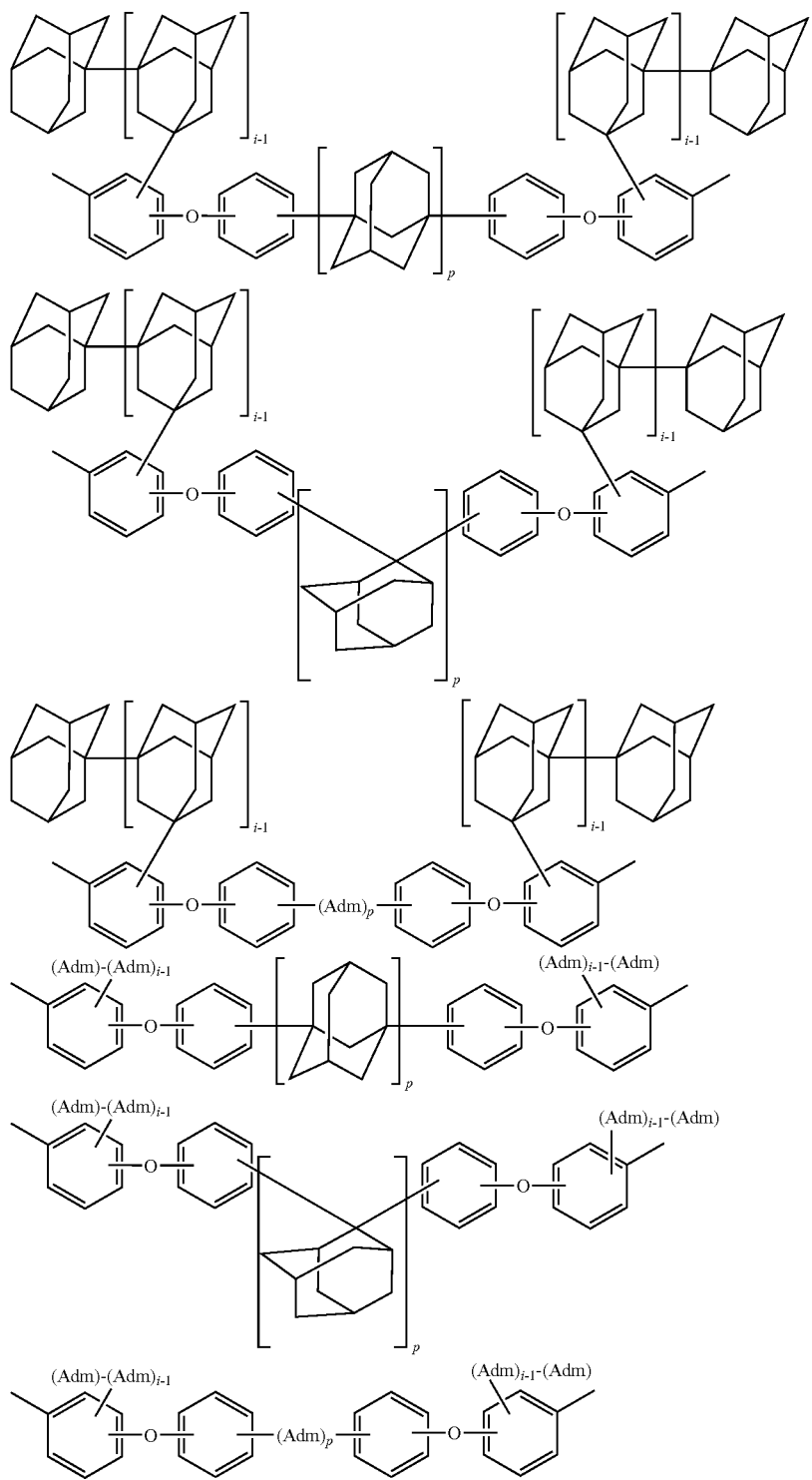
Formula (12-1):
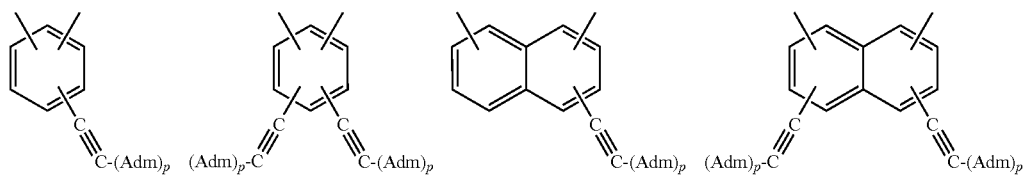

-continued
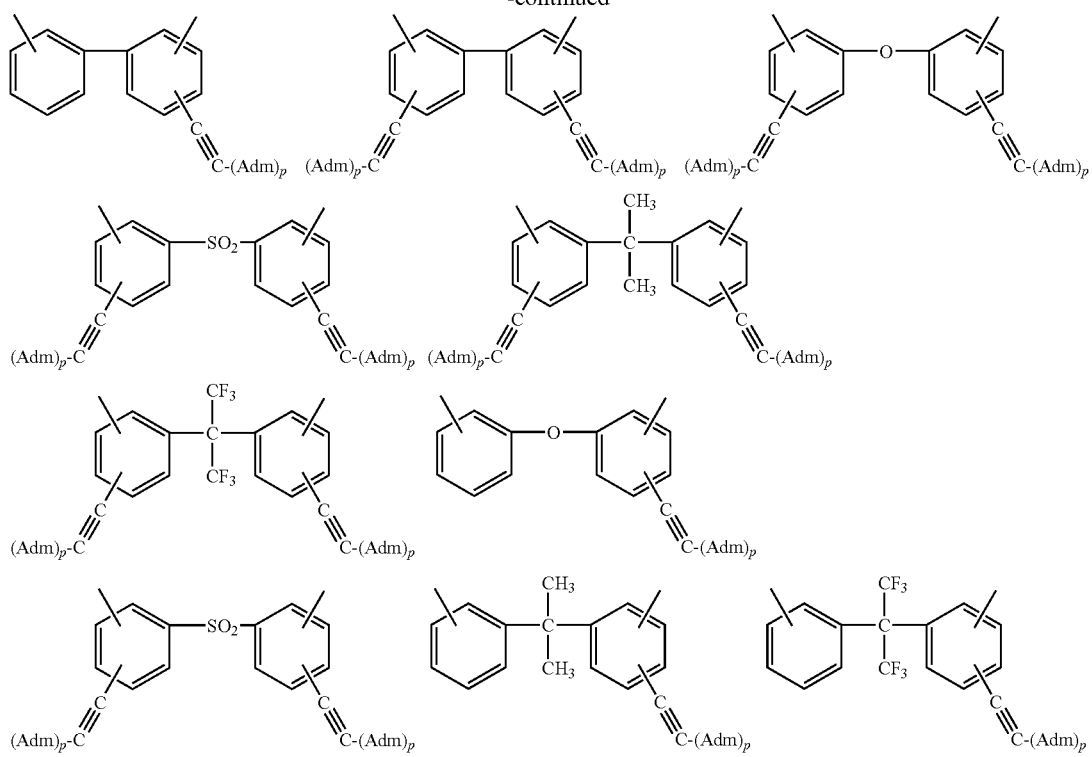
Formula (12-2):
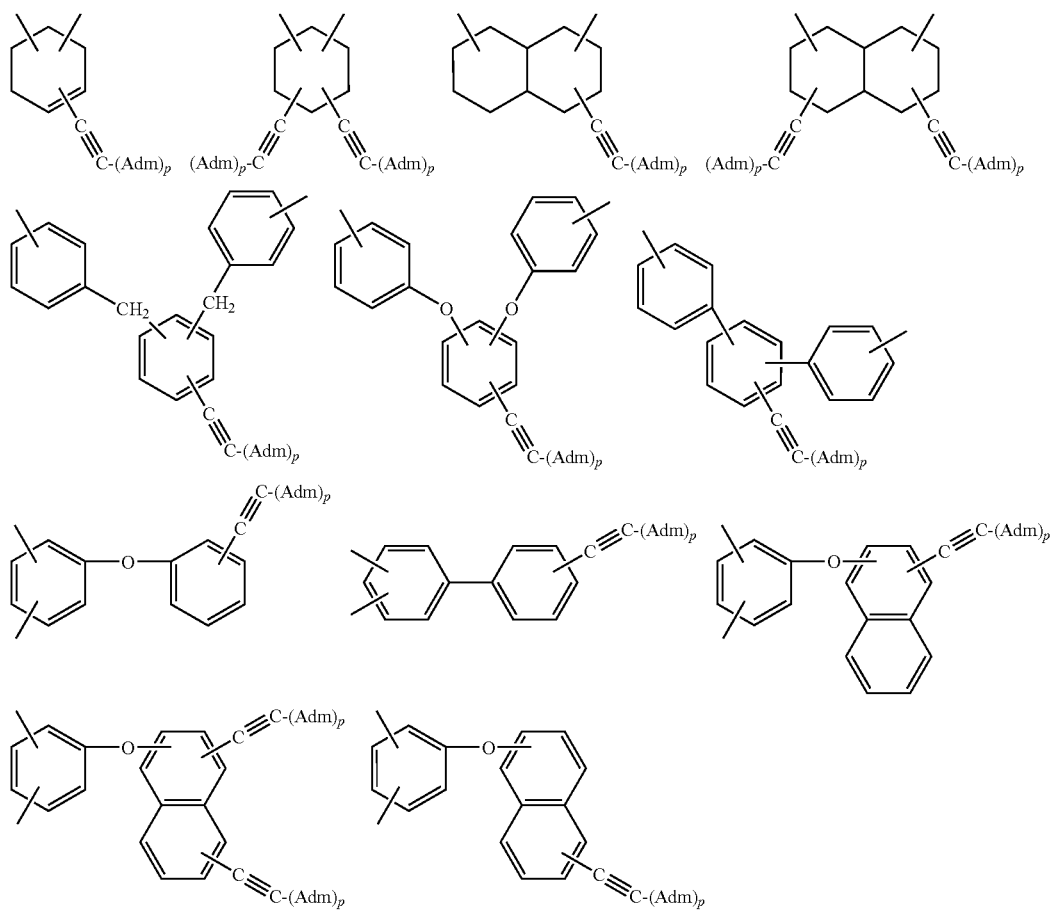

wherein, in the Formula (11-1), Formula (11-2), Formula (12-1) and Formula (12-2), "Adm" represents a diamondoid structural unit based on an adamantane structure; "p" is from 1 to 12; and "i" is from 1 to 12, Formula (13):

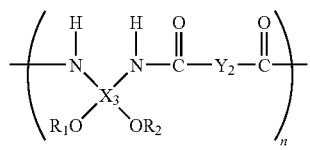

wherein, in the Formula (13), each of $R_1$ and $R_2$ is independently a hydrogen atom or an organic group; "n" is an integer of 2 to 1,000; $X_3$ is at least a group selected from the group consisting of groups represented by the following Formula (14) and Formula (15); $Y_2$ is at least a group selected from the group consisting of groups represented by the Formula (11-1), Formula (11-2), Formula (12-1) and Formula (12-2); and the hydrogen atom of carbocycle contained in $X_3$ and $Y_2$ may be substituted with an alkyl group and/or fluoroalkyl group:

Formula (14):

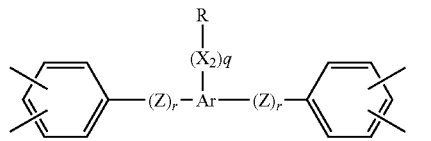

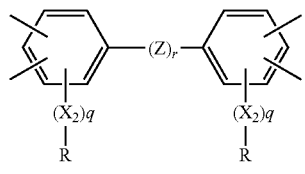

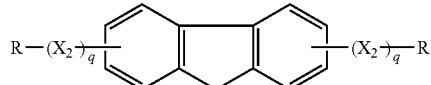

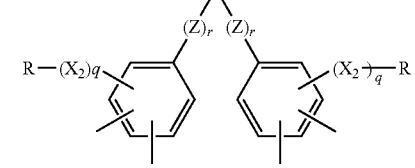

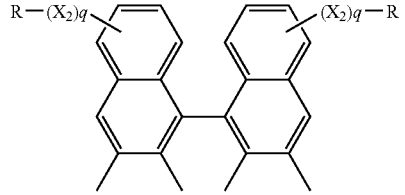

wherein, in the Formula (14), $X_2$ is an ethynyl group or a propargylether group; "Z" is —O—, —SO$_2$—, —CH$_2$—, —C(CH$_3$)$_2$—, —C(CF$_3$)$_2$— or an aromatic group; "Ar" is an aromatic group of trivalent or more; "R" is a hydrogen atom or an organic group; "r" is 0 or 1; and "q" is an integer of 1 to 4, Formula (15):

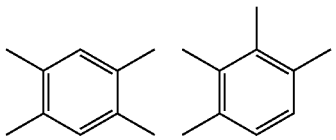

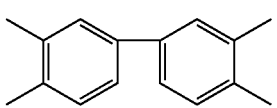

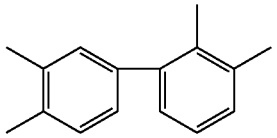

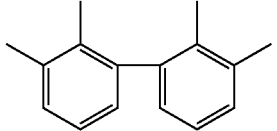

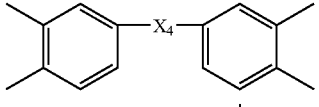

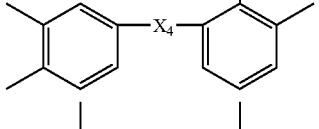

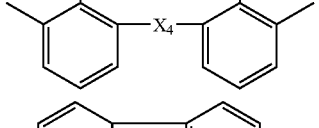

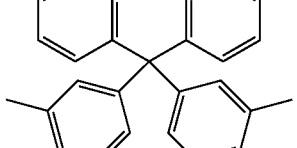

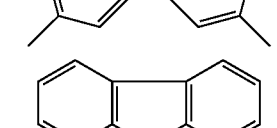

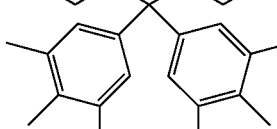

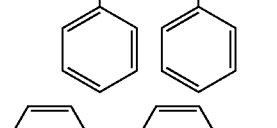

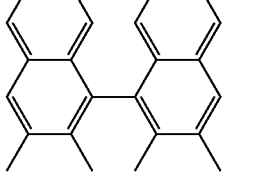

wherein, in the Formula (15), $X_4$ is at least a group selected from the group consisting of groups represented by the following Formula (16):

Formula (16):

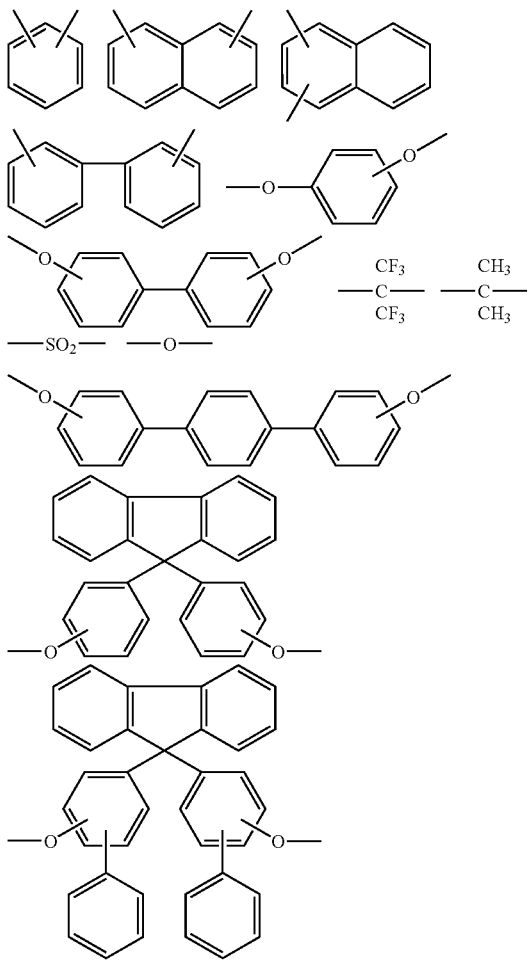

-continued

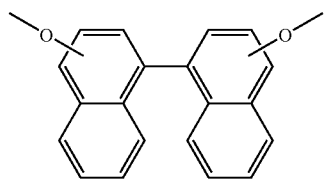

Formula (17):

wherein, in the Formula (17), each of $R_1$ and $R_2$ is independently a hydrogen atom or an organic group; "n" is an integer of 2 to 1,000; $X_3$ is at least a group selected from the group consisting of groups represented by the Formula (14) and Formula (15); $Y_1$ is at least a group selected from the group consisting of groups represented by the Formula (4), Formula (6-1), Formula (6-2), Formula (7-1), Formula (7-2), Formula (8) and Formula (9); and a hydrogen atom of carbocycle contained in $X_3$ and $Y_1$ may be substituted with an alkyl group and/or a fluoroalkyl group.

21. A varnish comprising a resin composition defined by any one of claims 1, 13, 14, 16, and 20 and an organic solvent capable of dissolving or dispersing the resin composition.

22. A resin film comprising a resin composition defined by any one of claims 1, 13, 14, 16 and 20.

23. The resin film according to claim 22, wherein the resin film has a pore having an average pore diameter of 10 nm or less.

24. The resin film according to claim 22, wherein the resin film is a film selected from the group consisting of an interlayer insulating film for semiconductor device, a protection film for semiconductor device and an etching protection film.

25. A semiconductor device having a resin film defined by claim 22.

* * * * *